United States Patent [19]

Dacus

[11] Patent Number: 5,266,907
[45] Date of Patent: Nov. 30, 1993

[54] CONTINUOUSLY TUNEABLE FREQUENCY STEERABLE FREQUENCY SYNTHESIZER HAVING FREQUENCY LOCK FOR PRECISION SYNTHESIS

[75] Inventor: Farron L. Dacus, Irving, Tex.
[73] Assignee: Timeback FLL, Dallas, Tex.
[21] Appl. No.: 959,483
[22] Filed: Oct. 9, 1992

Related U.S. Application Data

[63] Continuation of Ser. No. 720,593, Jun. 25, 1991, abandoned.

[51] Int. Cl.⁵ .............................................. H03L 7/085
[52] U.S. Cl. ..................................... 331/1 A; 331/25; 331/27; 332/127
[58] Field of Search ................. 331/1 A, 2, 25, 27; 332/127, 128

[56] References Cited

U.S. PATENT DOCUMENTS 4,119,952 10/1978 Bosselaers .......................... 332/127
4,587,496 5/1986 Wolaver ............................ 331/27 X
4,801,894 1/1989 Garner .............................. 331/25 X
4,952,888 8/1990 Izumi ................................ 332/127 X Primary Examiner—Siegried H. Grimm
Attorney, Agent, or Firm—Baker & Botts

[57] ABSTRACT

A frequency locked loop frequency synthesizer is comprised of a loop including a voltage controlled oscillator, a phase lock locked loop frequency detector, a divide by N counter and a low pass loop filter. A steering voltage is applied to the loop filter to produce a desired frequency or frequencies. The frequency lock loop frequency synthesizer drives the voltage controlled oscillator frequency to be N times the reference frequency. The frequency lock loop synthesizer inherently has 90 degrees less loop phase shift than a conventional phase lock loop. Additionally, the frequency lock loop frequency synthesizer provides a highly accurate, continuously tuneable, frequency synthesizer that includes a linear frequency detector in the frequency lock loop.

11 Claims, 16 Drawing Sheets

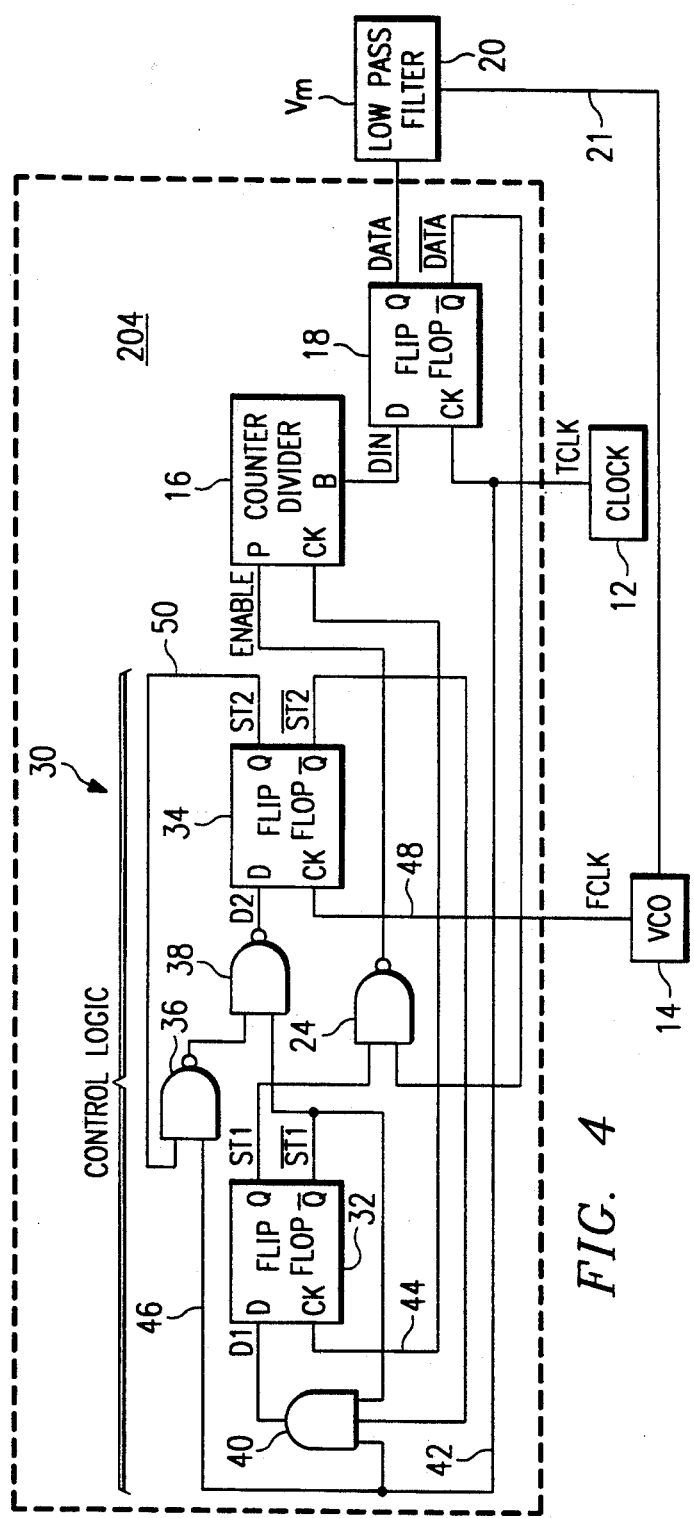
FIG. 4
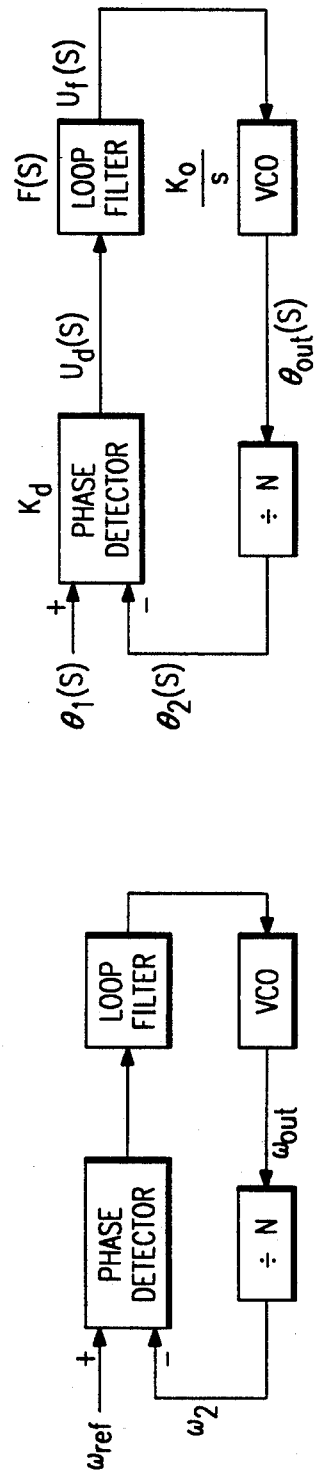
FIG. 5B
FIG. 5A

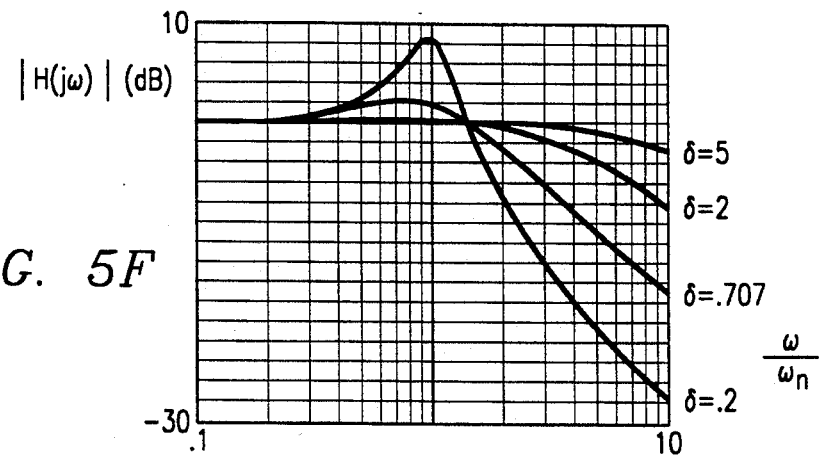
FIG. 5F
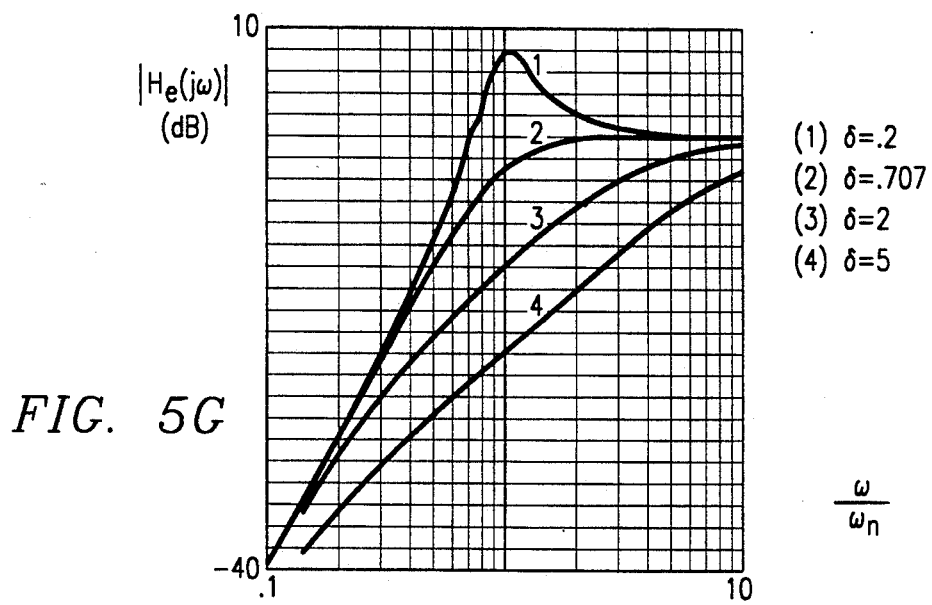
FIG. 5G
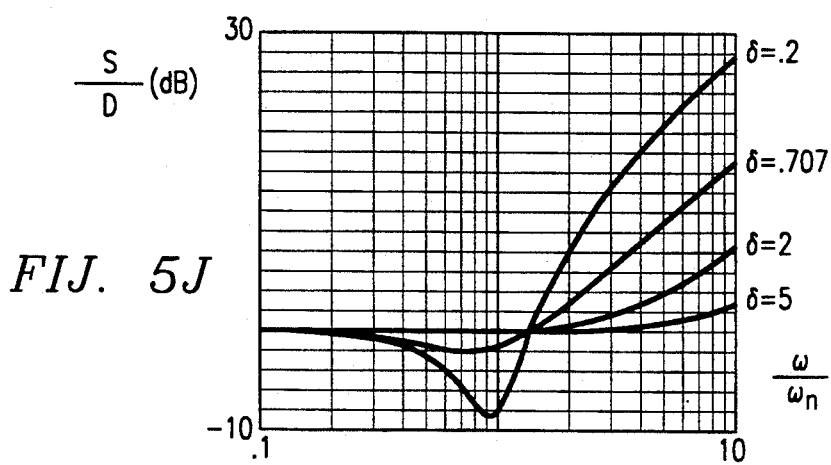
FIJ. 5J

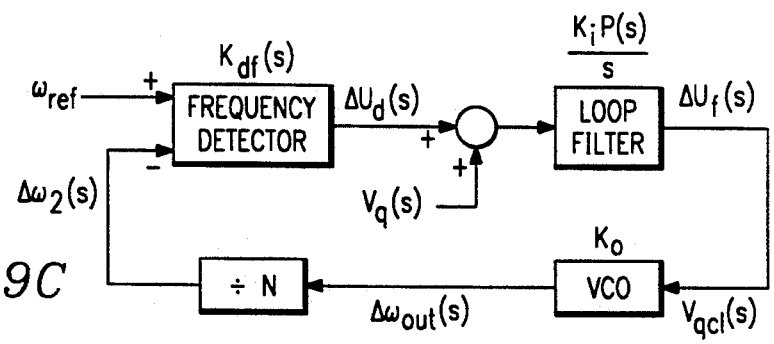
FIG. 9C
| $f_m$ (Hz) | $\mathcal{L}(f_m)$ | $\mathcal{L}_q(f_m)$ | $\mathcal{L}_{cl}(f_m)$ |
|---|---|---|---|
| 1E1 | −31.8 | −64.8 | −51.5 |
| 2E1 | −40.8 | −64.7 | −54.1 |
| 7E1 | −57.0 | −63.6 | −56.3 |
| 1E2 | −61.6 | −64.8 | −57.7 |
| 1E3 | −90.1 | −104.8 | −89.8 |
| 1E4 | −114.0 | −144.8 | −114.0 |
| 1E5 | −134.7 | −184.8 | −134.7 |
FIG. 9D
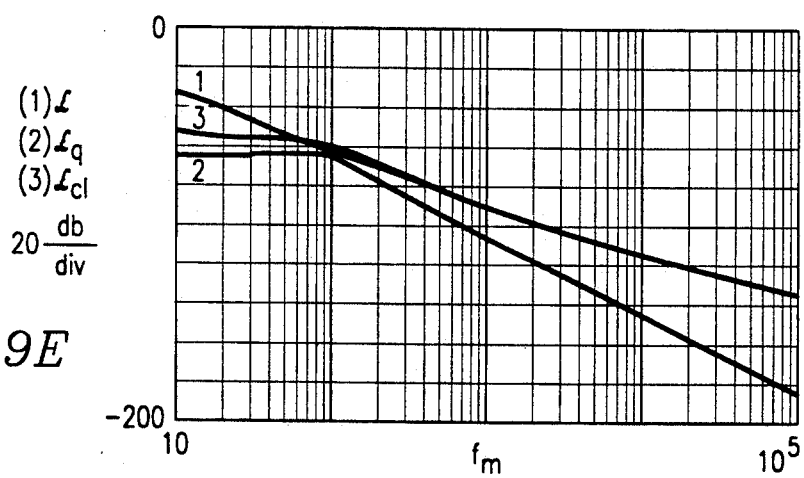
FIG. 9E
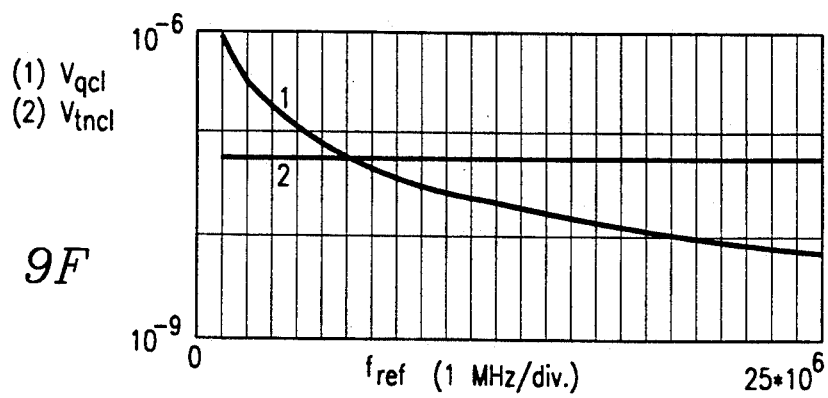
FIG. 9F

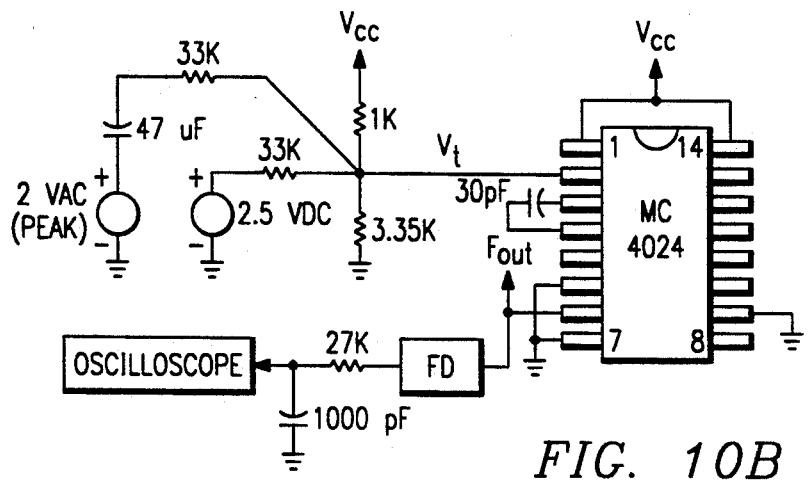
FIG. 10B
| $f_m$ | ADJUSTED MEASURED AMPLITUDE | MODEL PREDICTED AMPLITUDE | ADJUSTED MEASURED PHASE | MODEL PREDICTED PHASE |
|---|---|---|---|---|
| DC TO 4 KHz | 1.0 V | 1.0 V | <-2° | <-2° |
| 6 KHz | 1.0 V | 1.0 V | -3° | -3° |
| 10 KHz | 1.0 V | 1.0 V | -5° | -5° |
| 15 KHz | 1.0 V | 1.0 V | -8° | -7° |
| 30 KHz | .95 V | .97 V | -14° | -13° |
| 40 KHz | .90 V | .95 V | -20° | -17° |
FIG. 10C
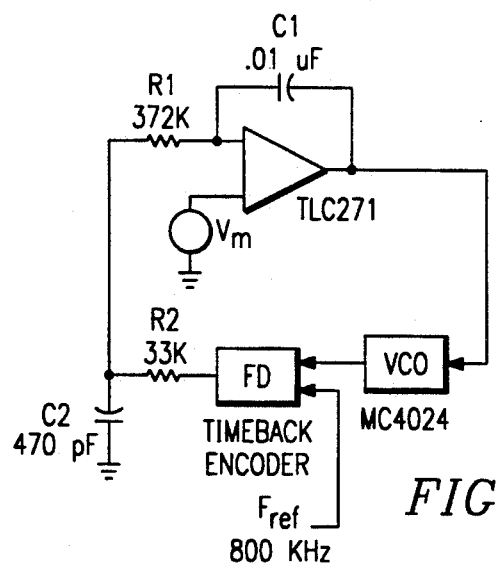
FIG. 10D

| $f_m$(Hz) | $\mathcal{L}(f_m)$ FREE RUNNING | $\mathcal{L}_{cl}(f_m)$ PREDICTED | $\mathcal{L}_{cl}(f_m)$ MEASURED |
|---|---|---|---|
| 10 | −10 | −47.9 | −60 |
| 20 | −20 | −50.5 | −60 |
| 50 | −30 | −51.5 | −60 |
| 70 | −35 | −52.3 | −60 |
| 100 | −40 | −52.8 | −61 |
| 500 | −60 | −54.5 | −62 |
| 1E3 | −68 | −56.7 | −63 |
| 1E4 | −90 | −76.9 | −86 |
| 1E5 | −105 | −104.6 | −102 | ns
CONTINUOUSLY TUNEABLE FREQUENCY STEERABLE FREQUENCY SYNTHESIZER HAVING FREQUENCY LOCK FOR PRECISION SYNTHESIS

RELATED APPLICATIONS

This application is a continuation of application Ser. No. 07/720,593 filed Jun. 25, 1991, entitled "Continuously Tuneable Frequency Steerable Frequency Synthesizer Having Frequency Lock for Precision Synthesis" by Farron L. Dacus, now abandoned.

FIELD OF THE INVENTION

This invention relates to freqency synthesizers and more particularly to a frequency steerable frequency synthesizer which is continuously tuneable and which employs frequency lock for precision synthesis.

BACKGROUND OF THE INVENTION

Frequency synthesis refers to the generation of a signal of precise frequency by the use of one or more reference frequencies. A commercially successful method employs a control system known as a phase locked loop (PLL). This method utilizes negative feedback to match the phase of the frequency divided output of a controlled oscillator to that of a reference frequency. The output is an adjustable multiple of the reference frequency. This multible is usually an integer or ratio of simple integers, and only a finite number of output frequencies normally are available.

The method and apparatus provides frequency accuracy proportional to the accuracy of the reference sources, usually crystal oscillators. While the output frequencies are changeable only in discrete steps, the modern phase locked synthesizers are capable of so many different frequencies that they can simulate, but not attain, the function of continuous tunable oscillators. In many applications this stepwise tuning is acceptable, but in others the ability to generate an arbitrary frequency is desirable. One of those applications is that of a local oscillator for radio receivers and transmitters, where phase locked synthesis has recently supplanted free running tunable oscillators as the primary tuning technique. Phase lock has the advantages of precise control of frequency, extremely low drift and compatibility with computer control.

Despite these advantages, phase lock does have the disadvantages of discrete frequency stepping and also considerable difficulty in attaining accurate frequency modulation. These weaknesses motivated the development of the precision Frequency Locked Loop of the present invention.

The frequency locked loop (FLL) is similar, in concept, to the PLL. Like the PLL, the system is a negative feedback control system that drives a voltage controlled oscillator (VCO) frequency to be N times a reference frequency. For this to hold exactly, the loop filter must have infinite DC gain. The PLL did not require this condition because of the integrating action of the VCO with respect to phase gives infinite DC gain. So long as the PLL has nonzero DC gain, the loop has infinite DC gain. With frequency as the control variable, infinite gain must be supplied by the filter to drive the error to zero.

An advantage of the FLL is that it inherently has 90 degrees less loop phase shift than the PLL. This is due to the VCO being merely a gain block, rather than an integrator. Consequently 90 degrees more phase shift is available for filtering. This allows better suppression of noise in the detector output than the PLL.

A FLL frequency syntheziser, despite its advantages, has not found widespread use because of the requirement of a linear frequecy detector. This requirement has been provided by the delta sigma frequency detector disclosed in U.S. Pat. No. 4,758,821. Accordingly, it is an object of the present invention to provide a highly accurate, continuously tuneable frequency synthesizer.

It is another object of the present invention to provide a linear frequency detector in a FLL thus making available in industry a frequency synthesizer of widespread application.

SUMMARY OF THE INVENTION

This invention provides a continuously tuneable frequency synthesizer comprising a FLL including a linear digital phase lock loop frequency detector having an input connected to an output of a voltage controlled oscillator. Another input of the detector has applied to it a reference frequency to produce at its output a digital word or voltage whose value is a function of the difference in the frequencies applied to its inputs. The voltage controlled oscillator has applied to its input the output of the detector to produce at the output of the oscillator a signal of desired frequency.

In a preferred embodiment, a low pass filter is included between the output of the detector and the input of the oscillator to remove high frequency noise that may be present in the the signal from the detector. The low pass filter may be an operational amplifier type. The value of freqency to be produced is under control of a steering voltage to be applied to an input of the low pass filter.

Further utilized in the preferred embodiment, as a frequency detector, is a $\Delta\Sigma$ phase lock loop, and a divide by N counter is connected in series between the output of the oscillator and the input to the frequency detector.

BRIEF DESCRIPTION OF THE DRAWINGS

The invention, with further features, aspects and advantages thereof, will be better understood from a consideration of the following detailed description in conjunction with the accompanying drawings showing the best mode currently known to the inventor for the practice of the invention.

FIG. 4 is a circuit schematic of a frequency detector useful in the practice of the present invention.

FIG. 5A illustrates a basic phase locked loop;

FIG. 5B illustrates a basic phase locked loop with variable assignments and transfer functions;

FIG. 5F illustrates a curve for H(s) using normalized form;

FIG. 5G illustrates a curve for $H_e(s)$ using normalized form;

FIG. 5J illustrates a signal to distortion function in normalized form;

FIG. 9C illustrates a quantization noise model of the $\Delta\Sigma$ FLL;

FIG. 9D illustrates a noise performance in the example VHF $\Delta\Sigma$ FLL;

FIG. 9E illustrates a noise performance plot of the example VHF D$\Sigma$ PLL.

FIG. 9F illustrates a $V_{qcl}$ and $V_{tncl}$ for the example system with $\alpha_e=2E-14$;

FIG. 10B illustrates a $\Delta\Sigma$ model test supply;

FIG. 10C illustrates a $\Delta\Sigma$ frequency detector frequency domain behavior;

FIG. 10D illustrates a 43 Hz loop bandwidth $\Delta\Sigma$ FLL experimental system;

DETAILED DESCRIPTION OF THE INVENTION

Figure 1:
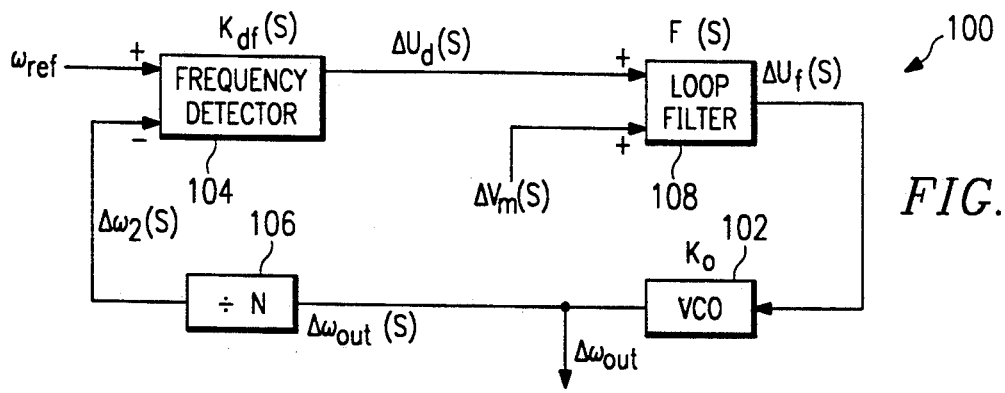
FIG. 1 is a block schematic representation of the frequency synthesizer of the present invention.

In the description which follows, like elements will be designated with the same reference characters throughout the various FIGURES. Referring now to FIG. 1, there is illustrated in block schematic form, a frequency synthesizer 100 embodying features of the present invention. The synthesizer 100 comprises a voltage controlled oscillator 102 having an output $\Delta\omega_{out}$ applied to a divide by N counter 106, which may be provided where typically the frequency output 25 from the voltage controlled oscillator is larger than a reference frequency. The output $\Delta\omega_2(s)$ is applied to an input of a frequency detector 104. A reference signal $\omega_{ref}$ is applied to another input to the frequency detector 104 from a source (not shown), but which, preferably is a crystal controlled oscillator. The result is a correction signal $\Delta U_d(s)$ which is fed to a low pass loop filter 108 to remove high frequency noise. The filtered output $\Delta U_f(s)$ is applied to the voltage controlled oscillator to produce the desired frequency output. The selection of frequency is implemented by injecting a voltage $\Delta V_m(s)$ into the loop. As illustrated, the selection voltage is applied to an input to the loop filter 108.

The frequency detector 104 is a $\Delta\Sigma$ digital phase locked loop. This detector is of the type described in U.S. Pat. No. 4,758,821 granted to Robert Nelson and Onkar Modgil. The circuit operates to keep the edges of the reference $\omega_{ref}$ and the output $\Delta\omega_2(s)$ lined up. The loop filter 108 is an operational amplifier having infinite gain.

Figure 3:
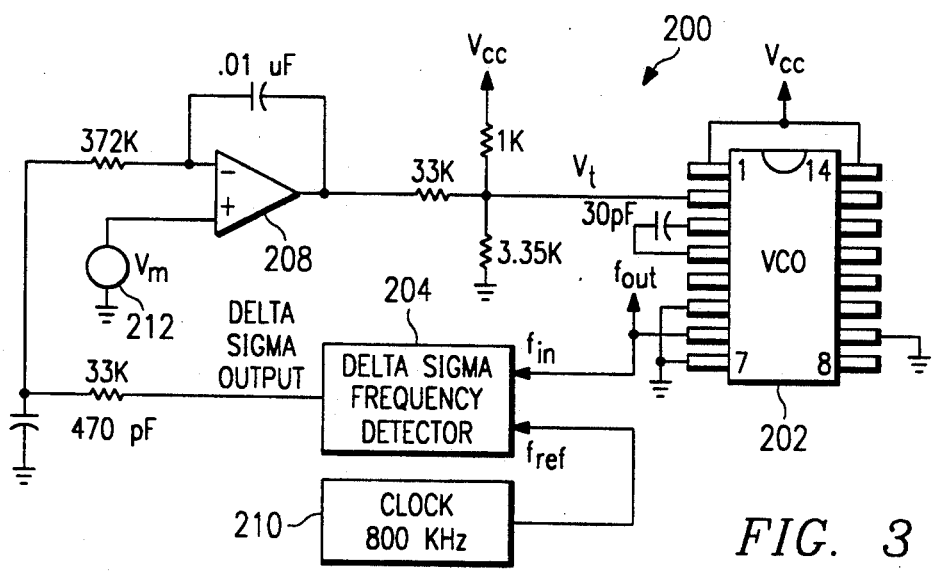
FIG. 3 is a circuit schematic of the frequency synthesizer of the present invention.

FIG. 3 illustrates in more detail the frequency synthesizer of the present invention. The frequency synthesizer 200 was built and tested in a low radio frequency CMOS implementation. The system was designed for a 5 volt power supply. The system clock ($f_{ref}$) was 800 KHZ. The frequency detector 204 had M = −8, and $\Delta M=1$. This led to a system with a frequency tuning range of 8 times $f_{ref}$ to 9 times $f_{ref}$, or 6.4 to 7.2 MHz. The oscillator or VCO 202 was implemented using a Motorola MC4024 multivibrator integrated circuit. This approach had the advantage of circuit simplicity, and a high enough phase noise content to clearly view the effect of the $\Delta\Sigma$ Frequency Lock Loop on the noise spectrum.

The $\Delta\Sigma$ frequency detector 204 and the VCO 202 are connected in a loop with the loop filter 208 to complete the frequency lock loop design. The loop filter was provided by a Texas Instruments TLC 271 CMOS operational amplifier, primarily because of its ability to run in a single supply low voltage system. The loop filter 208 was powered from a 7 volt supply, and the rest of the circuit from a 5 volt supply. The integrating loop filter 208 had a unity gain bandwidth of 43 Hz. The 800 KHz signal $f_{ref}$ was generated by clock 210. The clock was a 3.2 MHz crystal oscillator followed by a divide by 4 circuit.

The system 200 was found to function in a very acceptable manner. When powered up it instantly acquired frequency lock at the frequency specified by the tuning voltage $V_m$ from source 212. There was no sign of instability.

When the system of FIG. 3 was frequency tuned by varying $V_m$ it tuned precisely and with perfect linearity from 6.4 to 7.2 MHz as the tuning voltage was varied from 0 to 5 volts.

Figure 2:
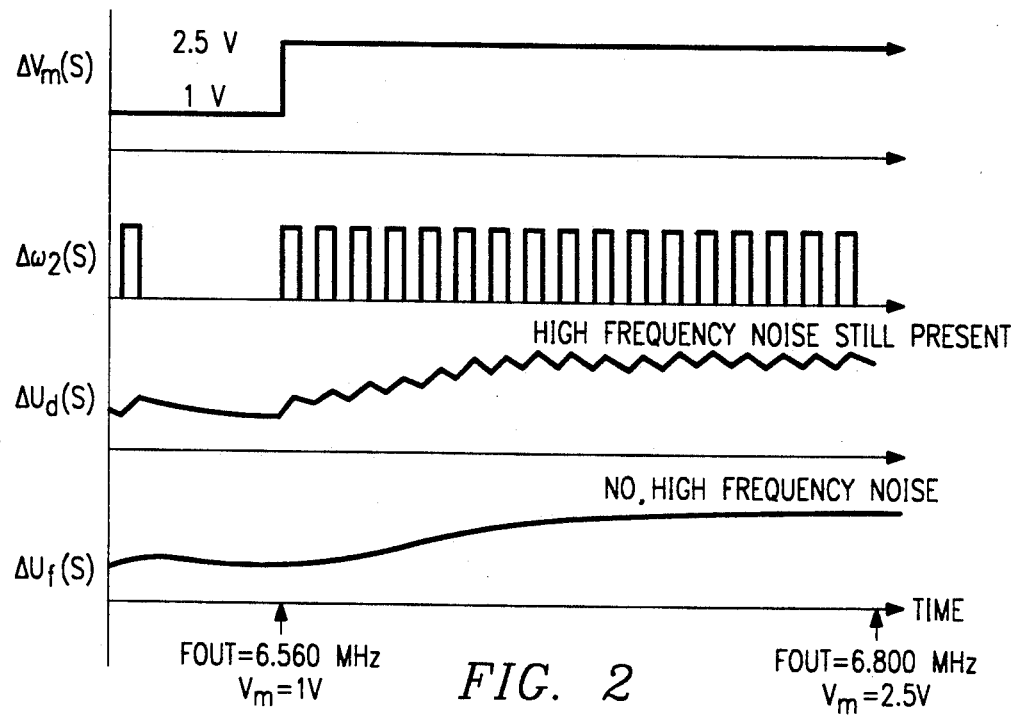
FIG. 2 is a time-waveform diagram helpful in the understanding of the present invention.

Referring now to FIG. 2 the waveforms initially illustrate that the frequency synthesizer of FIG. 3 is in a stable state. Now upon the desire to change the frequency output the steering or modulating voltage $\Delta V_m(s)$ is changed in value, for example, from 1 volt to 2.5 volts. The $\Delta\Sigma$ signal produced within the frequency detector is a series of one bits. When the voltage is changed the bit density increases and there is produced at the output of the frequency detector a filtered $\Delta\Sigma$ signal $\Delta U_d(s)$. Note however the presence of high frequency noise. The low pass loop filter 108 smooths the signal by filtering out the high frequency noise to produce the signal $\Delta U_f(s)$. This signal, free of high frequency noise, is applied to the input of the voltage controlled oscillator.

For more details, supplementing the above description, reference may be had to the Thesis entitled A NEW APPROACH TO FREQUENCY MODULATED FREQUENCY SYNTHESIS authored by the inventor and presented to the Faculty of the Graduate School of The University of Texas at Arlington. This thesis is included in this specification in its entirety at Appendix A attached hereto.

Referring now to FIG. 4 where there is illustrated in greater detail the $\Delta\Sigma$ PLL frequency detector described and claimed in U.S. Pat. No. 4,758,821.

The following discussion is extracted essentially verbatim from columns 4 through 8 of U.S. Pat. No. 4,758,821 as a full description of the digital phase lock loop detector that is herein referred to as the delta sigma phase lock loop (PLL) frequency detector. The delta sigma PLL frequency detector permits (1) generating two high frequency signals, (2) causing a shift in the phase of one of two signals in response to an analog condition, (3) comparing the phase of the signals and (4) adjusting the phase of the phase-shifted signal toward an in-phase condition. More specifically, one of the signals is at a fixed frequency that a clock may produce. The other signal also essentially has a fixed frequency and is produced by dividing the output of a variable frequency oscillator (whose frequency is a function of an analog condition) by a ratio that is determined by the phase relationship of the two fixed frequency signals. The division ratio will either be N or (N−M), where N and M are whole integers and M is less than N. A comparison of the phase relationship between the signals yields a measure that is utilized to select the division ratio to bring the signals to an in-phase relationship. The output or measure of phase difference is in the form of a single-bit digital function. This function is filtered to produce a binary word representative of the instantaneous value of the analog condition.

Referring now to FIG. 4, a digital implementation of the analog design illustrated in FIG. 3 is shown wherein delta sigma phase lock 10 of frequency detector 204 of the present invention is shown to include two sources of high-frequency signals, TCLK from clock 12 corresponding to $f_{ref}$ from clock 210 of FIG. 3 and FCLK from VCO 14 corresponding to $f_{in}$ from VCO 202 of FIG. 3. Low pass filter 20 corresponds to analog loop filter 208 for the digital implementation. The first source includes clock 12 that has a constant frequency output. The second source includes variable frequency oscillator 14 and counter-divider 16. In accordance with the present invention, whereas variable frequency oscillator 14 has an output whose frequency varies as a function of applied digital condition received from low pass filter 20, counter-divider 16 has a frequency output that is constant and harmonically related to the frequency of clock 12. In the preferred embodiment, the frequencies at the outputs of counter-divider 16 and clock 12 are equal.

Counter-divider 16 has an output DIN and clock 12 has an output TCLK. Both outputs are applied to phase-comparator 18, a D flip-flop, that produces an output DATA whose character depends on whether or not the transition of the output DIN of counter-divider 16 leads or lags the transition of the output TCLK from clock 12. The selected transitions may be either positive or negative going. The present specific embodiment uses the negative-going transition of the output DIN from counter-divider 16 and the positive-going transition of the output TCLK from clock 12.

The output DATA from comparator 18, a single-bit digital function, will either be a logic level 0 if the negative transition of the output of counter-divider 16 leads the onset of the output from clock 12 or a logic level 1 if the negative transition of the output of counter-divider 16 lags the onset from clock 12. This single-bit digital function is applied to low-pass digital filter 20 which produces at its output a binary word. The binary word is then applied to a VCO 14.

Counter-divider 16 is controlled such that it either divides by a value N or by a smaller value (N−M). These values or dividing ratios, N and (N−M), are selected on the basis of a criterion of whether the negative transition of the output of counter-divider 16 occurs early or late with respect to the positive going transition from clock 12. If the negative transition of the output DIN (FIG. 4) of counter-divider 16 occurs early with respect to the positive transition of clock 12 output TCLK, the inverted output $\overline{DATA}$ of comparator 18, a D flip-flop is fed back via NAND gate 24 to the P input of counter-divider 16 via NAND gate 24 to cause counter-divider 16 to divide by N−M. If the value of the digital condition is such that the output FCLK from variable frequency oscillator 14 is at a higher frequency, then counter-divider 16 will count faster, counter-divider's 16 output DIN will occur early more often with respect to the output TCLK of clock 12 and inverted output $\overline{DATA}$ from comparator 18 will cause counter-divider 16 to divide by N more often. On the other hand, if the value of the digital condition is such as to cause variable frequency oscillator (VFO) 14 to output FCLK at a lower frequency, counter-divider 16 will count slower, the negative transition of the output DIN of counter-divider 16 will be late more often, and inverted output $\overline{DATA}$ of comparator 18 will cause counter-divider 16 to divide by (N−M) more often. Accordingly, the phase of the negative transition of output DIN of counter-divider 16 with respect to clock 12 output TCLK is controlled by the frequency of variable frequency oscillator 14. The phase is measured with phase comparator 18 and the negative transition of output DIN of counter-divider 16 is brought in phase with the signal TCLK by adjusting the dividing ratio of counter-divider 16.

Control logic 30 (including NAND gate 24) assures that the dividing ratio of counter-divider 16 may be changed only once for every TCLK and in conjunction with TCLK. TCLK controls comparator 18 so that only a single binary value is produced for each TCLK pulse. This single binary value is processed by the decimating digital low-pass filter 20 in which binary ones and zeros are multiplied with the finite impulse response filter coefficients to provide the binary word at a lower sample rate. Digital low-pass filters are described in "Digital Filters" by R. W. Hamming, 2nd Edition published by Prentice Hall, 1983.

Control logic 30 includes two D flip-flops designated as 32 and 34, three NAND gates 36, 38 and 24, and one AND gate 40. Control logic 30 had three logic states: logic state zero, logic state one (represented by signal logic ST1 at logic level 1), and logic state two (represented by signal ST2 at a logic level 1). Logic state zero occurs in the absence of logic states one and two. Logic state one is entered when TCLK goes to logic level 1 and upon the next positive transition of FCLK. More specifically, there are three inputs to AND gate 40. These inputs are TCLK from the clock 12 applied by way of conductor 42, $\overline{ST1}$ and $\overline{ST2}$. With all three inputs at logic level 1 at time $t_1$, there appears at the output of AND gate 40 a positive going pulse D1 applied to the D input of flip-flop 32. With the next positive going transition of FCLK at time $t_2$, pulse ST1 representative of logic state one is generated and latched up for one cycle of FCLK. In other words, logic state one exists for only one cycle of FCLK. It is during this period that the logic level 1 of signal ST1 is applied to NAND gate 24. In this same period, the output DATA of comparator 18 is at a logic level 1 and $\overline{DATA}$ is at a logic level 1. This is what occurs when the negative-going edge of output DIN from counter-divider 16 occurs early with respect to the positive transition of TCLK. The $\overline{DATA}$ signal is applied to the other input of NAND gate 24 whose output ENABLE will be a logic level 0. ENABLE at the logic level 0 is applied to the P input of counter-divider 16. The application of logic level 0 to the P input of counter-divider 16 disables the counter-divider for one FCLK cycle nd effectively selects the division ratio for counter-divider 16 at (N−M).

In the present embodiment M=1, or one cycle of FCLK. The value of M is determined by the time duration of the pulse ST1 at logic level 1. M can be assigned other integer values by modifying central logic 30 so that ST1 at logic level 1 will exist for more cycles of FCLK. For example, if a value of 2 is assigned to M, then ST1 would exist for two cycles of FCLK.

Upon the next transition of FCLK, control logic enters into logic state two as represented by the onset of the pulse $\overline{ST2}$ at time $t_3$. $\overline{ST1}$, at logic level 0, is applied at time $t_2$ to an input of NAND gate 38. At the same time, ST1 is also applied back to the input of AND gate 40. This causes the value of pulse DI to be at logic level 0. Therefore, when the next transition of FCLK occurs, at time $t_3$, control logic 30 enters state two as represented by the generation of pulse ST2. Control logic 30 remains in state two until the next transition of FCLK after TCLK goes to logic level 0 at which time control logic 30 returns to state zero.

Flip-flop 34 remains in logic state two so long as TCLK is at logic level 1. This avoids an early return to state one which would cause a premature clocking out of the output of counter-divider 16 and could result in multiple binary values being generated during a given cycle of TCLK. By holding the logic in state two until TCLK goes to logic level 0, there will be only one binary value produced at the output of comparator 18 for each cycle of TCLK.

The transition of states from zero through two takes place in control logic 30 in the following manner. Prior to time $t_1$, control logic 30 is in state zero since TCLK is a logic level 0. At time $t_1$, TCLK $\overline{ST1}$ and $\overline{ST2}$ are at logic level 1 and the AND gate passes pulse D1. Upon the next positive transition of FCLK, applied to a CK input of flip-flop 32 via conductor 44, $\overline{ST1}$ goes to logic level 1. Concomitantly, ST1 goes to logic level 0 and terminates pulse D1.

TCLK is also applied at a logic level 1, via conductor 46, to an input of NAND gate 36. Prior to time $t_3$, $\overline{ST2}$ is at logic level 0, and this logic level 0 is applied via conductor 50 to the other input of NAND gate 36. This results in a logic level 1 appearing at the output of NAND gate 36. This output is applied to an input of NAND gate 38. At this time, $\overline{ST1}$ is applied to the other input of gate 38 which is at a logic level 0. Therefore, the output of gate 38 is a logic level 1, resulting in a positive transition of pulse D2. Now, upon the next positive transition of FCLK, applied to the CK input of flip-flop 34 via conductor 48, ST2 appears as a logic level 1 at the Q input of flip-flop 34. ST2 or state two is latched until the next positive transition of FCLK immediately following the value of TCLK falling to a logic level 0 value as at time $t_4$. At this time and in the absence of ST1 and ST2, control logic 30 has returned to state zero and it remains there until the next positive transition of TCLK at time $t_5$.

The output ENABLE from control logic 30 appearing at the output of NAND gate 24 is normally at logic level 1 such that counter-divider 16 is enabled or allowed to increment on every positive transition of FCLK. The character of ENABLE whether logic level 0 or a logic level 1 is controlled by $\overline{DATA}$ each time ST1 goes to a logic level 1. The ENABLE output will change counter-divider 16 from a divide-by-(N−M) to a divide-by-N. In one embodiment of the present invention, N=5 and M=1 and therefore N−M=4. Counter-divider 16 is a two-bit binary counter. When the counter-divider's output DIN has its negative transition early with regard to TCLK a shown prior to time $t_1$, output $\overline{DATA}$ of phase comparator 18 goes to a logic level 1, and ENABLE goes to a logic level 0 upon the next occurrence of logic level 1 ST1. Then, at time $t_2$, counter-divider 16 does not increment on the next positive going transition of FCLK. Since counter-divider 16 normally functions as a divide-by-4 counter-divider, the loss of one increment that occurs when ENABLE goes to a logic level 0 for one cycle of FCLK causes the output DIN from counter-divider 16 to occur at 1/5th the rate of FCLK. Thus, ENABLE changes the counter from dividing FCLK by 4 to dividing FCLK by 5. Since an additional cycle of FCLK is needed before the next negative going transition of DIN, DIN has been delayed with respect to TCLK and brought in phase therewith.

On the other hand, when output DIN of counter-divider 16 has its negative going transition late with respect to TCLK, such as at time $t_5$, output $\overline{DATA}$ of phase comparator 18 goes to a logic level 0, and ENABLE remains at a logic level 1 during the next occurrence of logic level 1 of ST1. This allows counter-divider 16 to increment on every positive going transition of FCLK. Counter-divider 16 divides FCLK by 4 and causes the next negative going transition of DIN to occur without delay. Thus, if FCLK is within the frequency limits (i.e., within 4 to 5 times the frequency of TCLK) output DIN of counter-divider 16 will be brought in phase with TCLK.

The process continues with either a divide-by-4 or a divide-by-5 as selected by control logic 30 and $\overline{\text{DATA}}$ in order that output DIN of counter-divider 16 remains in-phase with TCLK. The process gives rise to the generation of the single-bit digital function DATA. Each single digital bit is indicative of the direction of phase error. The single digital bits may either be single weighted digital functions or multi weighted digital functions. In the present embodiment, the digital bits are single weighed digital functions.

Variable frequency oscillator 14 (VFO) can be any device that has an output within a desired frequency range and whose frequency can be altered by a selected variable such as capacitance, voltage, temperature and resistance. One form of variable frequency oscillator is shown in FIG. 4 as a voltage controlled oscillator responsive to a digital input. The voltage controlled oscillator, otherwise known as a voltage-to-frequency converter, is available from several manufacturers.

In one embodiment of the invention, oscillator 14 has a center frequency of 1.125 megahertz and varies from between 1 megahertz to 1.25 megahertz. In that embodiment, clock 12 produced a 250 kilohertz square wave.

Various elements comprising the system of FIG. 4 are available from Texas Instruments Incorporated and are identified by the following codes: AND gate 40 is an SN 74HC11N; flip-flops 32 and 34 and comparator 18 are SN 74HC74N; NAND gates 36, 38 and 24 and SN 74HC00N; and counter-divider 16 is SN 74HC161N.

In the Patent, the output of the low pass filter 20 corresponding to loop filter 208 of FIG. 3 is connected to a utilization device. In the present modification, the output from the loop filter 20 is connected directly to an input of the VCO 14 by way of cable or conductor 21. In addition, a steering or modulating voltage $V_m$ is applied to an input of the loop filter 20. With these modifications the operation of the frequency synthesizer of FIG. 4 is the same as that described in conjunction with the other figures of this application.

APPENDIX A

A NEW APPROACH TO FREQUENCY MODULATED FREQUENCY SYNTHESES

The members of the committee approve the masters theses of Farron Lenn Dacus

W. Alan Davis
Supervising Professor

David P. Klemer

Harold Sobol

Kai-Shing Yeung

A NEW APPROACH TO FREQUENCY MODULATED FREQUENCY SYNTHESIS by

Farron Lenn Dacus

Presented to the Faculty of the Graduate School of

The University of Texas at Arlington in Partial Fulfillment of the Requirements for the degree of

MASTER OF SCIENCE IN ELECTRICAL ENGINEERING

THE UNIVERSITY OF TEXAS AT ARLINGTON

May 1990

Copyright by Farron Lenn Dacus 1990

All Rights Reserved

ACKNOWLEDGEMENTS

Appreciation is gratefully extended to the following for their positive influence on the development of this work.

My thesis chairman, Dr. Alan Davis, was very patient and encouraging over the long and difficult road this theses followed.

Mr. David Ray, president, Timeback Systems, Inc., has graciously allowed the inclusion here of previously proprietary company circuits and information. His foresight is to be commended.

This work required much more than academic training alone. Without the opportunity to work professionally in the radio frequency design field I could not have developed the required intuition and general understanding. My sincere thanks are extended to the employers who took a chance on my abilities.

And finally, my desire for greater education took more time, attention, and sacrifice from my family than I had any right to ask.

April 10, 1990

ABSTRACT

A NEW APPROACH TO FREQUENCY MODULATED

FREQUENCY SYNTHESIS

Publication No. _____

Farron Lenn Dacus, M.S.E.E.

The University of Texas at Arlington, 1990

Supervising Professor: W. Alan Davis

This work consists of two separate but related developments. It began as an analysis of frequency modulation via direct voltage injection into the voltage controlled oscillator input of a phase locked loop frequency synthesizer. The goal was both greater understanding and development of logical design techniques. These goals were attained, but they highlighted weaknesses in the method that were the motivation for the invention and development of a new kind of frequency synthesis based upon frequency lock. That work constitutes the second major portion of the thesis.

The use of frequency lock for precision synthesis was made possible with the invention, by Timeback Systems of Dallas, Texas, of the delta sigma frequency detector. This technique, previously unanalyzed, is placed on an analytic basis. It is incorporated into a frequency locked synthesizer that displays several key advantages over the phase lock method. A complete analysis, including noise performance, is developed. An efficient design methodology based on this analysis is presented.

Experimental verification of predicted performance is provided, and good agreement is noted. The method appears suitable for numerous commercial applications.

TABLE OF CONTENTS

Page

ACKNOWLEDGEMENTS ............................................. iv

ABSTRACT ........................................................ v

LIST OF ABBREVIATIONS .......................................... x

LIST OF SYMBOLS ................................................ xi

Chapter

1. HISTORY, MOTIVATION, AND CONTENT ................ 1

1.1 History ............................................. 1

1.2 Limitations of Phase Lock Frequency Synthesis ............ 2

1.3 Motivation and Content of the Present Work .............. 3

2. THE FREQUENCY MODULATED PHASE LOCKED LOOP .. 5

2.1 Introduction ......................................... 5

2.2 Loop Component Transfer Functions .................... 8

2.3 The Basic PLL Transfer Functions ...................... 10

2.4 The Normalized Form ................................ 12

2.5 Frequency Modulation in the PLL...................... 16

2.6 The Signal to Distortion Concept and Loop Optimization .... 20

2.7 A Fundamental Improvement to the FM PLL: Integrator Error Correction ................................. 24

2.8 Chapter Summary .................................... 26

3. LIMITATIONS AND IMPROVEMENTS IN THE INTEGRATOR ERROR CORRECTED FREQUENCY MODULATED PHASE LOCKED LOOP ........................................ 27

3.1 Introduction ......................................... 27

3.2 Practical integrator Limitations: the Bypassed Integrator .... 27

| | Page |
|---|---|
| 3.3 Matching the VCO to the Bypassed Integrator | 28 |
| 3.4 The Effect of Mismatch on the Signal to Distortion Ratio | 30 |
| 3.5 Modulation Conditions for Maintaining Phase Lock | 32 |
| 3.6 Induced Noise in the FM Phase Locked Loop | 37 |
| 3.7 Chapter Summary | 44 |
| 4. INTRODUCTION TO THE FREQUENCY LOCKED LOOP FREQUENCY SYNTHESIZER | 45 |
| 4.1 Motivation | 45 |
| 4.2 The Basic Frequency Locked Loop | 45 |
| 4.3 Frequency Modulation in the FLL | 49 |
| 4.4 Frequency Accuracy in the FM FLL | 53 |
| 4.5 The Modulation Error Ratio in the Reference Modulated FM FLL | 56 |
| 4.6 Practical Approximations in FLL Design | 58 |
| 4.7 Chapter Summary | 61 |
| 5. THE $\Delta\Sigma$ DIGITAL PHASE LOCKED LOOP FREQUENCY DETECTOR | 61 |
| 5.1 Introduction | 61 |
| 5.2 $\Delta\Sigma$ Modulation | 62 |
| 5.3 The Basic Frequency Detector | 65 |
| 5.4 A First Order Phase Lock Model of the FD | 68 |
| 5.5 Radio Frequency Circuit Implementation of the $\Delta\Sigma$ FD | 74 |
| 5.6 The Use of Digital Filtering in the $\Delta\Sigma$ FLL Synthesizer | 75 |
| 5.7 Second Order of $\Delta\Sigma$ PLL Implementation | 76 |
| 5.8 First Order $\Delta\Sigma$ Noise On a Per Unit Bandwidth Basis | 81 |

|  | | Page |
|---|---|---|
| | 5.9 Chapter Summary | 85 |
| 6. | NOISE BEHAVIOR IN THE $\Delta\Sigma$ FREQUENCY LOCKED LOOP FREQUENCY SYNTHESIZER | 86 |
| | 6.1 Introduction | 86 |
| | 6.2 Phase Noise in Voltage Controlled Oscillators | 86 |
| | 6.3 The Effect of the Phase Locked Loop on Oscillator Phase Noise | 92 |
| | 6.4 The Effect of the Frequency Locked Loop on Oscillator Phase Noise | 93 |
| | 6.5 Quantization Noise in the $\Delta\Sigma$ FLL Synthesizer | 95 |
| | 6.6 An Example of Typical Phase Noise | 97 |
| | 6.7 Noise Optimization of the $\Delta\Sigma$ FLL Synthesizer | 100 |
| | 6.8 Chapter Summary | 105 |
| 7. | EXPERIMENTAL RESULTS | 107 |
| | 7.1 Introduction | 107 |
| | 7.2 Frequency Detector Model Verification | 107 |
| | 7.3 Basic FLL Design and Behavior | 109 |
| | 7.4 Measured and Calculated Phase Noise | 109 |
| | 7.5 Chapter Summary | 111 |
| 8. | CONCLUSION | 113 |
| | 8.1 Results Attained | 113 |
| | 8.2 Future Work | 116 |
| | 8.3 Present Commercial Viability of the $\Delta\Sigma$ FLL | 116 |

Appendix

Page

1. TIMEBACK SYSTEMS FIRST ORDER QUANTIZATION NOISE .......................................... 119

2. EXAMPLE FREQUENCY LOCKED LOOP NOISE MODEL .. 121

3. TIMEBACK SYSTEMS ΔΣ FREQUENCY DETECTOR ....... 129

4. EXPERIMENTAL PHASE NOISE DATA .................. 131

REFERENCES ............................................... 133

LIST OF ABBREVIATIONS

| | |
|---|---|
| CMOS | Complementary metal oxide semiconductor |
| Δ | Delta, as in Δ modulation |
| ΔΣ | Delta sigma, as in ΔΣ modulation |
| ECL | Emitter coupled logic |
| FD | Frequency detector |
| FLL | Frequency locked loop |
| FPCO | Frequency and phase controlled oscillator |
| LC | Inductor and capacitor, as in LC resonator |
| Op amp | Operational amplifier |
| PD | Phase detector |
| PLL | Phase locked loop |
| ss | Steady state |
| VCO | Voltage controlled oscillator |

LIST OF SYMBOLS

| Symbol | Description | Page First Used |
|---|---|---|
| $A_{ol}$ | Op amp open loop gain | 42 |
| $B_d$ | $\Delta\Sigma$ bit stream bit density | 63 |
| $C(s)$ | FM PLL matching function | 29 |
| $C_n$ | Complex Fourier coefficient | 40 |
| $F(s)$ | Loop filter transfer function | 9 |
| $f_c$ | $\Delta\Sigma$ noise band cutoff frequency | 65 |
| $f_m$ | Offset frequency | 38 |
| $G(s)$ | FLL error correction function | 50 |
| $H(s)$ | PLL error correction function | 11 |
| $H_e(s)$ | PLL error transfer function | 11 |
| $H_f(s)$ | FLL frequency transfer function | 46 |
| $H_{fe}(s)$ | FLL frequency error transfer function | 48 |
| $H_{fm}(s)$ | PLL FM modulation transfer function | 18 |
| $HF_{fm}(s)$ | FLL FM modulation transfer function | 52 |
| $I(s)$ | Modified integrator transfer function | 27 |
| $K_d$ | Phase detector gain | 9 |
| $K_{df}$ | Frequency detector gain | 23 |
| $K_i$ | Integrator unity gain bandwidth | 25 |
| $K_o$ | VCO gain | 8 |
| $\mathscr{L}(f_m)$ | Phase noise wrt carrier in dB | 86 |
| $\mathscr{L}_{cl}(f_m)$ | Closed loop phase noise | 96 |
| $\mathscr{L}_q(f_m)$ | Quantization induced phase noise | 96 |
| M | $\Delta\Sigma$ FD counter divide by factor | 65 |
| MER | Modulation error ratio | 57 |
| N | Loop frequency divide factor | 7 |
| $N_q$ | Normalized $\Delta\Sigma$ noise voltage | 83 |
| $P(s)$ | Prefilter transfer function | 47 |

| | | |
|---|---|---|
| Sa(x) | Sampling function, sin(x)/x | 41 |
| S/C | Sideband to carrier ratio | 39 |
| $S_n/C$ | S/C at n'th harmonic of ref. freq. | 43 |
| S/D | Signal to distortion ratio | 20 |
| SER | Simple error ratio | 58 |
| S/N | Signal to noise ratio | 65 |
| $S_{\delta\sigma}$ | ΔΣ scaling factor to denormalize gain | 83 |
| $S_\phi(f_m)$ | Noise (1 Hz BW) to carrier ratio at $f_m$ | 87 |
| $t_p$ | Time of greatest peak | 35 |
| TPNV | Total peak noise voltage | 96 |
| $U_d(s)$ | Phase detector output signal | 9 |
| $U_f(s)$ | Loop filter output signal | 9 |
| $V_{cc}$ | Supply voltage or pulse amplitude | 9 |
| $V_m$ | Modulating voltage | 17 |
| $V_{mpo}$ | FM PLL voltage pull out range | 34 |
| $V_{os}$ | Op amp input offset voltage | 42 |
| $V_e$ | Error voltage | 54 |
| $V_q$ | Denormalized ΔΣ quantization noise | 84 |
| $V_{qcl}$ | Closed loop $V_q$ on VCO input | 95 |
| $V_{tn}$ | Input referred oscillator noise | 41 |
| $V_{tncl}$ | Closed loop $V_{tn}$ | 92 |
| $\alpha_e$ | Flicker noise factor | 87 |
| $\beta$ | Modulation index | 38 |
| $\Delta$ | Delta, or indicate small signal var. | 17 |
| $\delta$ | Second order system damping factor | 14 |
| $\Delta M$ | ΔΣ FD counter step size | 66 |
| $\varepsilon_i$ | Mismatch error in FM PLL | 31 |
| $\theta$ | Phase, usually in radians | 6 |
| $\rho$ | Pulse width in seconds | 40 |

| | | |
|---|---|---|
| $P(s)$ | Laplace transform of $\rho$ | 40 |
| $T_p$ | Pull in time of PLL | 22 |
| $\tau_1, \tau_2$ | Time constants of type 3 filter | 9 |
| $\tau_g$ | Group delay | 87 |
| $\omega$ | General radian frequency | 6 |
| $\omega_n$ | Natural freq. of 2nd order system | 14 |
| $\Omega_e$ | Steady state frequency error | 54 |

CHAPTER 1

HISTORY, MOTIVATION, AND CONTENT

1.1 History

Frequency synthesis refers to the generation of a signal of precise frequency by use of one or more reference frequencies. The oldest method, known as direct synthesis, involves mixing several frequencies or their harmonics to generate desired mixing components which are then suitably filtered and otherwise conditioned [1,383]. A more recent and by far more commercially successful method is via a control system known as a phase locked loop. This type of system utilizes negative feedback to match the phase of the frequency divided output of a controlled oscillator to that of a reference frequency. The output is an adjustable multiple of the reference frequency. This multiple is usually an integer or ratio of simple integers, and only a finite number of output frequencies are normally available.

Both methods provide frequency accuracy proportional to the accuracy of the reference sources, usually crystal oscillators. Both may produce output frequencies changeable only in discrete steps, but the phase lock method possesses the key advantage of a much rester number of possible output frequencies for a -liven amount of circuitry. Modern phase locked synthesizers are capable of generating so many frequencies that they can simulate continuously tunable oscillators in may applications.

An important example is that of local oscillators for radio receivers and transmitters, where phase lock syntheses has recently supplanted free running tunable oscillators as the primary implementation technique. For many years the relative merits of the two methods have been debated. Phase lock had the advantages of precise control of frequency, extremely low drift, and compatibility with computer control. Free running oscillators had the advantages of lower cost, simplicity, continuous tuning, and lower noise. However, as with other areas of electronics, the continued development of the integrated circuit spelled the difference. Special circuits were developed that allowed the huge range of variable divider values necessary to simulate continuous tuning. Prices, power consumption, and size dropped to manageable levels. A concerted engineering effort was required to lower the noise level in synthesizers to acceptable levels, but the goal was finally achieved. Today the free running local oscillator is an oddity with only a minor role to play.

1.2 Limitations of Phase Lock Frequency Synthesis

The phase locked synthesizer is a complex and sophisticated control system, and as such suffers from limitations similar to other control system. For example, it can exhibit instability if improperly designed. It also has a finite speed of response when changing frequency that can be a severe limitation for some applications. In addition, the requirements for spectral purity are usually quite sever. Noise levels that might be negligible in other types of control systems can easily be completely unacceptable in frequency synthesis.

A fundamental limitation in phase locked loops is that other output frequency is not continuously tunable. In many application this is acceptable, but in others the ability to generate an arbitrary frequency is required. As will be discussed in great detail later, the loop may be modified to allow tuning to frequencies in between the normally discrete steps. This steering need not be DC, and thus frequency modulation of the phase locked synthesizer will prove feasible. Taking best advantage of this capability is a central theme of this thesis.

In the quiescent locked state a phase locked loop can maintain zero frequency error, when that condition is defined to mean the out put frequency is a known and exact multiple of the reference frequency. This is because the loop is a feedback control system that holds phase constant. If the phase of the output is unchanging, it follows that the frequency is unchanging. When a modulating signal is summed into the loop to generate FM, this quiescent condition is disturbed, and the feedback nature of the loop acts to bring phase back to a fixed condition. This dynamic process results in frequency error and distortion of the intended modulation. Designing to limit this distortion is what is meant by lop optimization for this application. Even if proper design reduces the loop response error to a negligible level, the analog nature of the controlled oscillator means the control variable is converted to frequency with some unknown error.

The unfortunate conclusion is that the precision frequency control of the phase locked loop must usually be sacrificed in order to modulate it. The acceptability of this depends on the application, as the method may still yield accuracy superior to other methods.

1.3 Motivation and Content of the Present Work

This thesis is fundamentally concerned with frequency modulation of synthesized sources in the face of the limitations imposed by the control system character of those sources and limited precision of their components. This tuning or modulation shall be imposed by summing it into a node within the loop.

Despite the fundamental and commercially useful nature o this technique, it has not been adequately analyzed in the public literature. This is apparently due to the fact that only a small fraction of the loops being designed are steered to frequencies in between the discrete steps. The popular phase lock reference works are noticeably lacking in information dealing with the special problems encountered when designing a modulatable synthesizer.

When the author found himself in the position of needing to design a commercial frequency modulated phase locked synthesizer, this lack of information came as a rather unpleasant surprise. The desire to correct this deficiency and develop logical design optimization methods was the original motivation behind this work, and constitutes the firs major portion of the thesis. That goal was achieved, but the analysis revealed and highlighted several weaknesses to the general method of FM phase lock. These weaknesses motivated the invention and development of a new frequency synthesis technique based upon frequency lock. Frequency lock refers to using frequency directly, rather than phase, as the loop feedback control variable.

The new method, which the author has titled delta sigma ($\Delta\Sigma$) frequency synthesis, offers considerable advantages over the phase lock method. It depends on a new kind of precision frequency detection where frequency is encoded into a bit density in a high speed serial bit stream. This general analog to digital encoding technique is referred to as $\Delta\Sigma$ modulator, and has been in existence for several decades. The concept of converting frequency to a $\Delta\Sigma$ output is relatively new and was introduced by Timeback Systems of Dallas, Texas.

The second major portion of this thesis consists of developing a workable model of the previously unanalyzed $\Delta\Sigma$ frequency detector and incorporating it into a frequency locked loop synthesizer. Again, development of logical design techniques was a dominant goal of the analysis. The analysis includes general behavior, accuracy, distortion, and noise performance. The method is shown to possess several important advantages over the FM phase locked loop. Among these are DC FM (frequency steering) with much simplified circuitry, greater frequency accuracy when modulated, and better spectral purity when modulated. The results of the analysis are verified by laboratory testing of an actual operating system.

CHAPTER 2

THE FREQUENCY MODULATED PHASE LOCKED LOOP

2.1 Introduction

This chapter introduces the phase locked loop (PLL), and its analysis. The method of analysis will first be discussed, followed by the behavior of the components within the PLL, and then the PLL itself. With the basic system and its analysis established, the chapter will conclude with the introduction of the frequency modulated (FM) PLL. The detailed analysis of the FM PLL will be saved for the next chapter.

The PLL is really a nonlinear system, but in the locked condition (phase tracking established) the assumption of linearity is a good one [2,15]. In that case standard small signal frequency domain analysis may be applied. The unlocked condition may be accurately described only in terms of nonlinear differential equations, though there are cases when it may be described as approximately linear. Precision FM in the PLL is only valid in the locked state, so our primary interest in the unlocked condition is in avoiding it. For analysis of the unlocked condition the reader is referred to the excellent books by Best [2] and Gardner [3].

The application of frequency domain analysis to the PLL may at first seem contradictory or confusing. The variables to be considered will be small signal variations about a quiescent point. One of these variables is frequency itself, so we will be considering frequency variations in the frequency domain. The frequency of this variation is completely separate from the frequency of the radio frequency carrier itself.

Another point that often confuses the newcomer to phase lock is the concept of an oscillator as an integrator. This concept is fundamental, and follows from the basic definition of frequency. In general, frequency may be described as the repetition rate of an event. If the event is a cycle of a waveform, and fractions of a cycle are measured using the concept of phase, then it follows that frequency is the time rate of change of phase. Therefore phase is the time integral of frequency. If an oscillator frequency is linearly proportional to a variable such as voltage, then the phase output is proportional to the integra of the voltage input. The voltage controlled oscillator (VCO) may be mathematically described as an integration from an input variable n volts to an output variable in phase.

For radian frequency and phase eq. 2.1 below applies.

$$\omega = \frac{d\theta}{dt} \qquad (2.1)$$

Throughout this thesis lower case letters will be used to indicate time domain quantities, and capitals to indicate their frequency domain counterparts. Constants will also normally be indicated by capitals. For clarity, the prefix $\Delta$ will be used to indicate a small signal quantity if there is a possibility of confusion.

With these points in mind, the basic behavior of the PLL may be discussed in more detail. Fig. 5A shows the standard block diagram of a simple PLL.

Some description of the components of Fig. 5A is in order. The divider is a digital circuit that may be implemented in a variety of ways. Digital dividers are available that can accept input frequencies into the microwave spectrum.. The method of implementation is not important to this discussion, as from a control system perspective it simply divides both frequency and phase by a number N. This is valid so long as delay in the divider is small enough to be neglected.

The phase detector (PD) converts the phase difference between its two inputs into a voltage output. Phase detectors may be implemented in either analog or digital technology, but the digital implementation is the more common. This popularity stems from the ability to design the digital PD to have frequency as well as phase detection properties. That allows the loop to acquire lock (phase tracking) over a wide range of frequencies, which is essential to a wide band synthesizer. This type of detector is called a phase/frequency detector, and may be considered to have a linear response relative to phase and a crudely linear response relative to frequency [2,81].

The digital PD usually provides its output in the form of pulse width, which must be low pass filtered to recover a voltage proportional to phase. A disadvantage of the digital PD as compared to the analog PD is the digital noise that exists in its output. This noise can cause undesired sidebands in the spectrum of the output.

Unless stated otherwise, the so called Type 4 digital phase/frequency detector [2,8] will be assumed, and referred to simply as the PD. This versatile PD has an encodable phase detection range of $\pm 2\pi$, and has the very desirable capability of approximate frequency detection, as mentioned above. This fact allows an approximate linear model of the loop in an unlocked condition to be developed [2,81]. For further discussion of the behavior and implementation of phase detectors the reader is referred to [2] and [3].

The loop filter is a low pass type that is intended to prevent noise of any source from reaching the VCO input, where it would cause noise sidebands to appear in the VCO output. Most synthesizers use active filters based upon operational amplifiers (op amps). The Type 3 active loop filter is probably the most common for synthesizer work [2,13]. It acts like an integrator at low frequencies and a simple pass function at higher frequencies. An integrating loop filter would have good noise suppression capabilities, but is usually rejected because its phase shift at high frequencies poses a stability problem.

Basic operation may be understood as follows, where a phase/frequency detector is assumed. When power is applied the VCO begins oscillating. Its output is divided by N in the divider and presented to the phase detector. Since the frequency will not automatically come up to $N\omega_{ref}$, the phase/frequency detector will generate an error voltage proportional to the difference between $\omega_{ref}$ and $\frac{\omega_{out}}{N}$. This voltage has a sense that steers the VCO toward the condition where $\omega_{out} = N\omega_{ref}$. For the type 4 phase/frequency detector this process is approximately linear. When the frequency error becomes small the loop begins operating in a phase detection mode, and phase is steered to whatever value is required for the loop filter to support the VCO input voltage needed to maintain $\omega_{out} = N\omega_{ref}$. This process is quite linear, though the phase detector gain is different from the unlocked case. The entire process must be considered basically nonlinear due to the sharp change that occurs as the loop transitions from the frequency to phase detection mode.

A PLL using an analog PD would exhibit even more pronounced nonlinearity in acquiring lock. The analog PD has no frequency detection capability, but a PLL using one can still acquire lock through complicated dynamic response if the frequency error is within a limit called the pull-in range [2,41]. Once phase tracking is established, it behaves in a way similar to the PLL using the phase/frequency detector.

The above discussion is intended to give the reader an intuitive feel for the behavior of the system. Even though much analysis is needed to describe the PLL well enough for design purposes, quite valuable understanding can be attained from this simple presentation.

For example, the understanding that the VCO acts as an integrator, and therefore has a 90 degree phase lag, immediately allows one to draw the conclusion that the sum of all other phase shifts must be maintained less than 90 degrees over frequencies where loop gain > 1 for the system to maintain stability. The fact that the PD operates in a pulse width mode implies that the phase match the system drives for should ideally be 0, not 90 degrees or any other such number. This follows from he fact that if pulse width approaches zero, the harmonics of the pulses will approach zero and present less of a noise problem. This is the exact behavior exhibited by the type 4 PD.

If the output of the phase detector is approaching zero, then it follows that a loop filter with infinite DC gain should be preferred, as that kind of filter can support any VCO input voltage with zero volts on its own input. An integrating loop filter would meet that behavior, but violate the phase shift behavior. For that reason the type 3 active filter, with zero phase shift at high frequencies but infinite DC gain, is the preferred filter for most synthesizer applications.

2.2 Loop Component Transfer Functions

Linear models of the various loop components are needed to proceed with analysis. In assigning variable names the ones used by Best will be followed as much as possible. Variables describing signals at different points in the loop are given in Fig. 58.

The VCO will always have some nonlinearity in its voltage to frequency conversion, but it will be assumed linear with a proportionality factor of $K_o$. The units of $K_o$ could be either Hz/volt or radians/sec/volt, but radian measure is usually assumed. In that case, due to the integrating action of the VCO, its transfer function is $$\frac{\Theta_{out}(s)}{U_f(s)} = \frac{K_o}{s}. \tag{2.2}$$

It has already been stated that the divider gain is simply $\frac{1}{N}$. This applies to both frequency and phase.

The phase detector produces an average output voltage in proportion to input phase difference, so $$U_d(s) = K_d \left( \Theta_1(s) - \Theta_2(s) \right). \tag{2.3}$$

The numeric value of $K_d$ for the type 4 PD is $\frac{V_{cc}}{2\pi}$, where $V_{cc}$ is the magnitude of the PD pulses. This follows from the fact that the PD works by providing a pulse of width equal to the time difference between the edges on its inputs. The average value of this output goes from zero to $V_{cc}$ as the phase difference goes from zero to $2\pi$.

In the locked state the average value of $\Theta_2$ is forced to track reference phase $\Theta_1$, so that for small signal analysis $\Theta_1$ can be assigned to be zero. In that case the PD may be considered a single input component, and that input is the error phase $\Delta\Theta_2$.

Figure 5C:
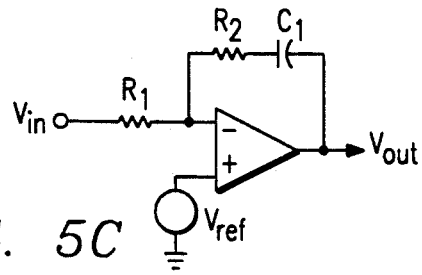
FIG. 5C illustrates a type 3 active loop filter having a single ended input.
Figure 5D:
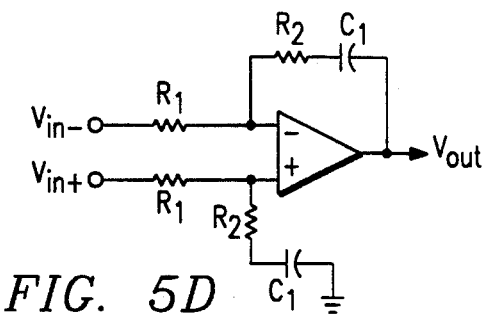
FIG. 5D illustrates a type 3 active loop filter having a differential input.

The loop filter is a low pass that could be as simple as a two component RC. Most synthesizers use the active type 3, as discussed above. Circuit implementations are shown in Figs. 5C and 5D.

The transfer function of the filter is given by $$F(s) = \frac{-(1 + s\tau_2)}{s\tau_1}, \tag{2.4}$$

where $$\tau_1 = R_1 C_1, \tag{2.5}$$

and $$\tau_2 = R_2 C_1. \tag{2.6}$$

Figure 5E:
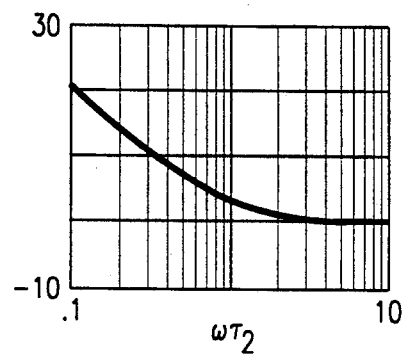
FIG. 5E illustrates a magnitude and phase response of the type 3 active loop filter.
Figure 5E:
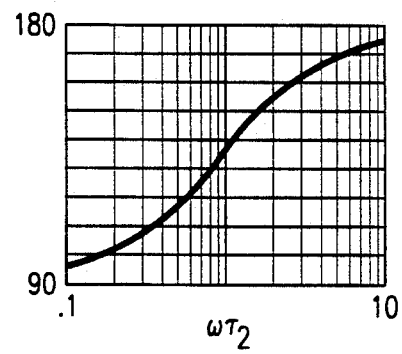

This function is plotted in Fig. 5E. The graphs are normalized with $\omega\tau_2 = \tau_1$.

If the inverting loop filter of Fig. 5C is used, then the phase detector inputs are reversed in order to maintain negative feedback. By convention, the loop filter is assumed noninverting in the analysis. This must be remembered to avoid confusion in the analysis that follows.

Note in Fig. 5E that the phase exhibits the 90 degree positive phase shift associated with a single zero. This is the feature of the type 3 filter that assists in maintaining loop stability. The integrating characteristic at low frequency allows near zero average phase error in the locked stated.

In practice there is usually a simple passive prefilter function directly following the phase detector. This filters the pulses into an average voltage that is further filtered by the loop filter. This prefilter is usually set to have negligible phase shift at the frequencies of interest, and thus it is usually omitted in the analysis.

2.3 The Basic PLL Transfer Functions

With these transfer functions understood, small signal analysis of the loop in the locked condition may be performed. The initial goal is establishment of the transfer functions from the reference input to different points in the loop. Later this shall be extended to the transfer from a modulating voltage summed into the VCO input to the frequency variation on the output. Controlling that particular transfer function is a major goal of this work.

The introductory analysis given by Best [2] shall be generally followed here. The analysis is expanded to include the divider of value N in the feedback loop. The extension to the FM PLL will follow this introduction.

The phase transfer function is that from the reference input through the loop to the phase detector's other input, or $$H(s) = \frac{\Theta_2(s)}{\Theta_1(s)}. \tag{2.7}$$

This function is derived by simple substitution using the various component transfer functions.

$$\Theta_2(s) = \frac{\Theta_{out}(s)}{N}$$

$$= \frac{K_o U_f(s)}{Ns}$$

$$= \frac{K_o F(s) K_d [\Theta_1(s) - \Theta_2(s)]}{Ns}$$

Solving for $\frac{\Theta_2}{\Theta_1}$ yields (2.8)

$$H(s) = \frac{K_d K_o F(s)}{Ns + K_d K_o F(s)}.$$

Another important relation is the error transfer function, defined by (2.9)

$$H_e(s) = \frac{\Theta_e(s)}{\Theta_1(s)},$$

(2.10)

$$\Theta_e(s) = \Theta_1(s) - \Theta_2(s).$$

An expression for $H_e(s)$ in terms of loop component transfer functions is developed by the same substitution process as for H(s). This yields (2.11)

$$H_e(s) = \frac{Ns}{Ns + K_d K_o F(s)}.$$

It is important to note the general character of $H(s)$ and $H_e(s)$. The above relations show that the phase transfer function H(s) is generally low pass, and the error transfer function $H_e(s)$ is generally high pass. These relations are graphed as functions of frequency and loop parameters in many reference sources. This is quite useful in design of standard PLLs, and will be shown in this work to be very useful in the design of the FM PLL also.

2.4 The Normalized Form

A very useful practice in control system design is the mathematical description of a system, where possible, in a standard normalized form. The normalized description, being previously analyzed and well understood, saves the designer much work by eliminating basic analysis. It is comparable to the practice of designing filters by use of normalized form design tables.

Though the use of the normalized form is well presented in the common references, there appears to be nothing in print concerning its applicability to the FM PLL. When this work began, the author was unsure if the normalized form could be applied. As will be shown later, it can be very advantageously used. The author has participated in attempts to optimize FM PLLs without use of normalized form, and the task seemed almost impossible. The use of the normalized form, coupled with advances to be described later, reduces the task to a simple exercise.

The normalized form is developed in the PLL by substitution of an explicit expression for the loop filter transfer function $F(s)$ into the expressions for $H(s)$ and $H_e(s)$. Substituting (2.4) for the type 3 active loop filter into (2.8) and (2.11) yields the expressions below.

(2.12)
$$H(s) = \frac{\frac{K_o K_d}{\tau_1 N}(1 + \tau_2 s)}{s^2 + \frac{K_o K_d \tau_2}{\tau_1 N}s + \frac{K_o K_d}{\tau_1 N}}$$

(2.13)
$$H_e(s) = \frac{s^2}{s^2 + \frac{K_o K_d \tau_2}{\tau_1 N}s + \frac{K_o K_d}{\tau_1 N}}$$

The reader is reminded that the negative sign in (2.4) is neglected in the analysis. Negative feedback is obtained in the standard block diagram by use of the inverting input to the phase detector, even though the opposite connection is usually used in practice.

We see that the denominators of both expressions are the same second order form. The PLL with the type 3 active filter is referred to as a second order PLL. One order comes from the integrating character of the oscillator, and one from the low pass action of the loop filter.

It is noted that in Best's analysis the expression for H(s) has been accidentally transposed with the similar expression for the case of a passive loop filter.

In control theory, the standard normalized form of a second order equation is $$s^2 + 2\zeta\omega_n s + \omega_n^2.$$

(2.14)

In (2.14) $\zeta$ is referred to as the damping factor, and $\omega_n$ as the natural frequency. Equating coefficients between this equation and the denominator of (2.12) and (2.13) shows that the denominator can be expressed in normalized form if the following definitions are made.

$$\omega_n = \sqrt{\frac{K_o K_d}{\tau_1 N}}$$

(2.15)

$$\zeta = \frac{\tau_2 \omega_n}{2}$$

(2.16)

Applying these definitions to (2.12) and (2.13) result in the normalized form expressions for H(s) and $H_e(s)$ shown below.

$$H(s) = \frac{2\zeta\omega_n s + \omega_n^2}{s^2 + 2\zeta\omega_n s + \omega_n^2} \qquad (2.17)$$

$$H_e(s) = \frac{s^2}{s^2 + 2\zeta\omega_n s + \omega_n^2}. \qquad (2.18)$$

It is noted in Best [2,23] that if $K_o K_d \gg \omega_n$, then the passive loop filter PLL can also be expressed in this same normalized form. Best neglects to mention that the approximation to this form is most accurate for the type 2 passive filter. That filter has a low frequency pole, and a higher frequency zero. The term $K_o K_d$ is often referred to as the loop gain, though it is really only the total loop gain in the passive loop filter case.

Applying the quadratic equation to (2.14) allows the development of some valuable basic information.

$$s = \omega_n \left( -\zeta \pm \sqrt{\zeta^2 - 1} \right), \zeta \geq 1 \qquad (2.19)$$

$$s = \omega_n \left( -\zeta \pm j \sqrt{1 - \zeta^2} \right), \zeta < 1 \qquad (2.20)$$

From (2.15) and (2.16) it is seen that $\omega_n$ and $\zeta$ are positive numbers. In that case the roots of the normalized equation are constrained to lie in the left half plane. They are on the negative real axis for $\zeta$ (overdamped case), and split into separate conjugate poles for $\zeta \geq 1$ (underdamped case). Thus the ideal second order PLL is an unconditionally stable system, though it does exhibit a damped sinusoidal transient response in the underdamped case.

In practice it is possible for the PLL with type 3 active loop filter to go unstable. This happens if parasitic phase shift is of sufficient magnitude to push the poles into the right half plane. The total parasitic phase shift is the sum of that from PD delay, divider delay, prefilter phase shift, parasitic VCO poles, and any other parasitic lag in the system. If a reasonable phase margin is designed into the system, such instability is easily avoided.

Detailed graphs of second order system responses, in both the time and frequency domain, are available using this normalized form. In the frequency domain a family of curves are usually presented, with frequency normalized to $\omega_n$, and with $\zeta$ as a parameter. This allows easy selection of $\zeta$ and $\omega_n$ for a particular application. Best [2,23] and Gardner [3,12] provide such curves. Similar curves, developed with the commercial program MathCAD, are given in Figs. 5F and 5G.

The frequency where the magnitude of H(s) drops 3 DB from its DC value is referred to as the loop bandwidth. It may be generally stated that the loop responds to phase error within the loop bandwidth, while higher frequencies of variation are too fast for the loop to see. From Fig. 5F it is seen that the loop bandwidth is about $2\omega_n$ for the most common $\zeta$ range of .5 to 1. This range of $\zeta$ is almost universally used, as it gives the best compromise of transient response, optimal flatness over frequency, and lock acquisition time [2,24]. The loop bandwidth concept is quite important in all PLL design.

Fig. 5G shows the error transfer function. The high pass character and effect of $\zeta$ are noteworthy.

2.5 Frequency Modulation in the PLL

The ability to synthesize a discrete frequency is extremely useful, but the PLL synthesizer would be even more capable if it could be frequency modulated or steered to frequencies in between the discrete steps. There are two ways this can be implemented.

One method is to steer the reference frequency of the loop. If a the frequency is a crystal oscillator that can be "pulled" by an external voltage, then the output frequency will exhibit N times the reference frequency variation. This holds only at modulating frequencies within the PLL bandwidth. This limitation, and the difficulty of design, expense, and limited tune range of the voltage controlled crystal oscillator (VCXO) lowers the utility of this method. The reader is referred to [4] for more detailed description of this technique.

A technique of far greater usefulness, in the author's opinion, is to sum the modulating voltage into the VCO input. This general concept is what is referred to in this work as the FM PLL. As mentioned earlier, the technique is described qualitatively in the public literature [5,29], but there seems to be little available in the way of real analysis and optimization. That gap will be addressed in the remainder of this and the following chapter.

Figure 5H:
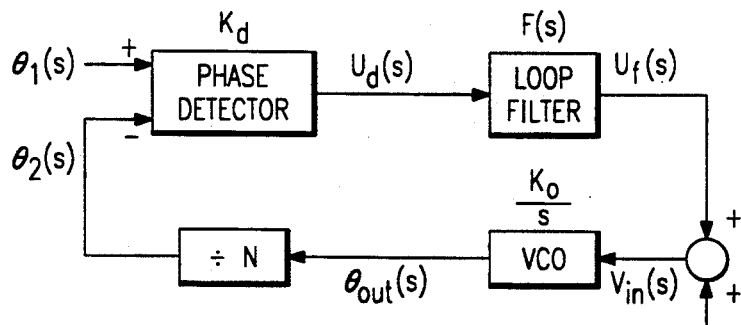
FIG. 5H illustrates a curve for FM PLL with modulating voltage $V_m$.
Figure 5I:
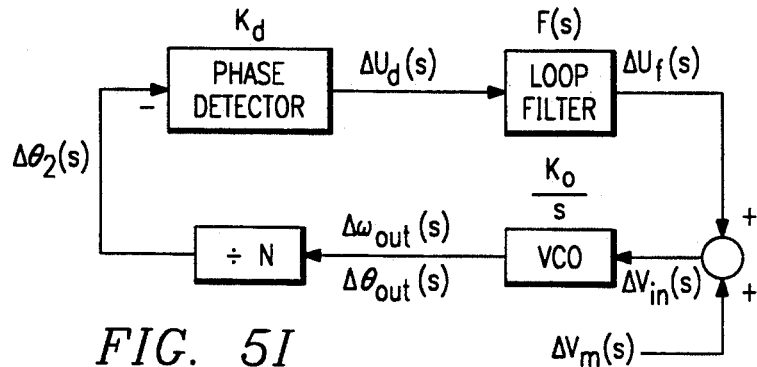
FIG. 5I illustrates an FM PLL small signal model.

The basic method of VCO injected FM PLL synthesis is shown in Fig. 5H. The modulating voltage is summed into the VACO input and simply modulates the frequency in accordance with the VCO gain $K_o$. It will be shown that if the frequency of modulation is well outside the loop bandwidth, the loop does not "see" the modulation as error, and does not respond to it. For lower frequency modulation the loop is able to respond to it as error. This response is an undesired distortion, and must be controlled.

This technique will be analyzed using a slight modification of the symbology used for the standard PLL. With the loop holding lock during modulation, the variables of interest are variations from the quiescent state. The total value of these variables are functions of $V_m$ and $\theta_1$. We wish to develop transfer functions for these variables relative to $V_m$.

The reference $\omega_1$ will be assumed unchanging, so $\theta_1(t)$ is a ramp (via integration). The loop is locked, so the average $\theta_2(t)$ is a matching ramp. The average phase error is their difference, and therefore is zero. This allows the analysis aid of ignoring these steady state ramps and replacing the differential input phase detector with a single input for $\theta_2$ for description of the effect on small signal variation. To distinguish these small signal variables from the large signal cases the prefix $\Delta$ will be used in the remainder of this work. The previous basic analysis was also small signal, and the only reason $\Delta$ was not used was to remain consistent with the presentation of Best [2]. The model for the FM PLL using these variables is shown in Fig. 5.

The transfer function of interest, $\dfrac{\Delta\omega_{out}(s)}{\Delta V_m(s)}$, is obtained by simple substitution around the loop. The term $H_{fm}(s)$ will be designated for this important function, and it shall be referred to as the frequency modulation transfer function.

(2.21)

$$H_{fm}(s) = \frac{\Delta\omega_{out}(s)}{\Delta V_m(s)}$$

$H_{fm}$ is found as below.

(2.22)

$$\Delta V_{in}(s) = \Delta U_f(s) + \Delta V_m(s)$$

$$\Delta V_{in}(s) = -F(s)K_d\Delta\Theta_2(s) + V_m(s)$$

$$\Delta V_{in}(s) = \frac{-F(s)K_dK_o\Delta V_{in}(s)}{Ns} + V_m(s)$$

$$\frac{\Delta V_{in}(s)}{\Delta V_m(s)} = \frac{s}{s + \dfrac{F(s)K_dK_o}{N}}$$

From $\Delta\omega_{out}(s) = K_o \Delta V_{in}(s)$ we immediately obtain (2.23)

$$H_{fm}(s) = \frac{K_o s}{s + \dfrac{F(s)K_dK_o}{N}}.$$

Equation (2.23) is an important relation. It shows that the transfer from input voltage to output frequency is high pass, whereas an all pass is desired. By comparison to (2.11) it is also noted that $$H_{fm}(s) = K_o H_e(s). \quad (2.24)$$

This extremely useful fact is not one the author has seen pointed out elsewhere. Since $H_e(s)$ is expressible in normalized form, $H_{fm}(s)$ is also expressible in normalized form. By use of (2.24) and (2.18), we may immediately write that normalized form.

$$H_{fm}(s) = \frac{K_o s^2}{s^2 + 2\zeta\omega_n s + \omega_n^2} \quad (2.25)$$

Eq. (2.25) holds for the active type 3 loop filter case, and also for the high gain loop with passive loop filter. The previous equations for $\zeta$ and $\omega_n$ in terms of component values apply.

It is also seen that $$H_{fm}(s) \approx K_o, \quad s \gg \frac{F(s) K_d K_o}{N}. \quad (2.26)$$

For the standard value of $\zeta = .707$, the cutoff for (2.26) to apply is about $\omega_n$. Other values of $\zeta$ must be examined individually.

2.6 The Signal to Distortion Concept and Loop Optimization

At lower frequencies the loop will appreciably distort the intended modulation. Reducing this effect via proper design is a major goal of this work.

In order to develop optimum loop parameters a signal to distortion function shall be defined. It may then be maximized under given modulation conditions for best performance. Since any loop response to the modulation is distortion, we shall define the signal to distortion ratio as (2.27)
$$\frac{\text{signal}}{\text{distortion}}(s) = \left|\frac{\Delta V_m(s)}{\Delta U_f(s)}\right|.$$

This signal to distortion $\left(\frac{S}{D}\right)$ is simply the reciprocal of the transfer from the input to the filter output. It is derived by the same around the loop substitution process.

(2.28)
$$\Delta U_f(s) = \frac{-F(s)K_d K_o \Delta V_{in}(s)}{Ns}$$
$$= \frac{-F(s)K_d K_o(\Delta U_f(s) - \Delta V_m(s))}{Ns}$$

$$\frac{\Delta V_m(s)}{\Delta U_f(s)} = \frac{1 + \frac{F(s)K_d K_o}{Ns}}{\frac{-F(s)K_d K_o}{Ns}}$$

$$\frac{S}{D}(s) = \left|\frac{1 + \frac{F(s)K_d K_o}{Ns}}{\frac{F(s)K_d K_o}{Ns}}\right|$$

(2.29)
$$\frac{S}{D}(s) = \left|\frac{Ns + F(s)K_d K_o}{F(s)K_d K_o}\right|$$

Comparison of (2.29) to (2.8) shows that the signal to distortion ratio is the magnitude of the reciprocal of the phase transfer function H(s). Therefore the normalized form is again applicable.

$$\frac{S}{D}(s) = \left| \frac{1}{H(s)} \right| \quad (2.30)$$

$$\frac{S}{d}(s) = \left| \frac{s^2 + 2\zeta\omega_n s + \omega_n^2}{2\zeta\omega_n s + \omega_n^2} \right| \quad (2.31)$$

Though simple to derive, this signal to distortion relation provides a great deal of information of exactly the type required to actually design an FM PLL. A graph of the signal to distortion ratio is shown in Fig. 5.9.

From the graph critical information can be deduced. It has been previously noted in the literature [5,31] that the FM PLL can be frequency modulated at rates outside the loop bandwidth. The signal to distortion quantifies this, and as expected is better for smaller $\omega_n$. However, the graph above reveals clearly a previously undisclosed trend about the damping factor $\zeta$.

In general, $\zeta$ is selected to be between .5 and 1, with .707 considered the general optimum. A competent designer would not vary from that practice without good reason, and Fig. 5.9 provides that reason. It shows clearly that signal to distortion outside the loop bandwidth is significantly better for smaller $\zeta$. This is new and important information.

The following strategy may be formulated. For best signal to distortion the smallest $\omega_n$ that meets other system requirements should be chosen. These are well described in [2] and [3], but in general the major trade off is slower acquisition time for smaller $\omega_n$ [3,75]. Gardner provides the following approximation for the linear second order PLL for the pull in time $T_p$, defined as the time required to acquire a frequency lock from offset $\Delta\omega$.

$$T_p = \frac{(\Delta\omega)^2}{2\zeta\omega_n^3} \quad (2.32)$$

For the digital type 4 PD, Best [2,75] gives the following for the second order PLL.

$$T_p = \frac{N\tau_p + \tau_2}{K_o K_{df}} \quad (2.33)$$

In (2.33) the term $K_{df}$ refers to the gain of the PD in the unlocked state, where it is actually in a frequency detection mode. This state is nonlinear, but may be approximated for frequencies close to $\omega_{ref}$ as below [2,83]. $V_{cc}$ is the magnitude of the PD output pulses.

$$K_{df} = \frac{V_{cc}}{W_{ref}} \quad (2.34)$$

With regards to $\zeta$, a new strategy is required. The improved signal to distortion outside the loop bandwidth for the lower values of $\zeta$ shows that if modulation is restricted to higher frequencies then a lower than normal $\zeta$ should be chosen. Then limitation on this is given by (2.20). As $\zeta$ approaches zero the poles of the system move from stable positions in the left half plane to the imaginary axis. Because of inevitable parasitic phase shift, the system is likely to go unstable for very small $\zeta$. IT also will develop a strongly oscillatory transient response. The designer must choose if he prefers the unpleasant transient to lower frequency modulation in return for better signal to distortion ratio at higher frequencies.

If modulation at rates coming down to approach $\omega_n$ are desired, then a more usual value of $\zeta$ would be chosen. If the FM were to actually verge into the range lower than $\sqrt{2}\omega_n$ then a larger than normal value might be appropriate.

Whatever the particular case, the use of the signal to distortion relation and normalized variables allows good optimization of the FM PLL with relative ease. However, for rates not significantly higher than $\omega_n$ even the optimum loop design may not yield acceptable signal to distortion. A major improvement to the FM PLL that addresses that situation is the subject of the next section.

2.7 A Fundamental Improvement to the FM PLL: Integrator Error Correction

Figure 5K:
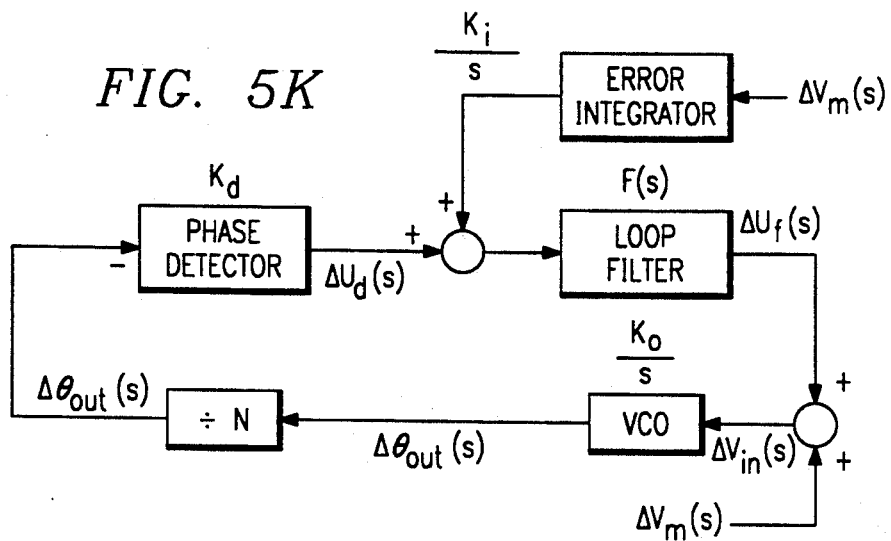
FIG. 5K illustrates an FM PLL with integrator error correction.

Reading about this elegant concept in [5] was the spark that ignited the author's interest in FM phase lock. The idea was simple and to the point. Since the loop must respond to FM as error and attempt to servo it out, the phase detector output will always give the integral of the modulating voltage. To prevent the loop from responding to FM generated error, but still hold lock by responding to other error, it is only necessary to integrate the modulating voltage, scale it properly to be of the same magnitude but opposite sign to the PD output, and sum it into the PD output. This will cancel the loop response to the FM, so that high signal to distortion can be maintained inside as well as outside the loop bandwidth. The system is shown in Fig. 5K.

We need the transfer function $H_{fm}(s)$ from voltage input to frequency output with the integrator in place. The now familiar substitution process yields the following.

$$H_{fm}(s) = \frac{\Delta\omega_{out}(s)}{\Delta V_m(s)} = \frac{K_o\left(1 + \dfrac{F(s)K_1}{s}\right)}{1 + \dfrac{F(s)K_oK_d}{Ns}} \tag{2.35}$$

We note that if $$K_i = \frac{K_o K_d}{N}, \tag{2.36}$$

then (2.32) reduces to $$H_{fm}(s) = K_o. \tag{2.37}$$

Eq. (2.37) represents the absolutely ideal behavior for the FM PLL. It provides a perfect transfer function from voltage to frequency that is independent of both frequency and loop parameter.

We note from (2.36) that the ideal match condition requires the integrator gain to match the voltage to voltage gain from the VCO input to the PD output. This is what is intuitively expected, as the two inputs to the summing node must be of equal magnitude to cancel properly.

It is worth mentioning that if the path through the VCO and PD is modified by any filtering, such as a prefilter on the PD output, a similar function should be included in the integrator path.

In practice this perfect transfer function cannot be maintained. The problem is that the VCO gain $K_o$ can only be moderately well controlled, so that the ideal match condition of (2.36) can only be approximately maintained. In a typical case, the VCO gain might be known as repeatable within a 10% tolerance. That would allow the distortion to be reduced by at least 90%, but some distortion would still be present. In practice, such a reduction can be very useful. The author has used the technique in the design of commercial equipment with excellent results. Hewlett Packard uses this technique successfully in some very high quality laboratory signal generators [5,38].

Practical application of this technique will require considering and overcoming some practical problems. For example, for some applications the signal to distortion in the error corrected case must be known and controlled. though the ideal case is independent of loop parameters and frequency, the practical case is not. These consideration are addressed in the next chapter.

2.8 Chapter Summary

The purpose of this chapter was twofold. First, it was intended to introduce the reader to the PLL and the FM PLL. The understanding of this material is important in its own right, and is also an aid in understanding the analysis and advantages of the frequency locked loop to be presented later. Second, it was desired to develop logical design and optimization procedures for the FM PLL.

A very useful signal to distortion definition was made. It was shown that the highly useful normalized form of the second order PLL applies fully to the FM case. The combination of the new signal to distortion definition and the normalized form reduces loop optimization to a simple and intuitive exercise.

The integrator error correction technique was introduced. It allows high signal to distortion to be maintained at any modulating frequency. However, the detailed analysis of that technique will reveal many special considerations. Analysis of those is the subject of the next chapter.

CHAPTER 3
LIMITATIONS AND IMPROVEMENTS IN THE INTEGRATOR ERROR CORRECTED FREQUENCY MODULATED PHASE LOCKED LOOP

3.1 Introduction

A thorough investigation into the error corrected PLL will be performed in this chapter. This analysis will result in several suggested improvements to the corrected FM PLL. It will also expose some inherent weaknesses in the general method. These weaknesses may not be completely eliminated, though their effects can be reduced by full understanding in the design process. The impossibility of eliminating these problems in the FM PLL led the author to develop the FM $\Delta\Sigma$ frequency locked loop to be presented later.

3.2 Practical integrator Limitations: the Bypassed Integrator

In practice DC FM is a difficult goal to achieve. If the VCO is held off of $N\omega_{ref}$ long enough, then the phase and voltage ramps that result must eventually hit some limit. The PD is most likely to "Rail out" first, but the error integrator output could reach its limit also.

To achieve DC FM, or steering to any desired frequency and holding it, a rather large amount of complicated circuitry is required. The method involves resetting the integrator and PD whenever some limit is reached. The interested reader is referred to [5], where the method is lucidly described. We will focus here on the analysis down to very low frequencies, but not true DC.

Figure 6A:
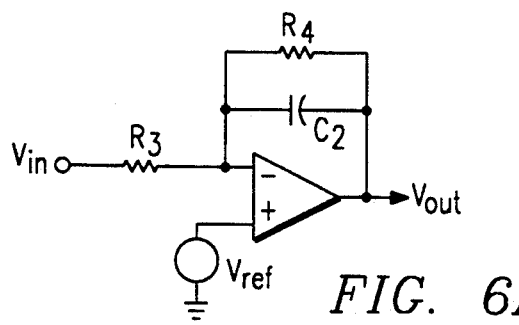
FIG. 6A illustrates a bypassed integrator.
Figure 6B:
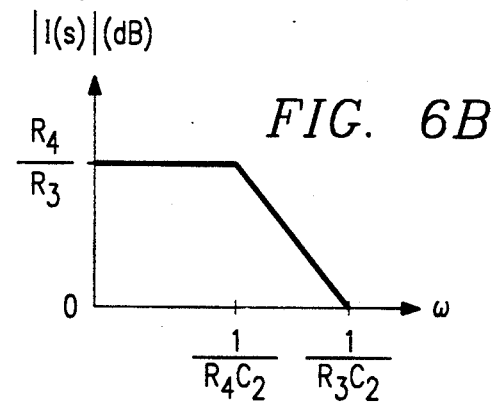
FIG. 6B illustrates a bode plot of the bypassed integrator.

The actual form of the error correcting integrator is not usually the standard one [5,33]. In a practical analog circuit there is always some error, and constant error on the input of the integrator must result in it eventually railing out. This is avoided by placing a large resistance in parallel with the integrator capacitor, as shown in Fig. 6A. The bode plot for this circuit is shown in Fig. 6B.

Analysis of the circuit yields its transfer function I(s) to be $$I(s) = \frac{R_4}{R_3 R_4 C_2 s + R_3}. \tag{3.1}$$

At frequencies above $\frac{1}{R_4 C_2}$ the circuit acts as an integrator. Below that frequency the integrating action ceases. However, the limit on gain ensures that the maximum error on the output is $$V_{\text{offset,out}} = (V_{\text{offset,in}}) \frac{R_4}{R_3} \tag{3.2}$$

The input offset is the sum of the DC voltage error in $V_m$ and the op amp internal offset.

Eq. (3.1) may be written in simplified form as below.

$$I(s) = \frac{K_I}{s + \omega_p} \tag{3.3}$$

$$K_I = \frac{1}{R_3 C_2} \tag{3.4}$$

$$\omega_p = \frac{1}{R_4 C_2} \tag{3.5}$$

3.3 Matching the VCO to the Bypassed Integrator

The bypassed integrator yields good results in the integrator error corrected FM PLL for frequencies above its pole. As the frequency approaches the pole, performance degrades. It will be shown later that the same loop optimization criteria as for the simple FM Pll apply, so in some cases a very small $\zeta$ may be in use. In that case, as frequency approaches the pole and the system loses its error correction, an unacceptable oscillatory transient response may occur. A method is presented here for reducing this negative effect.

Figure 6C:
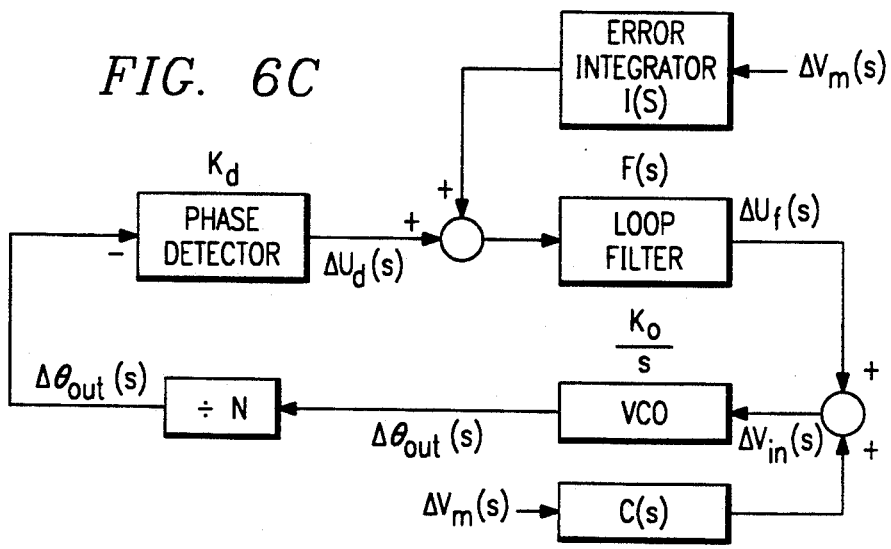
FIG. 6C illustrates a generalized error corrected FM PLL.

The method is based upon a generalization of the integrator error correction method. Instead of the analysis being carried out with the ideal integrator, it uses the bypassed integrator with transfer function I(s). A modifying function on $V_m$ prior to the input to the summing node is included. Its purpose is to modify the VCO input voltage to maintain the correcting condition in the case of the bypassed integrator. This function is designated as C(s). The system is shown in Fig. 6C.

The goal is determination, if possible, of the function C(s) such that $H_{fm}(s)$ has a smooth response, without the ringing associated with low $\zeta$. This implies a first order response is needed. Furthermore, the nature of the system (no DC FM) dictates the response should be high pass. Because we wish the system to behave as an ideal modulator, the desired system modulation function may be written as (3.6)

$$H_{fm}(s) = K_o C(s).$$

Solving for $H_{fm}(s)$ is the block diagram above yields (3.7)

$$H_{fm}(s) = \frac{K_o ( F(s)I(s) + C(s))}{1 + \frac{F(s)K_d K_o}{Ns}}.$$

Then substituting (3.6) into (3.7) and attempting to isolate C(s) shows that the desired function does exist. In the matched condition $\left(K_1 = \frac{K_d K_o}{N}\right)$ it is given by (3.8)

$$C(s) = \frac{s}{s + \omega_p}.$$

A simple, useful, and intuitive result has occurred. The correcting function was expected to be high pass, so that it can filter out the input in the low frequency range where the bypassed integrator acts as an amplifier. It could have also been expected to have its zero at the bypassed integrator pole frequency $\omega_p$.

It is worth emphasizing that this matching of the VCO to the bypassed integrator is useful only in a certain case. That case is when the damping factor $\zeta$ has been set unusually low (< .707) in order to obtain the absolute best possible signal to distortion for modulating frequencies above 1.414 $\omega_n$. In that case, the high pass filter C(s) will suppress the oscillatory transient response to lower frequency modulation.

Of course, most practical systems that did not require DC FM would have the modulation AC coupled into the loop to lower the error. Any such filtering would reduce the low frequency transient response. The significant point about the above is that it results in $H_{fm}(s) = K_oC(s)$ for any values of the loop parameters. That does not hold for other filter functions. To the author's knowledge, this is new information.

3.4 The Effect of Mismatch on the Signal to Distortion Ratio

The integrator error corrected FM PLL is theoretically capable of infinite signal to distortion. In practice, the error integrator cannot be perfectly matched to the loop. The majority of the error is due to $K_o$, since the transfer function of a VCO is a function of may imprecise analog variables. The error integrator gain varies with the accuracy of its main resistor and capacitor, and can be quite precise when high tolerance components are used.

The inevitable mismatch that occurs results in a finite signal to distortion ratio, though it is markedly superior to the simple FM PLL. There are applications where a quite high signal to distortion is required, and thus a quantitative evaluation is necessary. Therefore the signal to distortion as a function of the amount of mismatch will be developed in this section.

The analysis will be performed for the general case of unspecified loop filter. The result will turn out to be only slightly more complicated than the uncorrected FM PLL, and the normalized form will again be directly applicable.

The signal to distortion is still defined by (2.27). Solving for this transfer function by substitution around the corrected FM PLL of Fig. 55 leads to $$\frac{S}{D}(s) = \left| \frac{s + \frac{F(s)K_dK_o}{N}}{F(s)\left(K_i - \frac{K_dK_o}{N}\right)} \right|.$$

(3.9)

We note that if the perfect match condition holds, then signal to distortion approaches infinity. The mismatch error $\epsilon_i$ will be defined as (3.10)

$$\epsilon_i = K_i - \frac{K_d K_o}{N}.$$

Now a very useful result may be developed. By dividing the signal to distortion with integrator by the signal to distortion without integrator (2.29), it is easily shown that (3.11)

$$\frac{\frac{S}{D}(\text{corrected})}{\frac{S}{D}(\text{simple})} = \frac{K_d K_o}{N \epsilon_i}$$

This is the result that was alluded to in the last section. The integrator error correction provides a constant improvement over the uncorrected case. From this it follows directly that the same loop optimization conditions hold. That is why a low $\zeta$ would still apply to obtaining the highest possible signal to distortion at higher frequencies in both cases.

The normalized form also follows directly from the above results. Eq. (2.31) gave the uncorrected signal to distortion in normalized form, and the corrected signal to distortion is obtained by multiplying it by the factor given above.

To obtain detailed signal to distortion plots for a particular case, the designer would start with the standard normalized plots of H(s). The uncorrected signal distortion is the reciprocal of the magnitude of H(s), so plots of that function are obtained in dB by simply reflecting plots for H(s) about the zero dB axis. Then the improvement given by (3.11) is converted to dB and added to the plots. The result is the error corrected signal to distortion as a function of modulating frequency and the normalized loop parameters. In the design of an error corrected FM PLL system these plots will immediately reveal the design tradeoffs.

At this point a logical and efficient design procedure has been established. An optimum loop design of known performance may be developed with relative ease by following it. However, there still exists several potential problems with the FM PLL to be investigated. These are the subject of the next several sections.

3.5 Modulation Conditions for Maintaining Phase Lock

It has been pointed out that the limited dynamic range of the PD and correcting integrator set a lower limit on the modulation rate to keep the system locked. Keeping the loop locked is essential if frequency accuracy is to be maintained. This may be avoided by sensing when the PD output passes a threshold, saving off the accumulated phase error, and resetting the phase detector and integrator [5,33]. The technique is complicated to implement, and in a simple system we would, if possible, choose to limit the modulation conditions so that such circuitry is not needed.

The problem is almost always the PD exceeding its encodable range. For the type 4 digital PD, this is $\pm 2\pi$. From the integrating character of the VCO, it may be written at once that the integral inequality below must hold to keep the system locked.

$$\left( \int_o^t \frac{K_o v_m(t)}{N} \, dt \right) < 2\pi \tag{3.12}$$

If the modulating waveform $v_m$ is complicated, evaluation of this integral could prove quite a chore. One way the author has approached it suing standard software is to use the classic circuit simulation program SPICE. An integrator may be simulated using a voltage controlled current source feeding a capacitor. An advantage of this is the ease of simulating any filtering of $v_m$. In fact, an entire PLL may be simulated on SPICE rather easily by modeling the VCO as just such an integrator.

A useful special case of (3.12) is the rectangular pulse. If a pulse has magnitude $v_m$ and duration t, then lock is maintained so long as $$v_m t < \frac{2\pi N}{K_o}. \tag{3.13}$$

Though this chapter is about the error corrected FM PLL, this is a convenient spot to determine the conditions under which the simple FM PLL (no error integrator) can hold the lock. The analysis of this case is considerably more complicated than the error corrected case. This is because the loop is not prevented from responding to the modulation, and exhibits a complicated dynamic response. The peak of the time domain phase response must never exceed $\pm 2\pi$.

There are an unlimited number of conditions we might choose to investigate for maximum phase error. The most logical would be a condition that allowed the determination of a sensible guideline for avoiding overmodulation and loss of lock. In the author's opinion, the best approach is to determine the maximum voltage step function that does not cause the system to unlock.

Unlike the corrected FM PLL, the simple PLL does not necessarily unlock when excited by a step input. When the system is allowed to respond to the modulation, the phase error is eventually brought back to zero. However, for a large enough step the system will not be able to correct the phase error fast enough to keep it less than $2\pi$.

The utility of this concept is that it determines a maximum voltage for $V_m$ within which the system is guaranteed to maintain lock. The term voltage pull out range ($V_{mpo}$ will be adopted to mean the amplitude of the step input that causes a peak phase error of $2\pi$ on the PD input. This term is selected because the term pull out range is commonly used to mean the frequency step on the reference input that causes a specified maximum phase error.

The determination of the voltage pull out range is rather tedious. The normalized form will be used here in derivation of $V_{mpo}$ for the second order simple FM PLL. The form of the derivation is similar to that used by Best [2,301] in his derivation of the frequency pull out range.

Eq. (2.24) gives the transfer function from input voltage to output frequency. It is repeated below.

(2.25)

$$\frac{\Delta\omega_{out}(s)}{\Delta V_m(s)} = \frac{K_o s^2}{s^2 + 2\zeta\omega_n s + \omega_n^2}$$

To obtain the transfer function from input voltage to $\Theta_2(s)$, substitute (3.14A)

$$\Delta\Theta_2(s) = \frac{\Delta\omega_{out}(s)}{Ns}$$

into (2.25). This yields $$\frac{\Delta\Theta_2(s)}{\Delta V_m(s)} = \frac{K_o^2 s}{(Ns)\left(s^2 + 2\zeta\omega_n s + \omega_n^2\right)}. \qquad (3.14)$$

For a step function of the desired amplitude for $V_m$, the frequency domain expression is $$\Delta V_m(s) = \frac{V_{mpo}}{s}. \qquad (3.15)$$

Substituting this input function into (3.14) gives the frequency domain function of interest.

$$\Delta\Theta_2(s) = \frac{V_{mpo} K_o^2 s}{N\left(s^2 + 2\zeta\omega_n s + \omega_n^2\right)} \qquad (3.16)$$

Reference to a table of Laplace transforms gives the time domain expressions for $\Theta_2(t)$ for the two cases $\zeta \leq 1$ and $\zeta > 1$.

$$\Theta_2(t) = \frac{V_{mpo} K_o}{N\omega_n\sqrt{1-\zeta^2}} \exp(-\zeta\omega_n t) \, \text{Sin}\left(\sqrt{1-\zeta^2}\omega_n t\right) \qquad (3.17), \zeta \leq 1$$

$$\Theta_2(t) = \frac{V_{mpo} K_o}{N\omega_n\sqrt{\zeta^2-1}} \exp(-\zeta\omega_n t) \, \text{Sinh}\left(\sqrt{\zeta^2-1}\omega_n t\right) \qquad (3.18), \zeta > 1$$

These two cases are the familiar underdamped and overdamped responses of a second order system. The underdamped case (3.17) shows the characteristic damped sinusoidal response. Since it was shown earlier that both cases can constitute optimum design under different modulation conditions, both are of practical importance.

To obtain $V_{mpo}$ in terms of the loop parameters it is necessary to apply the first derivative test to the above expressions. This gives the time $t_p$ when a peak occurs. For the overdamped case there is only a single peak to consider. For the underdamped case the first peak is the time where the greatest maximum occurs. Carrying out this exercise results in the expressions below.

(3.19)
$$t_p = \frac{\tan^{-1}\left(\frac{\sqrt{1-\zeta^2}}{\zeta}\right)}{\omega_n\sqrt{1-\zeta^2}}, \zeta \leq 1$$

(3.20)
$$t_p = \frac{\tanh^{-1}\left(\frac{\sqrt{\zeta^2-1}}{\zeta}\right)}{\omega_n\sqrt{\zeta^2-1}}, \zeta > 1$$

These times may be substituted back into (3.17) and (3.18). The expressions are then set equal to the desired maximum phase error, assumed here to be $2\pi$, and solved for $V_{mpo}$. This yields the desired expressions for $V_{mpo}$ given below.

(3.21), $\zeta \leq 1$
$$V_{mpo} = \frac{2\pi N \omega_n}{K_o} \exp\left(\frac{\zeta}{\sqrt{1-\zeta^2}} \tan^{-1}\left(\frac{\sqrt{1-\zeta^2}}{\zeta}\right)\right)$$

(3.22), $\zeta > 1$
$$V_{mpo} = \frac{2\pi N \omega_n}{K_o} \exp\left(\frac{\zeta}{\sqrt{\zeta^2-1}} \tanh^{-1}\left(\frac{\sqrt{\zeta^2-1}}{\zeta}\right)\right)$$

It is noted that these expressions have the same form as those for the frequency pull out range [2,301], though the scaling is different.

So long $|V_m|$ is maintained less than $V_{mpo}$, the system will hold the lock for any functional form of $V_m$. Other modulation might allow a greater $V_m$ without losing the lock. For example, linearity dictates that a pulse of $2V_{mpo}$ but duration less than $.5t_p$ must cause less than $2\pi$ phase error. However, a stream of pulses, such as might be used for frequency shift keyed modulation (FSK), is a different matter. Even though a single pulse might not cause unlocking, the sum of their responses might. The safe approach would be to never exceed $V_{mpo}$.

3.6 Induced Noise in the FM Phase Locked Loop

The FM PLL portion of this work will be closed out with analysis of an important performance degradation. This problem will be avoided in the $\Delta\Sigma$ frequency locked loop to be developed later.

Most modern synthesizers use the type 4 digital phase detector, due mostly to the very wide capture range it allows. As discussed earlier, its output consists of a series of pulses at $f_{ref}$ rate. The gain $K_d$ of this detector is relative to its average voltage output when filtered. This average is really the DC term of the Fourier series that describes the pulse train.

The remaining terms of the series are present, and can cause severe sidebands at offsets from the carrier equal to their frequency. A major goal in the design of a synthesizer is proper filtering of these harmonics of the reference frequency. The task is eased by the use of the active type 3 loop filter with large low frequency gain, as discussed in section 2.1. It allows lock to be maintained with near zero pulse width, so that the magnitude of these harmonics is quite small.

It is clear that the error corrected FM PLL will be much more prone to this spurious sideband problem. The error integrator cancels only the DC component of the pulse train, leaving the harmonics intact. Furthermore, by preventing the loop from responding to the modulation, it allows the phase detector to continuously encode whatever phase error is induced by the modulation. Thus the pulse width is considerably wider when the system is modulated. The harmonics of the reference, and thus the spurious sidebands, are therefore much higher.

An analysis of the situation will be given. It may be used to predict the sideband to carrier ratio of the error corrected FM PLL with good accuracy. It will also provide a good prediction for the simple FM PLL for modulating frequencies outside the loop bandwidth.

An expression is needed for the sideband to carrier ratio of a VCO as a function of a noise voltage on its input. The following expression is given, but not derived, in the Motorola MECL Device Data Book [6, 7-33]. The abbreviation will sometimes be used for sideband to carrier ratio.

(3.23)

$$\frac{\text{sideband}}{\text{carrier}} = \frac{V_t K_o}{2 f_m}$$

In this expression, $V_t$ is the peak value of the voltage on the VCO input at frequency $f_m$. $K_o$ is the VCO gain, and is in Hz per volt when frequency is in Hz. Because this relation will play a key role in the noise analysis of the delta sigma frequency locked loop ($\Delta\Sigma$ FLL) to follow, time will be taken here to check its derivation.

The derivation will make the assumption of narrowband FM. The modulation index $\beta$ is defined as below [7,263].

(3.24)

$$\beta = \frac{\Delta\omega}{\omega_m}$$

In this definition $\Delta\omega$ is the peak amount of frequency deviation caused by modulating signal of frequency $\omega_m$. When $\beta << .5\pi$, the narrowband FM condition is said to hold. A commonly accepted narrowband condition is $\beta < .2$.

When a carrier of frequency $\omega_c$ is frequency modulated by a signal with frequency $\omega_m$, then the instantaneous signal is given by (3.25)

$$f(t) = \text{Cos}\,[\omega_c t + \beta \text{Sin}(\omega_m t)].$$

The use of a few common trigonometric identities and then simplification by use of the narrowband condition [7,264] reduces (3.25) to $$f(t) = \cos(\omega_c t) - \frac{\beta}{2}\{\cos(\omega_c - \omega_m)t - \cos(\omega_c + \omega_m)t\}. \tag{3.26}$$

It is seen that the spectrum of the modulated carrier consists of the carrier frequency plus sidebands on each side of the carrier at frequency separation $\omega_m$. The sideband to carrier ratio is simply $.5\beta$. Thus $$\frac{S}{C} = \frac{\Delta f}{2f_m} \tag{3.27}$$

From $\Delta f = K_o V_t$ and (3.27), eq. (3.23) follows as was desired.

$$\frac{S}{C} = \frac{K_o V_t}{2f_m} \tag{3.23}$$

It is important to note that the sideband to carrier ratio as given by (3.23) is a voltage magnitude ratio. It will be necessary to maintain the distinction between magnitude ratio and power ratio (magnitude ratio squared) when phase noise calculations are performed later. Eq. (3.23) will be sued to calculate the VCO phase noise in a narrow bandwidth at a given offset that is induced by a noise voltage in a narrow bandwidth. This is valid since nothing in the derivation of (3.23) limited it to absolutely discrete frequencies.

The form of the output of the PD is shown in Fig. 60. The pulse width in seconds will be designated by $\rho$, the amplitude by $V_{cc}$, and the period by $t_{ref}$. In practice the output is usually high, with narrow pulses going low. The opposite case is used here only for clarity in analysis.

The pulse width as a fraction of the available time $t_{ref}$ is related to the input $v_m(t)$ by $$\frac{\rho}{t_{ref}} = \frac{\Delta\theta_{out}(t)}{2\pi N}$$

$$= \frac{K_o}{2\pi N}\int_o^t v_m(t)\,dt. \tag{3.28}$$

Eq. (3.28) is only intended to be valid for $t >> t_{ref}$. The pulse width is really a discrete variable, but may be considered continuous for low frequencies.

Transforming (3.28) to the frequency domain, we obtain $$\frac{P(s)}{t_{ref}} = \frac{K_o V_m(s)}{2\pi N s}. \tag{3.29}$$

The spectral content of the pulse stream is obtained by the use of the Fourier series. The complex form of the Fourier series is given by $$f(t) = \sum_{n=-\infty}^{+\infty} C_n \exp(j\omega_{ref}t) \tag{3.30}$$

$$C_n = \frac{1}{t_{ref}} \int_{-.5t_{ref}}^{.5t_{ref}} f(t) \exp(-jn\omega_{ref}t)\,dt \tag{3.31}$$

An important point about this form is that the magnitude of the nth harmonic is $2|C_n|$ [10,629].

Figure 6D:
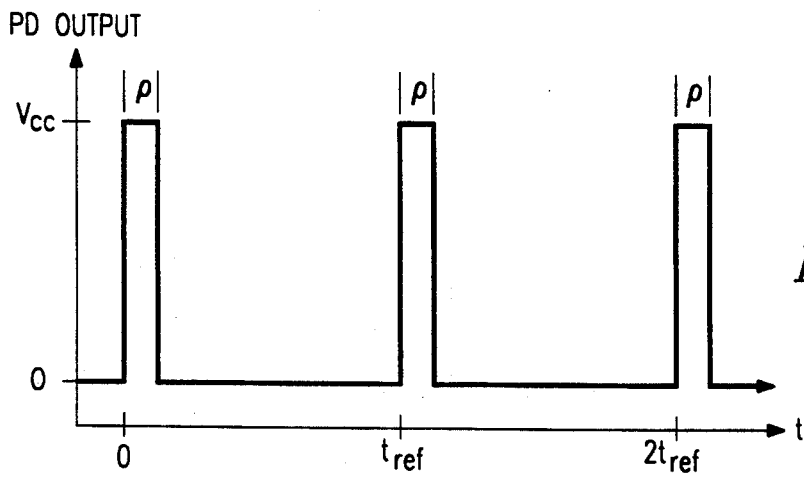
FIG. 6D illustrates a type 4 digital phase detector output.

Applying the above Fourier relations to the pulse train of Fig. 6D gives [10,629]

$$2|C_n| = \frac{2V_{cc}\rho}{t_{ref}} Sa\left(\frac{\pi n \rho}{t_{ref}}\right).$$

(3.32)

In (3.32), $Sa(x) = \frac{Sin(x)}{x}$. This is commonly referred to as the sampling function.

The voltage at frequency $nf_{ref}$ that comes through the loop filter to the VCO input is $$V_m = 2|C_n|\left(|F(jn\omega_{ref})|\right).$$

(3.33)

At this point sufficient information has been developed to allow the sideband to carrier ratio to be calculated as a function of time. To do so, $v_m(t)$ must be specified. Then (3.28) is applied to get the pulse width $\rho$ as a function of time. Eq. (3.32) is used to get the magnitude of the nth component as a function of time. Eq. (3.33) gives the voltage at the nth harmonic that is finally applied in the sideband to carrier equation (3.23).

Since the sideband to carrier ratio becomes a function of time when the PLL is frequency modulated, a practical approach to specifying the sideband to carrier ratio would be to calculate the maximum that occurs in a given situation. Knowing the worst case sideband to carrier ratio for the particular system and modulation condition can be useful. Among the harmonic terms, the fundamental (n = 1) will always be the worst case. The results will who a large degradation over the unmodulated case.

If it is desired to know the sideband to carrier ratio for the unmodulated case, then the open loop gain and offset of the loop filter op amp must be known. A worst case for these would be manufacturer's specifications. The unmodulated sideband to carrier is calculated by starting with the steady state pulse width, then proceeding as above. The steady state $\rho$ can be calculated as below.

$$\frac{\rho(ss)}{t_{ref}} = \frac{V_{os} + \dfrac{U_f(ss)}{A_{OL}}}{V_{cc}} \qquad (3.34)$$

In (3.34), ss refers to the steady state condition of the associated variable, $V_{os}$ is the offset in the loop filter op amp, $A_{OL}$ is the open loop gain of the op amp, and $U_f$ is the voltage required to hold the VCO on the locked frequency. Since a good modern op amp will have very small offset and very large open loop gain, the pulse width in the steady state is very small.

Though the above results are quire useful, extending them to the frequency domain allows greater insight. Eq. (3.29) has already been developed for the pulse width in the frequency domain. Tom complete the transformation a useful approximation will be made. In practice, the ratio of pulse width to period is generally much less than 1. In that case, the limit $$\lim_{x \to 0} \frac{Sin(x)}{x} = 1 \qquad (3.35)$$

may be used to reduce (3.32) to the below approximation.

$$2|C_n| = \frac{2V_{cc}\rho(t)}{t_{ref}}, \quad \left(\frac{\pi n \rho}{t_{ref}} < 1\right) \qquad (3.36)$$

Eq. (3.36) will usually be quite accurate for the first few values of n. For $\dfrac{\pi n \rho}{t_{ref}} <$ .5, its error will be less than 5%.

The following frequency domain expressions are obtained directly from their time domain counterparts. It is important to note that these expressions are approximations that are only valid for modulation frequencies much less than $f_{ref}$. In that case the frequency content of the modulated pulse stream may be approximated as the Fourier series of a steady state pulse stream. An exact analysis would require the Fourier transform.

$$\frac{P(s)}{t_{ref}} = \frac{K_o V_m(s)}{2\pi N s}. \tag{3.29}$$

$$2|C_n(s)| = \frac{2V_{cc} P(s)}{t_{ref}} \tag{3.37}$$

$$V_m(s) = 2|C_n(s)|(|F(jn\omega_{ref})|). \tag{3.38}$$

$$\frac{S_n}{C}(s) = \frac{V_m(s) K_o}{2f_m} \tag{3.39}$$

Combining these four equations yields $$\frac{S_n}{C}(s) = \frac{V_{cc} K_o^2}{N\omega_{ref}} \left|\frac{V_m(s)}{s}\right| |F(jn\omega_{ref})|. \tag{3.40}$$

This last equation shows clearly the effects of modulating frequency and loop variables. A warning is needed here, though. The appearance of $K_o^2$ makes one immediately think that significant improvement in sideband to carrier can be obtained by reduction of $K_o$. This is not the case. If frequency deviation and $\omega_n$ are held constant, then other factors will cancel the improvement of lower $K_o$.

3.7 Chapter Summary

The motivation for the first part of this thesis was filling the void in design information of the FM PLL. The public literature has adequately described the concept of the FM PLL, integrator error correction, and DC FM. It is noticeably lacking in detailed information for loop optimization with the goal of limiting distortion. That information was developed in this and the previous chapter.

It has been shown that the normalized form applies fully to the FM PLL. A useful signal to distortion definition was made, and shown to be obtainable from commonly available normalized graphs. An optimization procedure based upon normalized information was developed. It was shown that the same optimization criteria apply to the integrator error correction method, and that the signal to distortion in that case was a multiple of the simple case. It turned out that the common PLL loop parameter optimization criteria do not necessarily apply.

Practical limitations were investigated in detail. Where possible improvements were implemented, such as matching the VCO to the bypassed integrator. Limits on the modulation to maintain phase lock were developed.

Several fundamental limits of the FM PLL technique were noted. The technique is difficult to adapt to DC FM, and its accuracy when modulated or steered is limited to the accuracy to which oscillator gain can be controlled. It was also shown that if a digital phase detector is used severe degradation of the sideband to carrier ratio results during modulation.

These weaknesses limit the FM PLL in some applications, and they were motivation for the development of the FM $\Delta\Sigma$ frequency locked loop F that his the subject of the remainder of this work.

CHAPTER 4

INTRODUCTION TO THE FREQUENCY LOCKED LOOP FREQUENCY SYNTHESIZER

4.1 Motivation

The preceding work revealed the majority of the strengths and weaknesses of the FM PLL. Limitations such as the frequency accuracy during modulation, the difficulty of attaining DC FM, and sideband degradation during modulation are inherent to the technique. The realization that these problems would always be present to some degree led the author to consider radical changes in the basic synthesis technique. This effort led to the development of the $\Delta\Sigma$ frequency locked loop (FLL) synthesizer.

The FLL will show several key advantages over the PLL method. If frequency is the control variable, then the VCO no longer functions as an integrator. It is simply a gain block with gain $K_v$. This results in much simpler frequency control than the PLL.

This chapter will give the fundamental analysis of the FLL. The analysis is not difficult, but the rarity of the FLL is such that it is not commonly available. It will be assumed that an ideal frequency detector is available. The $\Delta\Sigma$ frequency detector will be described later.

4.2 The Basic Frequency Locked Loop

Figure 7A:
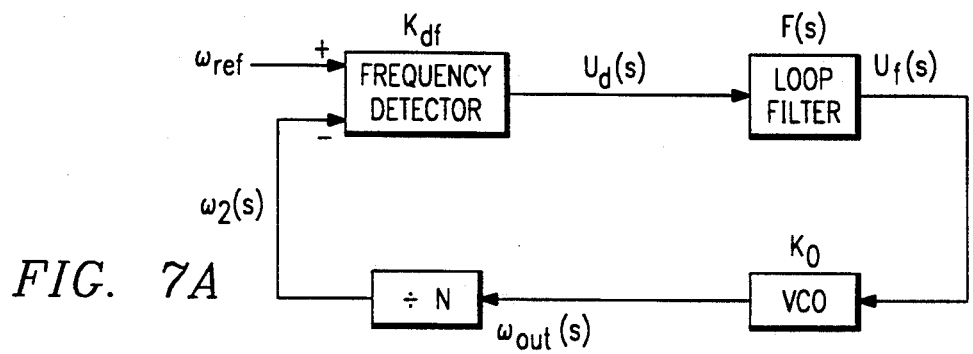
FIG. 7A illustrates a basic frequency locked loop.

The frequency locked loop is similar in concept to the PLL. A basic block diagram is shown in Fig. 7A.

Like the PLL, the system is a negative feedback control system that drives the VCO frequency to be N times the reference frequency. For this to hold exactly, the loop filter must have infinite DC gain. The PLL did not require this condition precisely because phase is the control variable. If the filter required a finite input to have the proper output to steer the VCO to $Nf_{ref}$, then that phase offset could exist with zero frequency error. With frequency as the control variable, infinite gain is required to drive the error to zero.

An advantage of the FLL is that it inherently has 90 degrees less loop phase shift than the PLL. This is due to the VCO being merely a gain block, rather than an integrator. Consequently 90 degrees more phase shift is available for filtering. This allows better suppression of noise in the detector output than in the PLL. In particular, the loop dies not need the zero of the type 3 active filter to maintain stability. The FLL is stable and has 90 degrees of phase margin with a pure integrator loop filter.

The frequency domain behavior is needed, and easily derived. The assumption of linearity will be made. It will be shown later that the ΔΣ frequency detector is extremely linear so long as frequency remains within its encodeable range. The same small signal variable approach as was used for the PLL will be applied here. The prefix Δ will be used to emphasize the small signal condition.

A frequency transfer function analogous to the PLL phase transfer function is defined as below.

$$H_f(s) = \frac{\Delta\omega_2(s)}{\Delta\omega_{ref}(s)} \qquad (4.1)$$

Like the phase transfer function H(s), this function may be used to determine the stability of the system. The frequency transfer function is determined in terms of loop component values by the same around the loop substitution process as was used in the PLL analysis. A few lines of algebra give eq. (4.2) below.

$$H_f(s) = \frac{\dfrac{K_o K_{df} F(s)}{N}}{1 + \dfrac{K_o K_{df} F(s)}{N}} \qquad (4.2)$$

The loop bandwidth will be defined as the small signal frequency where $H_f s$ drops 3 dB below its DC value.

We will assume the loop filter is a pure integrator. Therefore $$F(s) = \frac{K_i}{s}. \qquad (4.3)$$

The ΔΣ frequency detector (FD) to be described later is a digital circuit that has digital noise. The loop filter could be either a digital or analog form. If it is analog, a first order prefilter will normally be used. If it is digital, then a digital to analog converter that has a low pass response is needed to generate the analog voltage needed to steer the VCO. In either case, a first order low pass function must be incorporated into the loop.

For the purpose of developing a standard form, the low pass filter will be considered to be part of the frequency detector block. It will be shown later that the $\Delta\Sigma$ FD also has a pole, but its frequency is so high that it may usually be neglected.

To implement this into the analysis the prefilter function is defined as $$P(s) = \frac{1}{1 + s\tau_p}. \tag{4.4}$$

With $K_{df}$ as the DC detector gain, the frequency detector is then considered to have frequency response $$K_{df}(s) = K_{df}P(s). \tag{4.5}$$

It is important to note in (4.5) that the filtering action is on the variation in carrier frequency, not on the carrier frequency itself.

Substituting (4.5), (4.4), and (4.3) into (4.2) gives $$H_f(s) = \frac{\dfrac{K_o K_{df} K_i}{N\tau_p}}{s^2 + \dfrac{s}{\tau_p} + \dfrac{K_o K_{df} K_i}{N\tau_p}} \tag{4.6}$$

By making the below substitutions, the normalized form may be applied.

$$\omega_n = \sqrt{\frac{K_o K_{df} K_i}{N\tau_p}} \tag{4.7}$$

(4.8)
$$\zeta = \frac{1}{2\omega_n \tau_p}$$

Making these substitutions into (4.6) gives (4.9)
$$H_f(s) = \frac{\omega_n^2}{s^2 + 1\zeta\omega_n s + \omega_n^2}.$$

We shall define the frequency error transfer function to be (4.10)
$$H_{fe}(s) = \frac{\Delta\omega_e(s)}{\Delta\omega_{ref}(s)}$$

(4.11)
$$\Delta\omega_e(s) = \Delta\omega_{ref}(s) - \Delta\omega_2(s).$$

Substitution around the loop yields (4.12)
$$H_{fe}(s) = \frac{1}{1 + \frac{K_o K_{df} F(s)}{N}}.$$

Substituting the explicit forms of F(s) and $K_{df}$ into 4.12) gives (4.13)
$$H_{fe}(s) = \frac{s^2 + \frac{s}{\tau_p}}{s^2 + \frac{s}{\tau_p} + \frac{K_o K_{df} K_i}{N\tau_p}}.$$

Applying the normalized form substitutions given above yields $$H_{fc}(s) = \frac{s^2 + 2\zeta\omega_n s}{s^2 + 2\zeta\omega_n s + \omega_n^2}. \tag{4.14}$$

Applying a step input to (4.14) and using the final value theorem shows that the loop will resettle to zero error in the steady state. Real circuits will have a frequency error proportional to the voltage error in the circuit, such as the op amp voltage offset. Since frequency accuracy is a primary requirement in frequency synthesis, this error will be analyzed fully in a later section.

4.3 Frequency Modulation in the FLL

Frequency Modulation of the FLL may be achieved similarly to the PLL. The modulating signal may be summed into the VCO input, and we might expect that at frequencies inside the loop bandwidth the loop would strongly distort the desired modulation. Signal to distortion can be defined and analyzed similarly to the PLL.

Figure 7B:
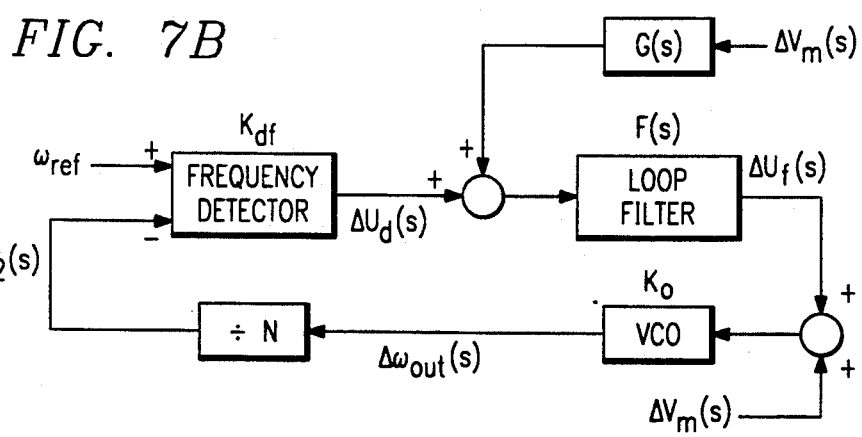
FIG. 7B illustrates an error corrected FM FLL.

To prevent loop distortion a canceling function similar to the error correcting integrator can be employed. Here a key advantage of the FLL is revealed. Because the VCO is merely a gain block in the FLL, the canceling function is also a gain block. Holding the VCO off frequency does not result in a ramp on the detector output that must be reset to prevent railing out. Therefore DC FM may be implemented in the FLL without the need for complicated circuitry. This error correction technique is shown in Fig. 7b.

The intuition developed in the corrected PLL analysis allows the explicit expression for the correcting function G(s) to be written by inspection.

$$G(s) = \frac{K_o K_d}{N} \tag{4.15}$$

The use of this correction function can be expected to yield a large reduction in distortion. Just as in the PLL case, the improvement has a limit set by how precisely the correction function can be matched.

This method of modulation will not be analyzed further. Though it is as usable for the FLL as for the PLL, a better method was discovered.

The improved modulation method will use the frequency lock character of the FLL to force the loop to drive to the desired frequency independently of the error in $K_o$. This will allow the FLL to exhibit better frequency accuracy than the PLL in the modulated or steered state at frequencies inside the loop bandwidth. At frequencies outside the loop bandwidth it will exhibit an accuracy similar to the FM PLL, limited by the precision in $K_o$. This is a primary improvement over the FM PLL.

This superior method is to sum the steering of modulating voltage into the reference level of the loop filter. This modulates the output frequency by changing the steady state voltage of the FD output. Within the loop precision to which voltage can be controlled.

Figure 7C:
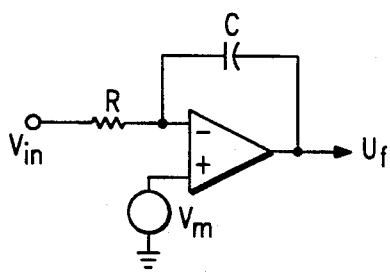
FIG. 7C illustrates a reference modulated integrating loop filter.

An analog loop filter with reference voltage modulation is shown in Fig. 7c.

Assuming the op amp has open loop gain A(s) with infinite input impedance, superposition gives the output as a function of $V_m$ and $V_{in}$ as given below.

(4.16)

$$U_f(s) = \frac{A(s)\left(\left(\frac{s}{K_i} + 1\right)V_m - V_{in}\right)}{\frac{A(s)s}{K_i} + \frac{s}{K_i} + 1}$$

(4.17)

$$K_i = \frac{1}{RC}$$

Eq. (4.16) will be used later in the derivation of the frequency error in the FLL. A simplified expression using the ideal op amp assumption of infinite open loop gain is given below. In this next expression, the polarity of $V_{in}$ is artificially reversed to reflect the common analysis assumption of a noninverting loop filter. This is compensated error by another artificial inversion in the frequency detector. This sometimes confusing analysis practice is used only to remain consistent with the PLL literature.

(4.18)
$$U_f(s) = V_m(s) + \frac{K_t(V_m(s) + V_{in}(s))}{s}$$

The transfer function from $V_m$ to $\omega_{out}$ is of key interest. Since the variable $H_{fm}$ has been reserved for the FM Pll frequency transfer function, the term $HF_{fm}$ will be used. It is read as the frequency locked loop frequency modulation transfer function.

(4.19)
$$HF_{fm}(s) = \frac{\Delta\omega_{out}(s)}{\Delta V_m(s)}$$

Figure 7D:
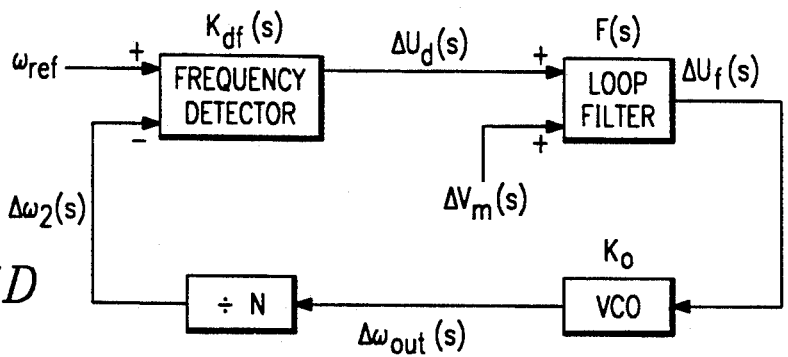
FIG. 7D illustrates a reference modulated FM FLL.

The reference modulated FM FLL is shown in Fig. 7D, with polarities artificially set as is common in PLL analysis.

Substitution around the loop and use of (4.17) gives (4.20)
$$HF_{fm}(s) = \frac{K_o\left(\frac{s}{K_t} + 1\right)}{\frac{s}{K_t} + \frac{K_o K_{df}(s)}{N}}.$$

If (4.21)
$$\frac{K_o K_{df}(s)}{N} = 1,$$

then the ideal gain below is the result.

(4.22)
$$HF_{fm}(s) = \frac{N}{K_{df}(s)}$$

However, there is an important difference between the FLL FM transfer function and the PLL FM transfer function. Note that if frequency approaches zero, then (4.20) reduces to $$HF_{fm}(DC) = \frac{N}{K_{df}}. \qquad (4.23)$$

This result is independent of $K_o$, but equal to the desired $K_o$. This independence from $K_o$ at low frequencies allows this method to steer to a desired frequency with accuracy limited only by the ability to control voltage, and the accuracy of $K_{df}$. The $\Delta\Sigma$ FD to be described in the next chapter provides frequency detection accuracy limited only by a frequency reference. This feature qualifies this method as a legitimate frequency synthesis technique.

Eq. (4.20) may be placed into normalized form by substitution of (4.5), (4.7), and (4.8) into it. It is proportional to the normalized form of $H_{fe}(s)$.

$$HF_{fm}(s) = K_o \left(1 + \frac{K_i}{s}\right) H_{fe}(s) \qquad (4.24)$$

4.4 Frequency Accuracy in the FM FLL

The reason the author believes the FLL has not been previously used for precision synthesis has been the lack of a precise and wideband frequency detector. That roadblock has been eliminated with the invention of the $\Delta\Sigma$ FD, to be described in the next chapter. It is sufficient to state here that the $\Delta\Sigma$ technique is so exact that the error in the loop is really limited only by the accuracy to which voltage can be controlled.

The goal here is to develop expression for the frequency error in the steady state for the two cases of analog and digital loop filters. The digital loop filter has not been proven experimentally for reference modulation, but it seems reasonable to assume it can be developed. If so, then for reasons to be discussed later, the author expects the digital implementation to be the eventual high performance implementation. The advantages of the analog approach are simplicity and an excellent price/performance ratio.

The ΔΣ FD has a single bit digital pulse stream output that is very conveniently digitally filtered. If digital filtering is used then the error in pulse amplitude and loop filter offset are eliminated, but they are replace by error in the digital to analog (DA) converter that must follow the filter to drive the analog tune input to the VCO.

For the digital loop filter case, the voltage error in the output is not primarily quantization error. This is because the DA output will be analog filtered to smooth it, and thus the VCO input voltage may be a value in between the quantization levels if the sampling rate is sufficiently above the smoothing filter cutoff. The dA limit comes from the accuracy of its internal voltage reference, and in error such as op amp offset for its internal circuitry.

The frequency error for the digital loop filter case, excluding FD error, is simply $$\Omega_e = K_o V_e. \tag{4.25}$$

In this equation $V_e$ is the difference between the voltage presented to the VCO input and the average value of the digital words presented to the DA converter.

The analog loop filter case is a little more complicated. The source of frequency error stems from finite op amp gain, nonzero offset, and voltage error in the area under the pulses coming out of the FD from the intended value. The analysis is aided by referring all error to the modulating input of Fig. 7.4. That allows the analysis of the reference modulated FLL to be used for prediction of frequency error.

If the transfer from voltage input to frequency output is derived using the full expression (4.16) for the loop filter function, then the below expressions are obtained.

$$HF_{fm}(s) = \frac{K_o X(s)\left(\frac{s}{K_i} + 1\right)}{1 + K_o K(s) \frac{K_{\phi}(s)}{N}} \tag{4.26}$$

$$X(s) = \frac{A(s)}{\frac{A(s)s}{K_i} + 1} \tag{4.27}$$

Now let all the voltage error be referred to the $V_m$ input, and call this error $V_e$. This error is the sum of offset and frequency detector pulse amplitude error. Letting the error be zero in the quiescent state and applying a step of amplitude $V_e$ allows the final error in $\omega_{out}$ to be determined by use of the final value theorem. The final value theorem is given by $$\lim_{t \to \infty} f(t) = \lim_{s \to \infty} [sF(s)]. \qquad (4.28)$$

Carrying out this exercise yields $$\Delta \omega_e = \frac{V_e}{\dfrac{K_{df}}{N} + \dfrac{1}{A_{OL}K_o}} \qquad (4.29)$$

This expression shows that the error due to finite op amp open loop gain is completely negligible. The total error must also include the frequency offset required to support the VCO input voltage at the lock frequency. This is exactly comparable to the very small pulse width required in the PLL to support the locked condition. If the voltage required by the VCO to hold the lock frequency is $U_f$ (ss) (ss = steady state), then the total frequency error is given by $$\omega_e = \left( \frac{U_f(ss)}{A_{OL}} + V_e \right) \frac{N}{K_{df}}. \qquad (4.30)$$

In (4.30) the sum of voltage errors $V_e$ is given the sign that corresponds to referring that error to the modulation input. Also, unless the op amp has unusually low gain or high offset, the term containing $A_{OL}$ can be neglected.

It is appropriate to include a numerical example here of the degradation in frequency accuracy as compared to a PLL. State of the art op amps are capable of offsets as low as 10 $\mu$V, with temperature drifts as low as 0.1 $\mu$V/°C [9]. The offset may be nulled at room temperature, and assumption of a 70 degree temperature range gives a specified maximum of 7 $\mu V$. The FD will be shown to be perfect within the limits of the reference, but when analog filtering is used the area of the pulses in its output cannot be exact. If a precision pulse shaping circuit is used, then the error introduced by that source may be assumed to be similar to the op amp offset error. During steering the input voltage also has some error. Assuming it is about the same, the total error is approximately 20 $\mu V$.

Let the case of interest be a VHF synthesizer with $K_o$ of 1 MHz per volt, and N = 1. Then the matched condition of (4.21) means $K_{df}$ of 1V per MHz would be used. Applying these parameters to (4.30) gives a worst case frequency error degradation over phase lock of about 20 Hz.

This level of frequency accuracy represents about the best the analog technique can deliver in the VHF range. It is sufficient for many applications, but does not match the quiescent PLL. However, it is far superior to the FM PLL due to the accuracy of the error corrected PLL tracking with $K_o$. The precision of a tunable wideband rf oscillator cannot compare with the precision of high quality baseband circuitry using operational amplifiers.

4.5 The Modulation Error Ratio in the Reference Modulated FM FLL

The reference modulated FLL does not allow the signal to distortion ratio to be defined quite as simply as the error corrected PLL or FLL systems. This follows from the lack of a node where the signal may be defined purely as distortion. Thus a different distortion definition shall be made, one based on the difference between the desired and actual deviation frequency. The new measure of distortion for the reference modulated FLL shall be called the modulation error ratio (MER).

This definition is useful in design, and perhaps more appropriate for a synthesizer. The PLL signal to distortion ration took into account only the distortion imposed by the loop, or the variation from free running VCO behavior. Frequency precision was not the issue. The modulation error ratio defined and investigated in this section will provide information on both loop distortion effects and frequency accuracy. The modulation error ratio is defined below.

(4.31)

$$MER = \left| \frac{\text{Ideal Freq. Deviation}}{|\text{Ideal Freq. Deviation}| - |\text{Actual Freq. Deviation}|} \right|$$

The ideal deviation is given by (4.23) in the matched condition of $K_o K_{df} = N$.

$$HF_{fm}(s) \text{ (ideal)} = \frac{N}{K_{df}(DC)} \qquad (4.23)$$

The actual gain is given by (4.20) and by 4.24).

$$HF_{fm}(s) = \frac{K_o \left( \frac{s}{K_i} + 1 \right)}{\frac{s}{K_i} + \frac{K_o K_{df}(s)}{N}}. \qquad (4.20)$$

$$HF_{fm}(s) = K_o \left( 1 + \frac{K_i}{s} \right) H_{fc}(s) \qquad (4.24)$$

The MER provides a measure of distortion that is numerically similar to the signal to distortion ratio of the FM PLL within the loop bandwidth. Unfortunately, it is not as simple to calculate and use in loop optimization.

A simpler approach, though not directly comparable to the signal to distortion ratio, is to define a ratio between the actual and ideal modulation as a figure of merit for use in design. The following definition is made for the simple error ratio (SER).

$$SER(S) = \left| \frac{\text{Actual Freq. Deviation}}{\text{Ideal Freq. Deviation}} \right|$$

Substituting (4.23) and (4.24) into the above yields $$SER(s) = \left| \frac{K_{df}(DC) K_o}{N} \left( 1 + \frac{K_i}{s} \right) H_{fc}(s) \right|. \qquad (4.31)$$

The behavior of the simple error ratio is easier to visualize than the MER. It is also easier to develop directly from published graphs of second order system behavior.

4.6 Practical Approximations in FLL Design

The use of simplifying approximations often allows a much greater understanding. A few assumptions and approximations will be made in this section for the purpose of developing better intuition and to aid in the design process.

The simplifications begin with the assumption of the ideal match condition of (4.21), repeated below.

$$\frac{K_o K_d(s)}{N} = 1, \qquad (4.21)$$

Next the prefilter function P(s) is assumed to have its cutoff frequency considerably greater than the unity gain bandwidth $K_i$ of the loop filter integrator. These two assumptions together mean that the loop bandwidth is given directly by the unity gain bandwidth of the integrating loop filter. Applying these conditions to the frequency transfer function (4.2) results in $$H_f(s) = \frac{K_i P(s)}{s + K_i}. \qquad (4.32)$$

This useful approximation is a simple low pass of DC magnitude one, with a pole at $K_i$ and a higher pole at the pole of P(s).

The same assumptions applied to the frequency error transfer function (4.12) result in $$H_{fe}(s) = \frac{s}{s + K_i}. \qquad (4.33)$$

This result is very useful in visualizing the modulation error ratio and simple error ratio functions of the previous section.

The normalized form is greatly simplified under these conditions. Applying them to the definitions of $\omega_n$ (4.7) and $\zeta$ (4.8) gives the below approximations.

$$\omega_n = \sqrt{\frac{K_i}{\tau_p}} \tag{4.34}$$

$$\zeta = .5\sqrt{\frac{1}{K_i \tau_p}} \tag{4.35}$$

The given conditions result in $K_i \tau_p \ll 1$, so $\zeta > 1$. The system is overdamped, and behaves like a simple first order system below the pole of the prefilter.

One last result is needed. Substitution of (4.33) into (4.24) gives $$HF_{fm}(s) = K_o.$$

This result [is exp]ected for the matched condition of (4.21). However, that matched condition [should] only hold for frequencies below the pole of P(s). The above exercise shows the d[esire]d behavior (no loop imposed distortion) to hold above the pole as well.

This is an interesting and important result. For frequencies well below the loop bandwidth, the loop will impose $HF_{fm} = \frac{N}{K_{df}}$. At low modulation rates this high accuracy qualifies the system as a synthesizer. For frequencies well above the loop bandwidth $HF_{fm} = K_o$, without loop distortion. Therefore the distortion improves at low frequencies and high frequencies above that imposed by approximately satisfying (4.21). The MER and SER functions will show their worst measure of distortion at frequencies around the loop bandwidth.

4.7 Chapter Summary

This chapter demonstrated that a number of advantages can result from the sue of frequency lock frequency synthesis. Among these are 1. Simple DC FM realizability
2. Smooth frequency tuning and modulation with accuracy limited only by voltage accuracy
3. Greater inherent phase margin than the PLL, and thus more loop filtering allowed The system acts like a near perfect voltage controlled oscillator whose slope and intercept are exactly known and perfectly linear.

The only negative feature uncovered was a degradation in frequency accuracy over the near perfection of the PLL. This extra error over reference frequency error is proportional to the error in the baseband voltages. Using precision operational amplifiers, this error can be quite small.

Given these results, it seems surprising that the frequency lock method has seen such limited use. The term frequency lock does not even appear in the indices of most references.

The author's opinion is that the FLL has not been previously used for the frequency synthesis application because there has never existed a simple, highly accurate, perfectly linear, low noise, and wide bandwidth frequency detector. This deficiency has now been corrected, and is the subject of the next chapter.

CHAPTER 5
THE $\Delta\Sigma$ DIGITAL PHASE LOCKED LOOP FREQUENCY DETECTOR
5.1 Introduction This chapter introduces the concept and analysis of a new frequency detection technique. This method encodes input frequency into digital format known as delta sigma ($\Delta\Sigma$) modulation. $\Delta\Sigma$ modulation was first reported by Inose and Yasuda in 1962 [11].

It is an extremely accurate method, capable of accuracy limited only by a reference frequency. It has wide bandwidth, low noise, and is implemented in physically simple circuitry that interfaces elegantly into the frequency locked loop.

The analysis to be presented is the original work of the author, and is the first developed for the $\Delta\Sigma$ FD. The $\Delta\Sigma$ frequency detector was invented, proven in hardware, and patented [10] by employees of Timeback Systems, of Dallas, Texas.

5.2 ΔΣ Modulation

ΔΣ modulation might be more sensibly called pulse density modulation. The encoded value can be described as the average value of a high speed serial bit stream, or the density of the bit stream. It might also be described as standard pulse code modulation (PCM), except that it has only 1 bit per word and is drastically oversampled.

ΔΣ modulation is capable of surprisingly high performance. This comes from the oversampled nature of the method. Instead of obtaining precision by wide word width at low sampling rates, it is obtained by narrow word width and high sampling rates [12].

The high sampling rate of ΔΣ modulation greatly eases the prefiltering task required to prevent aliasing. It also allows a crude comparator to be used in the circuit. This make ΔΣ modulation an excellent candidate for integrated high performance analog to digital conversion. ΔΣ modulation is currently the subject of intense industrial and academic research [12]. The advances made in voltage ΔΣ modulation will greatly reduce the amount of work needed to perfect its use in frequency synthesis.

To understand the basic circuit techniques used to implement ΔΣ modulation it is convenient to start with its immediate ancestor, delta (Δ) modulation. Δ modulation is a one bit oversampled PCM encoding technique where the pulse density gives the time derivative, not the amplitude, of the encoded quality.

Δ modulation has several limits that follow from its basic character. Because it gives the derivative of a quantity, it cannot encode DC. It also has an obvious slew rate limit. Each bit is assigned to represent a certain voltage change, and the bits occur at some rate $f_{ref}$. Hence the slew rate limit is $$\text{Max Slope} = \frac{\Delta V}{t_{ref}}. \tag{5.1}$$

Figure 8A:
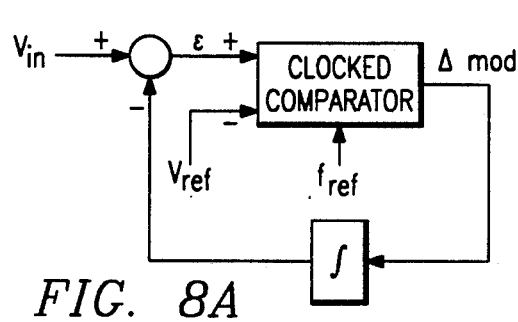
FIG. 8A illustrates a conceptual $\Delta$ modulation encoder.

A conceptual Δ modulator is shown in Fig. 8A.

The Δ modulation encoder is a quantized negative feedback system. The feedback forces the error value $\varepsilon$ to track within one integrated bit of the reference voltage. Thus the output of feedback integrator is forced to track the difference of the input voltage and the reference, again within the possible error of one integrated bit. Therefore the input of the integrator, the output bit stream, must have an average value that tracks the derivative of the difference between the input voltage and the reference. To recover the modulating signal the bit stream is integrated.

Exact analysis of the Δ modulator is not an easy task. The system is slew rate limited, and therefore nonlinear. Furthermore, it is a discrete domain system with large quantization noise per word.

An approximate low frequency s domain expression for the transfer function of the Δ modulator may be written by inspection of Fig. 7A. For moderate amplitude signals of low frequency the slew rate limit may be neglected, and the comparator modeled as an ideal operational amplifier. The term $B_d(s)$ will be adopted to mean the encoded density in the bit stream, with the understanding it is only valid for frequency much less than the Nyquist rate. This is carried out below.

(5.2)

$$V_{in}(s) - \frac{B_d(s)}{s} = V_{ref}(s)$$

$$B_d(s) = s(V_{in}(s) - V_{ref}(s))$$

This is the expected behavior. Normally $V_{ref}$ would be zero. It is included here only for the purposes of making an analogy when the ΔΣ FD is analyzed shortly.

No further quantitative analysis will be performed here for the Δ modulator. The interested reader is referred to [7,140], and the other extensive literature.

The modulator can be developed directly from the Δ modulator. All that is required is to integrate the input signal prior to applying it to the input. Then the differentiating character of the Δ modulator recreates the original signal. The pulse density of the output bit stream now represents the instantaneous amplitude of the input signal. The system has no problem in encoding DC. To recover the signal the bit stream is low pass filtered with a flat filter whose cutoff is below the Nyquist rate of $0.5f_{ref}$.

A circuit simplification of this method is possible. Because of the linear operations involved, the two integrators can be combined into one following the summing node. This is shown in Fig. 8.2.

Again an approximate frequency domain expression is easily obtained.

(5.3)

$$\frac{1}{s}\left(V_{in}(s) - B_d(s)\right) = V_{ref}$$

$$B_d(s) = V_{in}(s) - sV_{ref}(s)$$

This expression shows the expected character. In the time domain, the reference value does not make itself felt if it is constant.

$\Delta\Sigma$ modulation also has certain limitations. The $\Delta$ modulator had a slope limit, so the $\Delta\Sigma$ modulator must have an amplitude limit. If the output bits have value zero or $V_{cc}$, then the system is capable of encoding signals only in the range of zero to $V_{cc}$.

The basic $\Delta\Sigma$ modulator shown above is referred to as a first order $\Delta\Sigma$ modulator. This is from the single pole character of the feedback. The noise performance of the system can be significantly improved by increasing the order. A second order $\Delta\Sigma$ modulator results if a feedback network of the below function is substituted for the integrator [13,361].

(5.4)
$$I(s) = \frac{g(s+a)}{s(s+b)}$$

It may be shown [13,363] that the noise in a band from DC to a cutoff $f_c$ drops 9 dB for each doubling of the sample rate for first order $\Delta\Sigma$, and 15 dB for second order. However, the second order case has more total noise power. The improvement comes from shifting noise within the band of interest to frequencies above $f_c$, where it may then be removed by suitable filtering.

A useful expression for signal to noise ratio for the first order case is given below [11,206]. M is the ratio of the signal amplitude to the maximum that does not overload the system.

(5.5)
$$\frac{S}{N} = \frac{M3}{4\pi}\left(\frac{f_{ref}}{f_c}\right)^{\frac{3}{2}}$$

The above discussion barely scratches the surface of $\Delta\Sigma$ modulation. though simple in concept, analysis of the method is difficult. A great deal of research has been done in the subject, and work continues at a rapid pace. This work contains the first application of $\Delta\Sigma$ to frequency synthesis, and is conclusive enough to predict commercial application. The ongoing research in $\Delta\Sigma$ will reduce greatly the magnitude of the work to be done in bringing the technique to market.

5.3 The Basic $\Delta\Sigma$ Frequency Detector

The $\Delta\Sigma$ digital phase locked loop frequency detector to be described is the key technical advance that allows development of a frequency locked loop frequency synthesizer. The $\Delta\Sigma$ FD was originally invented by Robert Nelson and Onkar Modgil, of Timeback Systems, Inc. A patent was applied for in January of 1987, and U.S. patent number 4,758,821 was granted in July, 1988.

The original invention was not perceived as a phase locked loop. It was envisioned as an extension of normal $\Delta\Sigma$ modulation with the variable of time substituted for voltage. This view did not lend itself to convenient analysis. The PLL model used here does allow a correct approximate analysis.

The original invention was created with the specific goal of creating a new and better way to encode physical variables, such as acceleration, that could be converted to frequency. The fallacy of the concept was the inevitable error and distortion introduced by conversion into frequency. Such error completely masks the outstanding performance available from the encoder itself. This limitation has so far prevented the $\Delta\Sigma$ FD from being implemented in any commercial sensing equipment. It was not previously considered that the $\Delta\Sigma$ FD had any application in frequency synthesis. The author believes that to be the major application for it, though it is very possible it could find extended use in other precision frequency demodulation or detection applications.

The $\Delta\Sigma$ FD will be shown to be a form of digital PLL, and an approximate low frequency model will be developed. Digital PLLs are certainly not a new concept, but the method of implementation that gives a low noise $\Delta\Sigma$ output does appear new.

This section will give a qualitative introduction to the $\Delta\Sigma$ FD. Analysis will be performed in the following section. A conceptual model of the $\Delta\Sigma$ FD is shown in Fig.

The circuit contains only a D flip flop and a special counter. The counter divides $f_{in}$ by either M or (M+ ΔM), depending on whether the skip count input is low or high, respectively. The frequency to be encoded clocks the counter and the reference clocks the flip flop. Operation may be understood as follows.

The circuit is a feedback system that works to keep the edges of the reference and output lined up. The input frequency is restricted to be in the range.

(5.6)

$$MF_{ref} \le f_{in} \le (M + \Delta M)f_{ref}.$$

In the above relation, M is the normal divide by factor of the counter, and ΔM < M. Usually ΔM = 1, though it could be larger.

Let the input frequency be fixed in this range, and let the leading edge of $f_{out}$ arrive just before the reference leading edge. Then upon the arrival of the reference edge the flip flop output becomes a one. The counter circuit is designed so that it then delays counting for ΔM cycles of $f_{in}$. This delay gives the reference edge time to catch up and arrive before the next $f_{out}$ edge. The next bit then is a low bit, and the counter is not slowed down. This process continues until the leading edge of $f_{out}$ passes that of $f_{ref}$, when another one is issued in the flip flop output bit stream. This sequence is then repeated.

The following argument should convince the reader that the encoder has a ΔΣ output and is a form of PLL. Assume that the edges of $f_{out}$ and $f_{ref}$ are almost exactly matched, but with the $f_{out}$ edge infinitesimally ahead. When the flip flop is clocked it outputs a one that inserts ΔM extra counts of $f_{in}$ into the counter. The $f_{out}$ edge now trails the $f_{ref}$ edge by ΔM/$f_{in}$ seconds. To find the bit density we need to know how long it takes the $f_{out}$ edge to catch back up to the reference edge.

The normal condition of operation is for the counter to divide by M. When ΔM counts are added, excess phase is inserted into the counter output. The amount is given by $$\text{Inserted phase} = \frac{2\pi \Delta M}{M} \text{ (rad/bit)}$$

The rate of closure between the output and reference edges is $$\text{Closure rate} = \frac{\omega_{in}}{M} = \omega_{ref}$$

$$= \frac{\omega_{in} - M\omega_{ref}}{M} \quad \text{(rad/sec)}$$

Therefore the time to close is $$\text{Closure time} = \left(\frac{M}{\omega_{in} - M\omega_{ref}}\right) \text{(sec/rad)} \left(\frac{2\pi \Delta M}{M}\right) \text{(rad)}$$

$$= \frac{\Delta M}{f_{in} - Mf_{ref}} \quad \text{(sec)}.$$

This closure time gives the average time it takes the system to generate a new one bit in the output bit stream to maintain edge tracking with input frequency $f_{in}$. The highest possible rate of one bits is $f_{ref}$. Therefore the density of the bit stream is given by (5.7)

$$B_d = \frac{f_{in} - Mf_{ref}}{\Delta M} \text{ (bits/sec)} + f_{ref}\text{(bits/sec)}$$

$$B_d = \frac{f_{in} - Mf_{ref}}{\Delta M f_{ref}}$$

Eq. (5.7) provides the proof of $\Delta\Sigma$ modulation. If $f_{in}$ is $Mf_{ref}$, then $B_d$ is zero. If $f_{in}$ is between $Mf_{ref}$ and $(M+\Delta M)f_{ref}$, then $B_d$ scales linearly between zero and one. This behavior for pulse density is, by definition, $\Delta\Sigma$ modulation.

The $\Delta\Sigma$ FD converts frequency between two end points to a pulse density format, whereas the standard $\Delta\Sigma$ modulator converts voltage to pulse density. A direct comparison may be made between the components of the two systems of figures and The D flip flop is the system comparator. It makes a comparison in phase rather than voltage. The counter functions as an integrator in the feedback via its averaging action, and the two counter inputs function as the summing node. The clock $f_{ref}$ is analogous to $V_{ref}$.

5.4 A First Order Phase Lock Model of the $\Delta\Sigma$ FD

The previous intuitive description of the $\Delta\Sigma$ FD shows that the most modeling approach to take would be phase lock. The analysis presented in this section has resulted in the first closed form description of the $\Delta\Sigma$ FD, and paves the way for future advanced optimization of the technique.

The goal is development of an approximate low frequency transfer function from input frequency to output bit density. Though the $\Delta\Sigma$ FD is a discrete data system, an s domain approximation will be developed here. The function should approach exactness as frequency variation approaches zero, and limitations on its validity must be determined.

As in the PLL analysis, our interest is in small signal variables in a locked condition. The first requirement is to determine the transfer functions of the components that make up the loop of Fig. 8C.

The integrating action of the counter is directly comparable to the integrating action of the VCO in a PLL. Therefore the counter shall be mentally perceived as a form of oscillator in the model. Upon first consideration, there appears to be a key difference in the behavior of this "oscillator" as compared to a VCO. The loop implements phase tracking via direct injection of correcting phase into the counter. The standard PLL implements phase tracking by steering the frequency of the VCO. However, the bit density in the $\Delta\Sigma$ digital PLL really describes the rate of phase injection, which from the derivative relation between phase and frequency means the bit density describes the required frequency steering to maintain the lock. Therefore the analogy to the VCO is a good one, though complicated by the fact that the counter output frequency is a function of two variables.

These two variables are the input $\Delta\Sigma$ bit stream and the input frequency. To model these, a new form of "oscillator" will be defined here. The term frequency and phase controlled oscillator (FPCO) is defined to mean an oscillator whose output frequency is a function of an input frequency and a separate input phase injection.

A mathematical model is developed as follows. If the $\Delta\Sigma$ bit stream is all low, then the counter simply divides the input frequency by an integer M. Thus a gain of 1/M is assigned to the transfer from input frequency to output frequency. The counter increases the divide ratio to 1/(M+ΔM) over each reference period where the ΔΣ output is high. This is the same as insertion of a phase delay of $2\pi\Delta M/M$ into the counter output, relative to the reference phase. This phase delay is inserted in step wise fashion in accordance with the sequence of lows and highs in the bit stream input to the skip count control.

Let B(n) be the sequence at the skip count input, with each term in the sequence being either zero or one. An expression giving output phase change from time zero to t as a function of input frequency and the bit stream sequence may not be written.

$$\Delta\Theta_{out}(t) = \int_o^t \frac{\Delta\omega_{in}(t)}{M} dt - \frac{2\pi\Delta M}{M} \sum_{n=1}^{K} B(n) \quad (5.8)$$

This expression is valid for times t much larger than the clocking times of the bit stream, or times much greater than $1/f_{ref}$. K is the number of bits that occur in the time interval t.

For use in the development of transfer functions, (5.8) needs to be a pure frequency domain expression. For the assumption of time periods much greater than $1/f_{ref}$, and thus frequencies much less than $f_{ref}$, the summation operation may be replaced with an integration operation, as below.

$$\sum_{n=1}^{K} B(n) = \frac{1}{t_{ref}} \int_o^t B_d(t)dt, \quad K = \frac{t}{t_{ref}} = tf_{ref} \quad (5.9)$$

In (5.9), the term $B_d$ is the bit density. The bit density is obtained from the digital waveform of B by low pass filtering. The substitution of $B_d$ for B does not effect the value of the integral so long as the frequencies of interest are within the low pass bandwidth.

Now (5.9) is substituted into (5.8) to yield $$\Delta\Omega_{out}(t) = \int_o^t \frac{\Delta\omega_{in}(t)}{M} dt - \frac{2\pi\Delta Mf_{ref}}{M \int_o^t B_d(t)dt} \quad (5.10)$$

The Laplace transform of (5.10) is the desired model for the counter.

$$\Delta\Omega_{out}(s) = \frac{\Delta\Omega_{in}(s)}{Ms} - \frac{2\pi\Delta M f_{ref}}{M}\frac{\Delta B_d(s)}{s} \quad (5.11)$$

Now an explicit expression is needed for the phase detector gain $K_d$ of the D flip flop. This is a difficult conceptual hurdle to cross, as the PD is really a phase comparator that outputs either low or high bits depending on whether the output phase is lagging or leading the reference phase. The question of phase detector gain will be delayed temporarily to develop the full model.

Figure 8B:
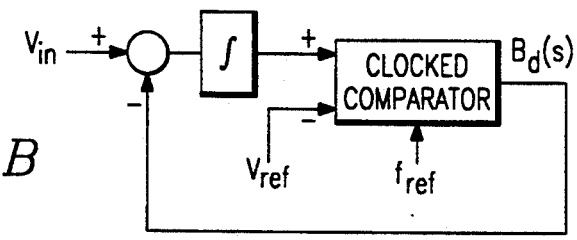
FIG. 8B illustrates a conceptual $\Delta\Sigma$ modulation encoder.
Figure 8C:
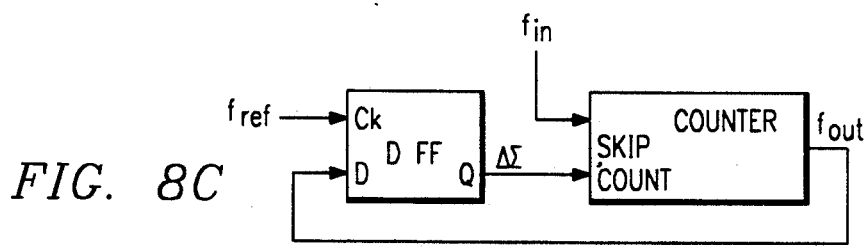
FIG. 8C illustrates a conceptual $\Delta\Sigma$ frequency detector.
Figure 8D:
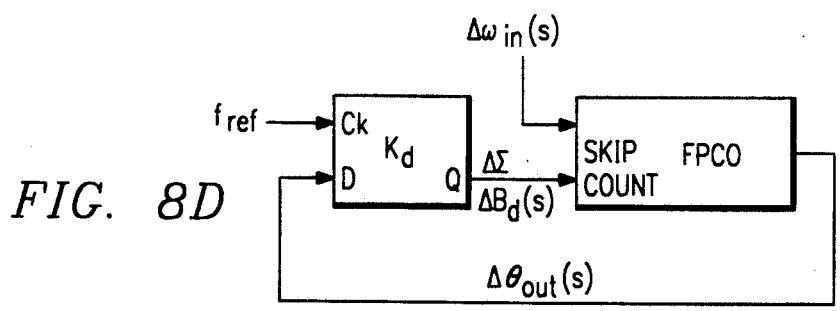
FIG. 8D illustrates a $\Delta\Sigma$ digital PLL FD model with small signal definitions.
Figure 8E:
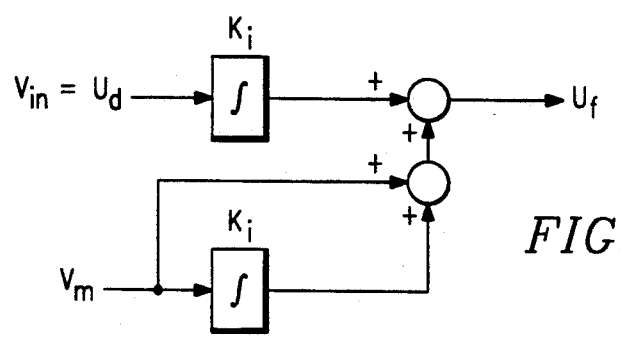
FIG. 8E illustrates a digital filter implementation of the reference modulated integrating loop filter.

The $\Delta\Sigma$ digital PLL FD with small signal values is shown in Fig. 8D.

The transfer from input frequency to bit density is obtained by simple substitution around the loop and use of (5.11). The result is $$\frac{\Delta B_d(s)}{\Delta\omega_{in}(s)} = \frac{K_d}{Ms + K_d 2\pi\Delta M f_{ref}}. \quad (5.12)$$

If the phase detector gain is modeled as approaching infinity, then the transfer function reduces to the same form as the intuitively developed eq. (5.7).

$$\frac{\Delta B_d(s)}{\Delta\omega_{in}(s)} = \frac{1}{2\pi\Delta M f_{ref}}, \quad K_d \to \infty \quad (5.13)$$

The preceding two equations are useful and confirm the validity of the modeling approach, but more information is needed. For incorporation into the FLL synthesizer we must know, at least approximately, the bandwidth and phase shift of the $\Delta\Sigma$ FD. For this, a good approximation of the actual value of $K_d$ is needed.

The answer lies in recognizing that the value of $K_d$ need only apply in the locked state. This is similar to the situation for the type 4 digital phase detector that has been previously discussed. It has markedly different character in the locked and unlocked states, but for small signal analysis of the PLL only the locked state behavior is significant. The same assumption may be used here for the D flip flop phase detector.

The phase detector flip flop is nonlinear for two reasons. First, it is digital component whose output is of course quantized. However, this quantization may be neglected for control systems analysis at lower frequencies. The variable of interest is the bit density, and enough samples occur in the frequency range of interest so that the quantization noise of a single sample is negligible. This allows the analysis to predict the approximate magnitude and phase shift that are needed to explain basic behavior and stability.

The second reason for the nonlinearity is the limited output value. The PD can produce a maximum of one bit per sample time no matter how much phase is input to it. However, in the locked state the phase error is limited to a maximum of $2\pi\Delta M/M$. The dynamic range limit of the PD is never exceeded. In this condition, the PD outputs an average of one bit per $2\pi\Delta M/M$ radians of error. Therefore the D flip flop phase detector gain is defined as below.

(5.14)
$$K_d = \frac{M}{2\pi\Delta M} \text{(bits per rad)}$$

Substitution of (5.14) into (5.12) gives the key result (5.15)
$$\frac{\Delta B_d(s)}{\Delta \omega_{in}(s)} = \frac{1}{2\pi\Delta M(s + f_{ref})}.$$

This simple equation related clearly the very high performance of the $\Delta\Sigma$ FD. Note that the transfer function contains no terms with significant variation. The reference frequency will be generated with a high quality crystal oscillator. $\Delta M$ is an exact number, and has no variations.

The 3 dB bandwidth is at $f_{ref}$ (rad/sec), or $f_{ref}/2\pi$ Hz. Because this a highly over sampled encoding method, $f_{ref}$ is a high rate. In the FLL application, $f_{ref}$ is typically from 1/128 to 1/5 of the carrier frequency, and so is even larger than might be expected. The bandwidth exceeds that required for the FLL application.

To the author's knowledge, there is no other frequency detection scheme like this in existence. An analog PLL or frequency discriminator have errors proportional to the errors of rather poorly controlled analog components. This error renders them useless for the purpose of frequency detection in a precision FLL synthesizer. Precision could be obtained by counting against a crystal reference, but the circuitry is much more complicated and the resulting bandwidth much less than the $\Delta\Sigma$ FD. Other digital PLL schemes are feasible, but do not posses the extremely low noise output of the $\Delta\Sigma$ FD. They usually also require higher frequency clocks that the input frequency, which would be very inconvenient. The $\Delta\Sigma$ FLL synthesizer to be shown later uses the carrier frequency as the highest frequency in the system. It also directly translates frequency down by a factor between 1/M and 1/(M+1), and so can often eliminate the need for a divider in the loop.

It is reasonable to ask if the conditions imposed in the analysis result in any lower limit on the encoding bandwidth than the 16% of $f_{ref}$ predicted by (5.15). The Nyquist rate imposes 50% of $f_{ref}$, so is not an issue.

The result of experimental measure of the frequency response of the $\Delta\Sigma$ FD fill be shown later. It was found, within experimental error, that (5.15) accurately predicted the actual performance out to 5% of $f_{ref}$. Equipment limitations prevented checking to higher frequency. Equipment limitations prevented checking to higher frequency.

Prior to the submission of that evidence, the following argument is offered. According to Best (2,60), a PLL is capable of stable performance of r a signal to noise ratio on its input (reference frequency of 4 or greater. The $\Delta\Sigma$ digital PLL uses a crystal reference with very high signal to noise, but the quantization noise in the $\Delta\Sigma$ bit stream could be legitimately modeled as coming through the PD from the reference. This allows the signal to noise criteria of Best to be applied. The $\Delta\Sigma$ FD should follow the predicted performance of the frequency range where the signal to noise is greater than 4. For the convenience of the reader, eq. (5.5) giving the signal to noise of the first order $\Delta\Sigma$ modulator is repeated below.

$$\frac{S}{N} = \frac{M3}{4\pi} \left( \frac{f_{ref}}{f_c} \right)^{\frac{3}{2}} \tag{5.5}$$

This equation is rearranged as follows to obtain the fraction of $f_{ref}$ that corresponds to a given signal to noise.

$$\frac{f_c}{f_{ref}} = \left( \frac{4\pi}{3M} \frac{S}{N} \right)^{-\frac{2}{3}} \quad (5.16)$$

For signal to noise of 4 and M=1 (for noise relative to maximum encodeable), eq. (5.16) give $f_c$ = .15 $f_{ref}$. This is almost exactly equal to the 3 dB bandwidth of the system, and supports the accuracy of (5.15) out to that frequency. Somewhere around that frequency, the behavior of the $\Delta\Sigma$ FD will probably depart from the expected. A reasonable design practice might be to expect the $\Delta\Sigma$ FD to function as expected out to perhaps 10% of $f_{ref}$. In the frequency synthesis application, limiting loop bandwidth to less than 10% of $f_{ref}$ eliminates any potential problem. This would not normally be a restrictive requirement.

5.5 Radio Frequency Circuit Implementation of the $\Delta\Sigma$ FD

The $\Delta\Sigma$ FD may be very easily implemented at radio frequency by the use of a commonly available component know as a dual modulus prescaler. This component is used in high frequency PLL synthesizer design. It aids in the development of a large number of different divide ratios, so that fine frequency steps may be created.

The dual modulus prescaler directly implements the special counter (FPCO) that is needed in the $\Delta\Sigma$ FD. It divides by a number M or by M+1, depending on the digital value of a control input. this is the $\Delta M = 1$ case.

Common values of M in the dual modulus prescaler are 5, 8, 10, 20, 32, 40, 64, and 128. This allows a great deal of flexibility with off the shelf components.

The dual modulus prescaler is an emitter coupled logic (ECL) component. Parts are commonly available that can accept input frequencies into the microwave spectrum. This means the upper frequency synthesis capability of the $\Delta\Sigma$ FLL synthesizer is equivalent to that of the PLL synthesizer.

To complete the first order $\Delta\Sigma$ at radio frequency it is only necessary to add an ECL D flip flop. Because ECL does not provide an output pulse of an exact and repeatable amplitude, if this detector is incorporated into an FLL synthesizer with analog filtering then a pulse shaping circuit must be added to condition the output.

The ideal pulse shaping circuit would accept the ECTL output of the flip flop and generate output pulses with exactly the same area under each pulse. As discussed in chapter 4, if this can be done then the $\Delta\Sigma$ FLL synthesizer can synthesize frequency with accuracy limited only by the ability to control the input control voltage and the offset of the loop filter operational amplifier.

5.6 The Use of Digital Filtering in the $\Delta\Sigma$ FLL Synthesizer $\Delta\Sigma$ modulation is very conveniently digitally filtered. The single bit word means that adders and shifters are all that are used. Multipliers are not necessary.

The use of digital loop filtering in the $\Delta\Sigma$ FLL synthesizer eliminates all voltage error except that in the DA converter that must follow the digital filter to drive the VCO. This allows high precision frequency at high radio frequencies. At some point, the pulse shaping circuit that conditions the $\Delta\Sigma$ output will probably limit the frequency accuracy of analog loop filter FLL. The digital loop filter solves the problem.

With $\Delta\Sigma$ now entering the marketplace, digital filter hardware is already available for some applications. It makes no difference whether the input of the $\Delta\Sigma$ encoder was voltage or frequency. The majority of this hardware is designed to approximate a brick wall low pass filter. This is ideal for recovery of signals, and could be used to filter a $\Delta\Sigma$ FD output that was being used for FM frequency detection. However, a control application that must drive error to zero, such as the FLL<, requires a filter with infinite DC gain. The author does not know of any other control application of $\Delta\Sigma$ for which integrating filters are being developed.

Fortunately, the integration function is one of the easiest digital filter functions to implement, and particularly so for the $\Delta\Sigma$ format. It can implemented with something as simple as a counter. To use a counter as an integrating filter, the $\Delta\Sigma$ bit stream controls the up/down count function of the counter, and $f_{ref}$ is used to clock the counter. The counter value represents the filtered value in PCM format, and is used to drive the DA converter.

For frequency steering and modulation, the transfer function of the reference modulated integrating loop filter may be implemented digitally. The transfer function is repeated below.

(4.18)

$$U_f(s) = V_m(s) + \frac{K_i (V_m(s) + V_{in}(s))}{s}$$

This may be implemented digitally as shown in Fig. 85.

In the above implementation, the integrator driven by the $\Delta\Sigma$ output $U_d$ may be the simple counter type discussed above. The other integrator implementation depends on the form of modulating function $V_m$. It is most likely to be PCM, so a standard digital filter integrator function would be used.

5.7 Second Order of $\Delta\Sigma$ PLL Implementation

It was stated earlier that the signal to noise ratio of the first order $\Delta\Sigma$ modulator will improve 9 dB per doubling of the reference frequency, and the second order 15 dB per doubling. The total noise is increased by higher order, but the noise in the lower frequency range is driven lower at the expense of more noise in the high frequency range. The high frequency noise may be removed by suitable filtering.

To convert from first to second order, the integrator in the feedback path of the $\Delta\Sigma$ modulator is replaced by the below feedback function [13,361].

$$I(s) = \frac{g(s+a)}{s(s+b)} \tag{5.4}$$

Normally, b < a in the above. This results in a lower frequency pole and a higher frequency zero being introduced into the feedback function. Qualitatively, this drives lower frequency noise lower by emphasizing it so that the loop works harder to servo that noise out. The higher frequency zero is present to bring in positive phase shift at higher frequencies, and so maintain stability. Like any feedback control system, the $\Delta\Sigma$ modulator must not exceed 180 degrees of phase shift at gain greater than one.

Development of higher order $\Delta\Sigma$ frequency detectors was a long time goal of Timeback Systems. Their staff attempted to implement higher order by placing a low pass filter on the counter output just as one would be placed on the voltage $\Delta\Sigma$ modulator integrator output. This did result in significant performance improvement, but at the time was not analytic. Stability was a large and apparently uncontrollable problem.

The PLL model of the $\Delta\Sigma$ FD developed for this thesis allows the situation to be analyzed. The FPCO (counter) converts the input frequency and bit density to phase. To implement the transfer function of (5.4), a filtering technique must be implemented that acts on phase variation in the frequency domain, no the voltage variation in the frequency domain. Standard stability criteria must be obeyed, with phase shift of the phase variable properly accounted for.

The spectral distribution of noise in the FPCO output that is to be filtered by be somewhat visualized from the way in which error is corrected in the $\Delta\Sigma$ FD. Phase correction is implemented in steps of $2\pi\Delta M/M$. Usually, $\Delta M = 1$, and is much less than M. This means the narrowband FM condition applies, and eq. (3.26) approximately describes the sidebands that result from this phase modulation.

$$f(t) = \cos(\omega_c t) - \frac{\beta}{2}(\cos(\omega_c-\omega_m)t - \cos(\omega_c+\omega_m)t). \tag{3.26}$$

Eq. (3.26) shows that in the narrowband FM case, the phase variation in the frequency domain translates linearly into voltage variation in the frequency domain. The phase variation may be indirectly filtered by filtering of the voltage variation (sideband magnitude). The sidebands whose amplitude are to filtered are equally spaced on both side of $f_{ref}$.

The fraction of $f_{ref}$ cycles that have correcting phase inserted is equal to the bit density. When the input frequency to the $\Delta\Sigma$ FD is at the low end of the encodeable range ($M\omega_{ref}$) the correction is applied on only a small fraction of the reference cycles. At the higher end of the range $[(M + \Delta M)\omega_{ref}]$ the majority of the cycles are corrected. Thus at the low end of the FPCO output has fundamental sidebands grouped fairly closely around center frequency $f_{ref}$, with harmonics sprayed out wider. At the higher end of the input frequency range the fundamental sidebands are spaced out wider, with the low sideband actually approaching DC as the upper input frequency limit is approached.

The desired filtering function to implement second order $\Delta\Sigma$ is clearly some kind of band pass around $f_{ref}$. To allow the loop to "concentrate" on the low frequency noise and thus drive it down, the noise at offsets beyond the desired baseband of interest $f_c$ must be driven down. Therefore a band pass that attenuates beyond $f_c$ on both sides of the carrier should force the loop into a mode approaching second order.

This concept has not been fully analyzed, nor confirmed experimentally. Buy since the low pass approach, an even cruder method of phase filtering, can give the effect of higher order, this more sensible approach should yield better results. For the noise reduction to be predictable by the techniques that have been developed for voltage $\Delta\Sigma$ the narrowband FM condition must apply. This condition may not always be applicable, particularly for input frequencies above the midpoint of the encodeable range. This is a fertile area for future research and development.

A theoretically correct method of directly implementing the required phase filtering was conceived by the author, and experimentally confirmed by Timeback. The method was to go to finer quantization of phase error, and apply digital filtering to the multiple bit word. For example, instead of having M = 10, and $\Delta$M = 8. The resulting quantization of phase on the counter output has 8 levels, and is described by a 3 bit PCM word instead of a 1 bit word. This method was found to implement second order $\Delta\Sigma$ that agreed closely with expected noise levels.

This method has the advantage of avoiding the approximation of filtering phase indirectly through sideband filtering. Unfortunately, it would be rather complicated to implement at radio frequencies. Convenient circuit blocks, such as the dual modulus prescaler that makes first order radio frequency $\Delta\Sigma$ frequency detection so simple, are not available to simplify the method.

However, there appears to be a way to conveniently and exactly implement true second order $\Delta\Sigma$ frequency detection. Recall from chapter 3 that the phase transfer function H(s) shows the PLL to be able to function as a filtering function that acts on phase variation in the frequency domain.

(2.7)
$$H(s) = \frac{\Theta_2(s)}{\Theta_1(s)}.$$

For the general PLL, this function is given by (2.8)
$$H(s) = \frac{K_d K_o F(s)}{Ns + K_d K_o F(s)}.$$

Figure 8F:
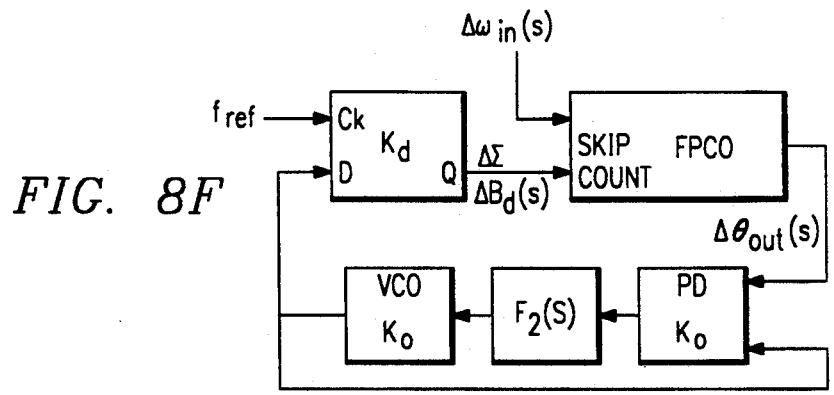
FIG. 8F illustrates a second order $\Delta\Sigma$ digital PLL frequency detector with PLL phase filtering.
Figure 8G:
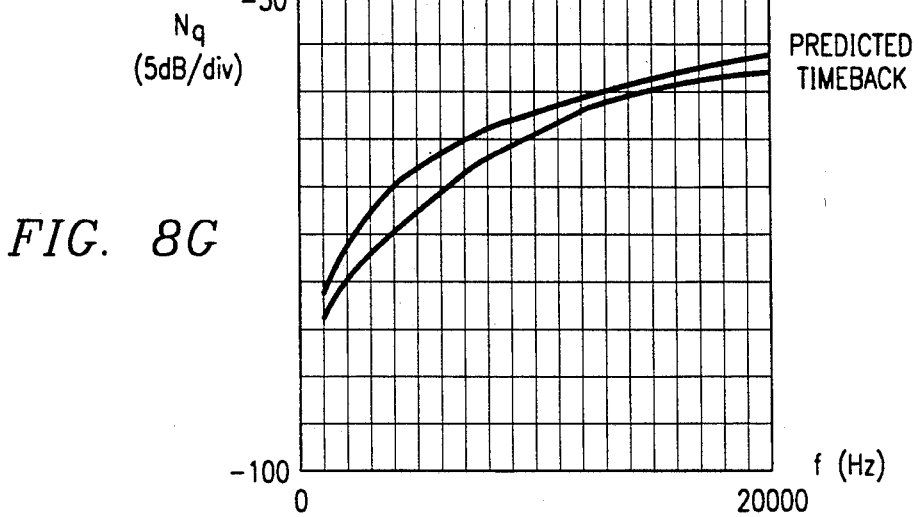
FIG. 8G illustrates a predicted and Timeback Systems supplied first order $\Delta\Sigma$ noise spectrums.

It is seen that a PLL may be used as a direct phase filter. The PLL may be implemented into the $\Delta\Sigma$ digital PLL as shown in Fig. 8F.

The filter PLL is implemented with N = 1. The question is how to set the parameters of the filter PLL to implement the desired transfer function of (5.4) in the feedback.

The integrating action in I(s) of (5.4) is performed by the FPCO (counter). That leaves the filter action of $(s+a)/(s+b)$ to be performed by the PLL. The assumption may be made that $b << a$.

With the pole of the modifying function $(s+a)/(s+b)$ as the first effect that the modification causes, examination of (2.8) shows that the natural pole of the H(s) function of the filter PLL can be assigned to implement the pole of the modification.

(5.17)
$$b = K_d K_o F_2(DC)$$

It is assumed in (5.17) that the frequency response of the loop filter $F_2(s)$ is flat for frequencies from DC out to approximately "a". This allows the $(s + b)$ term in (5.4) to be replaced with the $(s + K_d K_o F(s))$ term in (2.8).

At frequency "a" it is desired to implement a zero in the phase filtering response. The PLL is exerting the zero frequency pole of (5.4) through the integrating action of its VCO, and that roll off cannot be avoided. The only place the zero can be implemented is in the loop filter. Therefore the desired loop filter transfer function is actually high pass. Setting the numerator of (2.8) equal to $(s + a)$, and attempting to isolate the form of F(s) will result in $b = a$. Since $b < a$ is desired, a modification of I(s) is in order. The form is changed to (5.18) below.

(5.18)
$$I_2(s) = \frac{gc(s + a)}{(s + b)}$$

The factor c is a constant that will allow determination of F(s) as below.

(5.19)
$$K_d K_o F(s) = c(s + a)$$
$$F(s) = \frac{c(s + a)}{K_d K_o}$$

From (5.19)

$$F(DC) = \frac{ac}{K_o}. \tag{5.20}$$

From (5.19) and (5.17)

$$b = ac. \tag{5.21}$$

From (5.21), if c < 1 then the desired condition b < a may be satisfied.

The author believes this technique may be the method of choice for implementing higher order $\Delta\Sigma$ in the $\Delta\Sigma$ FD. It is analyzable in closed form, and the results obtained by other researchers in voltage $\Delta\Sigma$ may be directly converted. It also is usable at radio frequency, and preserves the simple $\Delta\Sigma$ FD based upon the dual modules prescaler. This is another good topic for future research. The presentation here does not amount to more than a feasibility study, and much more work is needed.

Though much improved low frequency noise floor may be obtained by higher order $\Delta\Sigma$, that does not always mean that higher order would necessarily be desired for the $\Delta\Sigma$ FLL synthesizer. Since the counter is driven at the synthesized radio frequency, the reference frequencies tend to very high, and thus even first order can exhibit a very low quantization noise. Higher order also means higher noise far out, which could generate undesired noise at high offsets from the carrier frequency. Higher order $\Delta\Sigma$ frequency detection would be the preferred choice where good noise with a lower $f_{ref}$ is desired.

This section has shown that the $\Delta\Sigma$ FD noise spectrum can be controlled in a way exactly analogous to the voltage $\Delta\Sigma$ modulator. Agrawal and Shenoi [13] have developed a design methodology for the second order $\Delta\Sigma$ encoder that allows some degree of prediction and control of the encoding noise spectrum. Use of the correct PLL model of the $\Delta\Sigma$ FD should allow that work to be directly applicable to the $\Delta\Sigma$ FD. Unfortunately, many factors about the behavior of the second order $\Delta\Sigma$ have so far proven intractable. Research is presently underway to better understand and control the second order $\Delta\Sigma$ modulator.

The techniques of predicting the noise or spectral purity of the synthesized carrier in the ΔΣ FLL synthesizer will be developed in the next chapter. It will be seen that control of the ΔΣ noise spectral density via control of the order will allow the designer to optimize the noise performance for a particular application, and that state of the art noise performance will be possible.

5.8 First Order ΔΣ Noise On a Per Unit Bandwidth Basis

The noise content of frequency sources such as oscillators and frequency synthesizers is usually specified in a band of frequency at a certain offset from the carrier frequency. The most common measure is the power in a one HZ bandwidth relative to the carrier power. To calculate this noise level in the ΔΣ FLL synthesizer it will be necessary to know the noise in the ΔΣ bit stream on a per HZ basis. This section will develop the appropriate expression for the first order case. The second order case is not presented here.

In Agrawal and Shenoi [13,363], the noise spectral density of first order ΔΣ is given as $$S_n(f) = \frac{8\sigma_e^2}{f_{ref}} \sin^2\left(\frac{\pi f}{f_{ref}}\right). \tag{5.22}$$

In (5.19), $\sigma_e^2$ is the variance of a noise intended to model the noise introduced by the step wise comparator error correction. If this noise is assumed to be uniformly distributed, then $$S_n(f) = \frac{8}{3f_{ref}} \sin^2\left(\frac{\pi f}{f_{ref}}\right). \tag{5.23}$$

In the above equations, the ΔΣ bit stream is assumed normalized with bit values of ±1. This is natural for encoding of voltage that has positive and negative values. The ΔΣ FD transfer function (5.15) was developed on the assumption of bit density from 0 to 1. This is natural for encoding of frequency between two end points, and to visualize the delay/no delay feedback action that is used to maintain lock. To convert the above expressions to describe the noise spectral density of the ΔΣ FD, it is only necessary to multiply them by 0.25. Therefore, for the ΔΣ FD (5.24)

$$S_n(f) = \frac{2}{3f_{ref}} Sin^2\left(\frac{\pi f}{f_{ref}}\right).$$

The normalized noise power in a bandwidth ΔB centered at frequency $f_m$ is given by integration of (5.24) over that bandwidth.

(5.25)

$$N_q^2 = \int_{(f_m + .5\Delta B)}^{(f_m + .5\Delta B)} S_n(f)\, df$$

For small ΔB, $S_n(f)$ may be considered constant, and the integration replaced with multiplication. In that case (5.26)

$$N_q^2 = \frac{2}{3f_{ref}} Sin^2\left(\frac{\pi f}{f_{ref}}\right)\Delta B.$$

Then the ΔΣ FD normalized noise voltage is given by (5.27)

$$N_q = \sqrt{\frac{2}{3f_{ref}}} Sin\left(\frac{\pi f}{f_{ref}}\right)\sqrt{\Delta B}.$$

The bit density has been normalized to one. For a ΔΣ FLL with analog filtering the pulses will be conditioned to have a precisely controlled area. If the pulse width is $t_{ref}$, then the pulse amplitude and noise are both scaled up by $P_a$, where $P_a$ is the pulse amplitude. If the pulse width is $t_p$, where $t_p < t_{ref}$, then both the amplitude and noise of the ΔΣ output are scaled up by (5.28)

$$S_{\delta\sigma} = \frac{P_d t_p}{T_{ref}}.$$

$S_{\delta\sigma}$ shall be referred to as the delta sigma scaling factor.

The actual noise voltage for this case is (5.29)

$$V_q = S_{\delta\sigma} N_q.$$

This same scaling is used to convert the transfer function between input frequency and bit density to the gain $K_{df}$ in volts/rad/sec. From (5.15) and (5.28).

(5.30)

$$K_{df}(s) = \frac{S_{\delta\sigma}}{2\pi\Delta M (s + f_{ref})}.$$

The DC frequency detector gain is given by (5.31)

$$K_{df} = \frac{S_{\delta\sigma}}{2\pi\Delta M f_{ref}}.$$

For the digital loop filter case, the noise and detector gain are used in normalized form, but the filter will introduce scaling that must be taken into account.

Appendix 1 shows a plot of first order $\Delta\Sigma$ noise provided by Timeback Systems. That plot was generated by software based digital filtering of an actual first order $\Delta\Sigma$ bit stream. As such it can be considered to be a fairly reliable measure. A comparison of that data with the predicted noise of (5.27) may be made in Fig. 86. This particular case had an $f_{ref}$ of 250 KHz and a noise bandwidth of 15 Hz.

The Timeback data is consistently 2 to 5 dB better than the predicted noise. Independent phase noise measurements by the author on a working FLL synthesizer will be later shown that also indicate a lower than predicted noise. The conclusion seems to be that the published first order $\Delta\Sigma$ noise density of (5.22) is conservative. This is probably the result of the assumption of uniformly distributed noise made by Agrawal and Shenoi in its derivation.

5.9 Chapter Summary

This chapter has introduced a new frequency detector concept, the $\Delta\Sigma$ digital phase locked loop frequency detector. This technique was invented by Timeback Systems of Dallas, Texas.

The phase lock model of the $\Delta\Sigma$ FD developed by the author and presented here is the only closed form description of the method now is existence. This model demonstrated a frequency detecting accuracy limited only by the reference frequency accuracy. This extreme precision is the direct result of the digital nature of the "oscillator" (counter) in the $\Delta\Sigma$ FD. Standard frequency detection by analog PLL or frequency discrimination contains error proportional to the error in analog components, and is unsuitable for FLL frequency synthesis. The $\Delta\Sigma$ FD has the precision required to realize the theoretical advantages for the FLL over the PLL that are predicted in chapter 4.

The use of digital loop filtering was presented in this chapter as it seemed logical to present it following the introduction of the concept of $\Delta\Sigma$ modulation. The reference modulated digital loop filter is more complicated than the analog version, but it is still reasonable to implement, and allows reduction of frequency error to the single source of the error in the voltage reference of a precision digital to analog converter A simple implementation of the $\Delta\Sigma$ FD at radio frequencies was presented. The availability of the ECL dual modulus prescaler allows the $\Delta\Sigma$ FD to be implemented with only two ECL components.

The first order $\Delta\Sigma$ FD may be extended to second order, and several methods for doing so were presented. These methods followed naturally from the extension of second order $\Delta\Sigma$ techniques to the phase lock model. There is much room for further development in this area.

The noise of the first order $\Delta\Sigma$ FD in a bandwidth of interest was developed. This will be used in the next chapter, where the noise behavior of the $\Delta\Sigma$ FLL synthesizer will be analyzed. It will be shown that with proper design the noise performance of the $\Delta\Sigma$ FLL synthesizer can nearly match that of the PLL synthesizer in the unmodulated condition, and exceed it in the modulated or steered condition.

CHAPTER 6

NOISE BEHAVIOR IN THE ΔΣ FREQUENCY LOCKED LOOP FREQUENCY SYNTHESIZER

6.1 Introduction

The noise content in a synthesizer output is a critical specification. Historically, PLL synthesis has generally been unable to match the noise performance of quality free running oscillators. An intensive industry effort in recent years has reduced the noise in PLL synthesizers to a usable level.

For the frequency lock technique to be a viable commercial method it must present noise performance comparable to phase lock. This will be shown to be feasible, and under the modulated or steered condition the FLL will prove superior to the PLL with the digital PD.

The phase noise contribution of the reference source is a problem common to both the FLL and PLL. As our interest here is in the relative performance of the two systems, the reference noise will be assumed negligible.

6.2 Phase Noise in Voltage Controlled Oscillators

The most common measure of noise in a frequency source is the ratio of the noise power in a 1 Hz bandwidth at offset frequency $f_m$ from the carrier to the carrier power itself. This is referred to as the phase noise at offset $f_m$. The decibel measure of this ratio is usually symbolized by the term $\mathcal{L}(f_m)$.

The term phase noise was apparently adopted for two reason. First, an oscillator is of course running in a gain saturated or compressed condition. Thus noise in the oscillator amplitude is reduced considerably. Second, noise variation in oscillator frequency can, in the narrowband FM condition that has been discussed earlier, be modeled as lumped into the noise in the oscillator phase. The narrowband condition will almost universally apply.

The free running phase noise starts out at zero dB at zero offset, drops initially at about 30 db/decade, tapering gradually to a flat response at high offsets. The final far out phase noise consists of thermal noise gained up by the gain and noise factor of the oscillator active gain element. A typical high performance LC VCO in the VHF range might have $\mathcal{L}(1KHz) = -90$ $dBc/Hz$, and a floor of -160 dBc/Hz at high offsets.

Design of the VCO itself for the lowest phase noise will be discussed from a practical viewpoint here, as the theory has been extensively covered in many sources.

The most commonly quoted oscillator noise reference is the fundamental paper by Lesson [14]. Usually, the concern of the synthesizer design team is to limit degradation in noise performance of the VCO by the synthesizer. Some degradation may be unavoidable.

The oscillator noise model preferred by the author is that presented by Parker [15] [16]. His model is quite complete, and allows accurate noise prediction for even the highest quality oscillators. A simplified form of his mode, suitable for LC oscillators, is given in (6.1) below.

$$S_\phi(f_m) = \frac{\alpha_e}{(2\pi\tau_g)^2 f_m^3} + \frac{\frac{2GFKT}{P_o}}{(2\pi\tau_g)^2 f_m^2} + \frac{2GFKT}{P_o} \tag{6.1}$$

The following definitions apply to the terms in (6.1).

$S_\phi$ = Phase noise to carrier power ratio in a one Hz bandwidth at offset $f_m$ Hz $\alpha_e$ = Active gain element flicker noise factor, derived from open loop phase noise $\tau_g$ = Group delay of main resonator or filter element in seconds G = Active element gain under stable oscillation F = Active element compressed noise factor K = Boltzman's constant, 1.31.41.41.48E-23

$P_o$ = Output power of active gain element in watts

T = Temperature in degrees Kelvin

This model may be intuitively understood as follows. There are two physical sources of noise in the oscillator, flicker noise and thermal noise. Outside the oscillator's resonator or filter bandwidth, the thermal noise on the active element input is simply gained up by the active gain and noise factor. This sets the noise floor. It is apparent that the active gain and noise factor should be kept to a minimum. Since required gain is the reciprocal of the total loss in the oscillator loop, losses should be minimized. Since noise factor increases with compression, excess compression should also be avoided [16].

Inside the resonator bandwidth, the positive feedback action of the oscillator regeneratively gains up the noise floor. This term rises at a 20 dB/decade rate. At sufficiently close offsets, the flicker noise of the active device becomes the dominant noise, and rises at a 30 dB/decade rate. The flicker noise factor is given by (6.2)
$$\alpha_c = f_m S_{\phi E}.$$

$S_{\phi E}$ is the phase noise of the active element measured in an open loop phase noise measurement. A typical value is 2E-14 rad$^2$ [16,662]. This factor is usually fairly independent of offset frequency.

If the group delay of the resonator is increased, which corresponds to a narrower bandwidth or higher Q resonator,m then the sharper filtering reduces the noise. This is the reason a quartz crystal oscillator demonstrates such low noise.

Higher power in the oscillator loop also improves the noise. Intuitively, this follows from the fact that the thermal noise is fixed and cannot be lowered, but the signal can be raised, and thus the signal to noise ratio increased. Since a high quality oscillator is almost without exception operated in a current limited mode, the output power is accurately described as the square of bias current multiplied by the active element output impedance.

A modification of (6.1) will allow calculation of VCO phase noise in a convenient form for the frequency synthesizer application. The group delay may be expressed as the derivative of resonator phase slope with respect to frequency.

(6.3)
$$\tau_g = \frac{d\phi}{d\omega} \quad (\phi \text{ in rad})$$
$$\tau_g = \frac{d\phi}{2\pi df}$$

Most well designed oscillators run at frequencies within the 3 dB bandwidth of their resonators or filters. A typical example might turn across about 75% of the 3 dB bandwidth. For a second order resonator with 180 degrees of total phase shift, this is about 1000 degrees. This represents a good compromise between the need for linear tuning and the desire for the widest tune range for a given resonator.

If $\Delta\phi$ is the range of phase change implemented to tune a VCO the frequency range $\Delta f$, then (6.3) may be approximated as $$\tau_s = \frac{\Delta\phi}{2\pi\Delta f}. \tag{6.4}$$

If $\Delta V$ is the tune voltage range to tune across $\Delta f$, then with $K_o$ in Hz/volt, $$K_o \Delta V = \Delta f. \tag{6.5}$$

Substituting (6.5) into (6.4) gives $$\tau_s = \frac{\Delta\phi}{2\pi K_o \Delta f}. \tag{6.6}$$

Next (6.6) may be substituted into (6.1) to yield $$S_\phi(f_m) = \frac{\alpha_e}{\left[\frac{\Delta\phi}{\Delta V K_o}\right]^2 f_m^3} + \frac{\frac{2GFKT}{P_o}}{\left[\frac{\Delta\phi}{\Delta V K_o}\right]^2 f_m^2} + \frac{2GFKT}{P_o}. \tag{6.7}$$

Eq. (6.7) is a very useful form to use in synthesizer work. Since the loop induced phase noise is a strong function of the VCO gain $K_o$, having the free running phase noise in terms of $K_o$ as well is quite convenient. $K_o$ is in Hz/volt in (6.7), though it is in rad/sec/volt in many other expressions in this work.

Yet another useful form of $S_\phi$ may be derived. To eliminate transient responses to the modulating input of the FLL, the matched condition $K_o K_{df} = N$ must be maintained. The low frequency gain of the $\Delta\Sigma$ FD is given as $$K_{df} = \frac{S_{\delta\sigma}}{\Delta M f_{ref}} \text{ (volts/Hz)} \quad (5.31)$$

Substituting the matched condition into (5.31) gives (6.8)

$$K_o = \frac{N \Delta M f_{ref}}{S_{\delta\sigma}}$$

Eq. (6.8) gives the required VCO gain to maintain the matched condition in terms of reference frequency. It may be substituted into (6.7) to eliminate $K_o$. The resulting expression may be simplified by substitution of another match condition, $S_{\delta\sigma} = \Delta VN$, to yield (6.9)

$$S_\phi(f_m) = \frac{\alpha_e \left[\frac{\Delta M f_{ref}}{\Delta \phi}\right]^2}{f_m^3} + \frac{\frac{2GFKT}{P_o}\left[\frac{\Delta M f_{ref}}{\Delta \phi}\right]^2}{f_m^2} + \frac{2GFKT}{P_o}.$$

Eq. (6.9) will be central to the noise optimization of the $\Delta\Sigma$ FLL to be presented later. The significant feature of (6.9) is that it gives the phase noise to carrier power ratio of the VCO in terms of the reference frequency of the FLL. It applies under the matched condition.

The phase noise in dBc/Hz is obtained from the phase noise to carrier ratio $S\phi$ as below.

(6.10)

$$\mathcal{L}(f_m) = 10 \operatorname{Log}\left[S_\phi(f_m)\right]$$

With the above expressions for the free running VCO noise, the noise in the closed loop synthesizer may now be addressed. Though the synthesizer will add noise at some offsets, it has a beneficial effect also. The VCO phase noise will be seen as error by the synthesizer loop inside its loop bandwidth. The loop shall therefore attempt to reduce it through its negative feedback action. Thus the locked phase noise at offsets within the loop bandwidth will usually be improved over the free running case for both the PLL and FLL.

To quantify this effect we need to refer the free running phase noise in the VCO to its input, calculate the loop modification of this noise, and then translate this modified voltage noise back to phase noise. This is done by use of eq. (3.23).

(3.23)
$$\frac{\text{sideband}}{\text{carrier}} = \frac{V_t K_o}{2f_m}$$

This equation was developed for prediction of discrete sidebands, but is equally valid for voltage induced broad band effects so long as the narrowband FM condition is obeyed. Therefore it may be applied to refer output phase noise to the VCO input.

The sideband to carrier, a magnitude ratio, is obtained from $\mathcal{L}(f_m)$ from (6.11)
$$\frac{S}{C}(f_m) = 10\left(\frac{\zeta(f_m)}{20}\right).$$

Alternately, it may be obtained from $S\phi(f_m)$ as (6.12)
$$\frac{S}{C}(f_m) = \sqrt{S_\phi(f_m)}.$$

The input referred peak voltage due to phase noise $V_{tn}$ is given by solving (3.23) for $V_t$ and substituting $V_{tn}$.

(6.13)
$$V_{tn}(f_m) = \frac{2f_m \frac{S}{C}(f_m)}{K_o}$$

This last expression give the input referred free running peak noise voltage for a VCO. In the locked condition the particular loop will modify this through its feedback control action.

6.3 The Effect of the Phase Locked Loop on Oscillator Phase Noise

Figure 9A:
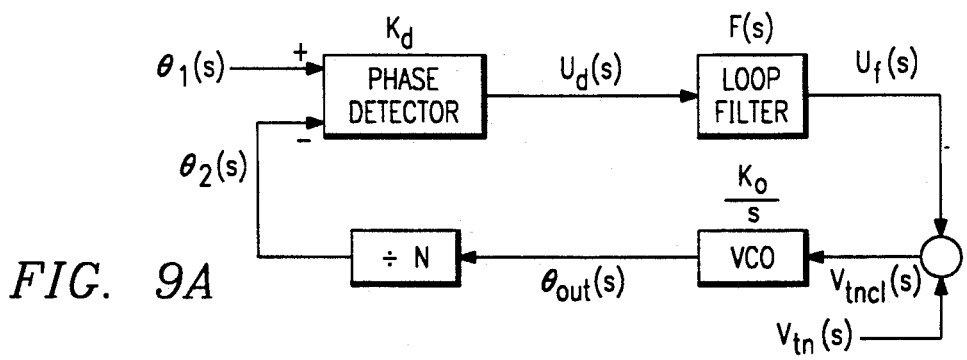
FIG. 9A illustrates a PLL with input referred oscillator noise and its loop modified version $V_{tncl}$.

For comparison to the FLL, the effect of the PLL on VCO will be derived. Fig. 9A is used.

Solving for the transfer function from the input referred noise $V_{tn}$ to the loop modified input referred noise $V_{tncl}$ (closed loop noise tune voltage) yields (6.14) below.

(6.14)

$$\frac{V_{tncl}(s)}{V_{tn}(s)} = \frac{Ns}{Ns + K_d K_o F(s)}$$
$$= H_e(s)$$

The PLL modifies the phase noise via multiplication by the phase error transfer function that was derived in chapter 2. This allows the normalized form and commonly available graphs to be applied. In the normalized form, (2.18)

$$H_e(s) = \frac{s^2}{s^2 + 2\zeta\omega_n s + \omega_n^2}.$$

It is noteworthy that the PLL loop modification of VCO phase noise is a second order high pass response. The loop has no significant effect on phase noise outside the loop bandwidth. Inside the loop bandwidth, the noise voltage is suppressed 40 dB/decade. The closed loop phase noise will be suppressed 40 dB/decade from the free running levels.

To get numerical values for the closed loop phase noise, (3.23) is applied to $V_{tncl}$ and $20\log(S/C)$ is applied to get $\mathcal{L}(f_m)$.

6.4 The Effect of the Frequency Locked Loop on Oscillator Phase Noise

Figure 9B:
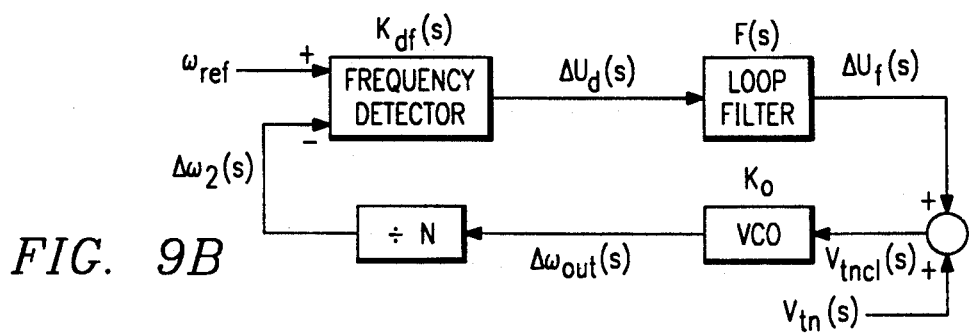
FIG. 9B illustrates an FLL with input referred oscillator noise and its loop modified version $V_{tncl}$.

The effect of the frequency locked loop on the VCO noise is developed with the aid of Fig. 9B The transfer form $V_{tn}$ to $V_{tncl}$ is again solved for. The result is $$\frac{V_{incl}(s)}{V_{in}(s)} = \frac{1}{1 + \frac{F(s)K_{df}(s)K_o}{N}}$$

$$= H_{fe}(s).$$

(6.15)

For the FLL the transfer from free running to closed loop input referred noise is also found to be the error transfer function. For the FLL, this is of course the frequency error transfer function defined in (4.10). This function is given in normalized form as $$H_{fe}(s) = \frac{s^2 + 2\zeta\omega_n s}{s^2 + 2\zeta\omega_n s + \omega_n^2}.$$

(4.14)

The parameters $\zeta$ and $\omega_n$ are those defined for the FLL in (4.7) and (4.8).

Section 4.6 was devoted to approximations that usually apply in the FLL. It was noted there that usually $K_o K_{df} = N$, and $P(s)$ is a first order low pass whose pole $1/\tau_p$ is usually much greater than the loop bandwidth. Under those circumstances the FLL is overdamped and behaves as a first order system for frequencies below the pole of $P(s)$. In that case the frequency error transfer function is $$H_{fe}(s) = \frac{s}{s + K_l}.$$

(4.33)

This is a first order high pass response. Inside the loop bandwidth $K_l$ the loop suppresses the input referred noise voltage by one order, or 20 dB/decade. The PLL suppressed it two orders, or 40 dB/decade. Though the FLL can "clean up" a noisy VCO inside its loop bandwidth, the PLL does it better.

This is probably not a limitation in most applications where the $\Delta\Sigma$ FLL would compete with the PLL. The close in suppression of phase noise has not been a strong factor in the rise to dominance of the PLL synthesizer over the free running oscillator. The key factors have been frequency precision and computer control capability. If the PLL did not come to dominate the free running oscillator by virtue of its second order close in suppression, then the FLL with first order close in suppression is not strongly disadvantaged.

6.5 Quantization Noise in the ΔΣ FLL Synthesizer

The effect of quantization noise on synthesizer phase noise is the dominant noise degradation to guard against in the design of the ΔΣ FLL. The ac transfer of the quantization noise to the VCO input is developed with the aid of Fig. below.

The ΔΣ quantization noise is modeled as summed into the FD output. For the analog loop filter case, $V_q(s)$ is the rms noise voltage per root Hz at radian frequency offset $2\pi f_m$. This noise voltage was given by (5.27) and (5.29). For the digital loop filter case, the normalized rms noise given by (5.27) alone is used.

A few lines of algebra yield the transfer function from $V_q$ to $V_{qcl}$.

(6.16)
$$\frac{V_{qcl}(s)}{V_q(s)} = \frac{F(s)}{1 + \frac{K_{df}(s)K_o F(s)}{N}}$$

(6.17)
$$F(s) = \frac{K_i P(s)}{s}$$

It is noted that if the matched condition $K_o K_{df} = N$ is applicable, then this transfer function is the same as the frequency transfer function given in (4.2). The previously developed expressions for the normalized form (4.6), (4.7), (4.8), and (4.9) are therefore directly applicable. The approximate expression for the common case of $K_o K_{df} = N$ and the pole of $P(s)$ being much greater that $K_i$ that was developed in section 4.6 is of particular interest.

(6.18)
$$\frac{V_{qcl}(s)}{V_q(s)} = H_f(s) \quad (K_o K_{df} = N)$$

$$= \frac{K_t P(s)}{s + K_i} \quad (1/\tau_p \gg K_i) \quad (6.19)$$

To determine the phase noise level in the synthesizer output due to qualitization noise, the appropriate relation above is used with the $\Delta\Sigma$ noise given by (5.27) and (5.29). The resulting $V_{qcl}$ at offset $f_m$ is multiplied by $\sqrt{2}$ and then (3.23) is applied to get the sideband to carrier. In this case the "sideband" is the noise magnitude in a 1 Hz bandwidth at offset $f_m$ relative to carrier magnitude. To get the quantization induced phase noise $\mathscr{L}_q(f_m)$, conversion to dB using 20 log (S/C) is applied.

To obtain the total phase noise $\mathscr{L}_{cl}(f_m)$ in the closed loop condition both the oscillator loop modified phase noise and the $\Delta\Sigma$ quantization noise induce phase noise must be taken into account. Since the noises are uncorrelated, they may be summed in rms fashion. Care must be taken to use the proper rms and peak quantities at appropriate times. The input referred oscillator noise voltage is a peak quantity and must be converted to rms before being rms summed with the rms quantization noise $V_q$. The sum must be reconverted to be a peak quantity before (3.23) is applied to get the S/C ratio. These relations may be combined into one expression for total peak noise voltage (TPNV) as below. TPNV is of course a function of $f_m$.

$$TPNV = \sqrt{2V_q^2 + V_{en}^2} \quad (6.20)$$

6.6 An Example of Typical Phase Noise

A key question concerning the general viability of the $\Delta\Sigma$ FLL is whether the closed loop phase noise can be low enough to compete with the PLL. An example is considered here for the case of a low noise VHF FLL. Such a system might be used for a UHF receiver local oscillator. The AG FLL System is assumed to have the below characteristics.

Frequency range: 100 to 110 MHz
Loop filtering: analog
$\Delta\Sigma$ order: first Digital parameters: M = 10, ΔM = 1, N = 1

Loop bandwidth: 70 Hz

Loop filter integrator gain: $K_i$ = 628 (100 Hz)

Matching condition: $K_o K_{df}$ = N

Prefilter bandwidth: 100Hz, 628 $^{rad}/_{sec}$

The pole of the prefilter is at the unity gain point of the integrating loop filter in this example to provide good attenuation of quantization noise. The oscillator is assumed to have the following characteristics.

$K_o$: 2 MHz/v (covers 10MHz with 5 volts)

Bias current: 40 mA (signal transistor upper limit)

Noise factor (F): 10 (good in a compressed state)

Operating power gain (G): 10 (loop loss = 10 dB)

Flicker noise factor ($\alpha_e$): 2E-14

Resonator type: Second order LC

Phase tuning: 100 degrees out of 180

3 dB bandwidth of resonator: Approximately 13.5 MHz

Group delay of resonator ($\tau_g$): 2.8E-8

The following relations will be applied.

$$S_\phi(f_m) = \frac{\alpha_e}{(2\pi\tau_g)^2 f_m^3} + \frac{\frac{2GFKT}{P_o}}{(2\pi\tau_g)^2 f_m^2} + \frac{2GFKT}{P_o} \tag{6.1}$$

$$\frac{V_{tncl}(s)}{V_{tn}(s)} = \frac{Ns}{Ns + K_d K_o F(s)} \tag{6.14}$$

$$= H_e(s)$$

$$N_q(f_m) = \sqrt{\frac{2}{3f_{ref}}} \sin\left(\frac{\pi f_m}{f_{ref}}\right) \sqrt{\Delta B} \tag{5.27}$$

$$S_{b\sigma} = \frac{P_s t_p}{t_{ref}} \quad (5.28)$$

$$V_q = S_{b\sigma} N_q \quad (5.29)$$

$$\frac{V_{qcl}(s)}{V_q(s)} = \frac{K_t P(s)}{s + K_t} \quad (K_o K_{df} = N) \quad (6.19)$$

$$TPNV = \sqrt{2V_q^2 + V_m^2} \quad (6.20)$$

$$\frac{\text{sideband}}{\text{carrier}}(f_m) = \frac{V_t(f_m)K_o}{2f_m} \quad (3.23)$$

$$K_{df}(s) = \frac{S_{b\sigma}}{2\pi \Delta M(s + f_{ref})}. \quad (5.30)$$

The relations are applied to obtain the total closed loop noise. The large number of calculations required implies that development of a computer program or spreadsheet model is advisable. For this example, a model using the commercial program MathCAD was developed. MathCAD is similar to a spreadsheet, and has many built in advanced mathematical functions. This modeling approach allows convenient graphical display of the free running and the complete model is shown in Appendix 2.

Fig. 9.4(a) below for this example was generated using this model. The columns are, from left to right, free running phase noise, closed loop quantization induced phase noise, and total closed loop phase noise. The data is graphed in Fig. 9.4(b).

In the above example the loop filtering and the natural first order suppression of sideband amplitude in (3.23) combine to make the high frequency noise performance extremely good, with a great deal of safety margin in the quantization noise beyond the VCO free running noise. The close in noise shows the closed loop suppression of the free running noise, with quantization noise well below oscillator noise.

The only degradation of the oscillator free running noise spectrum is in a narrow band right around the loop bandwidth. This effect is partially due to quantization, but is really mostly the result of "gain peaking" of the FLL control system. The example shown has 45 degrees of phase margin, and like any second order system with less than 90 degrees of phase margin, it exhibits an underdamped response. This results in a gain greater than one for the noise in that band. This effect can be eliminated by pushing out the pole of P(s) to where the system acts like a first order system. The trade off is less suppression of quantization noise.

If close in noise due to quantization were a problem, then second order $\Delta\Sigma$ could be applied. That would give better close in quantization induced phase noise, at the expense of greater far out noise.

This example shows clearly that the $\Delta\Sigma$ FLL is capable of excellent noise performance the oscillator parameters used here represent a well designed low noise oscillator, and the $\Delta\Sigma$ quantization induced phase noise is till below the natural oscillator noise. The loop did show a noise degradation due to being underdamped, but he PLL shows exactly the same effect.

6.7 Noise Optimization of the $\Delta\Sigma$ FLL Synthesizer

The noise optimization of the $\Delta\Sigma$ FLL is a complicated subject. There are an extremely large number of variables in the loop, the $\Delta\Sigma$ FD, and the oscillator. Many of these are interrelated, and some, such as the second order $\Delta\Sigma$ FD, are very difficult to exactly model.

Here two main subjects shall be addressed. First a general set of guidelines for sensible noise minimization shall be addressed. Second, given a general oscillator noise behavior and a required system modulation bandwidth, a procedure for determination of the optimum reference frequency shall be determined.

The free running phase noise of the oscillator is a critical parameter. The last example demonstrated that the $\Delta\Sigma$ FLL is capable of such good noise performance that the free running oscillator can easily be the limiting factor. The noise in an oscillator can be made quite close to the physical optimum by following some simple guidelines. Examination of (6.1) allows the guidelines below to be inferred.

1. Use the minimum required resonator bandwidth to tune the necessary frequency range. This keeps $\tau_g$ to a minimum.

2. Keep loop losses to a minimum. This allows loop gain G to be kept to a minimum.

3. Keep noise factor F to a minimum by using the least required compression to assure reliable oscillation. Use noise matching techniques where possible, if the noise benefit is greater than possible increase in loss.

4. Use the greatest possible loop power.

5. Use low noise transistors. If possible, select a transistor based upon measure of the flicker noise parameter and the noise figure in a compressed state.

The $\Delta\Sigma$ FD should be first order in most cases, as it is simple and high performance. In cases where first order quantization noise is a problem, then the second order systems described in the last chapter may be applied.

Examination of (6.15), (4.14), (6.16), (6.18) and (6.19) allow guidelines for selecting loop parameters. These are listed below.

1. Use the minimum loop bandwidth required by the system specification. The two factors to consider are required suppression of quantization noise as traded off against desired loop suppression of free running oscillator noise.

2. Keep the pole of the prefilter well past the loop bandwidth if a slight peaking of free running noise around the loop bandwidth is not acceptable. Reduce the P(s) cutoff if far out quantization induced phase noise is a greater problem than slight degradation due to peaking.

3. Use N = 1 if the electronic design allows it.

The guidelines above are highly useful, but true optimization can only be attained through rigorous analysis. Unfortunately, a complete general analysis quickly becomes bogged down in a large mass of detail. However, the situation is tractable if some reasonable assumptions are made.

For example, no mention has been yet made of an optimal reference frequency or VCO gain. These two interrelated factors are, however, critical to the noise performance attained in the $\Delta\Sigma$ FLL. A procedure for determining optimum values for these parameters for any particular case is next presented. It is fundamental in its own right, and also serves as a good example of how optimization problems in the $\Delta\Sigma$ FLL can be reduced to manageable size by the use of simplifying assumptions and intuitive understanding.

The case to be addressed is determination of the best reference frequency and VCO gain of the example system of the last section. To solve this problem, a correct intuitive understanding of the noise behavior is required.

From the previous example, it is clear that worst case noise performance is likely to occur at offset frequencies approximately equal to the loop bandwidth. This results form eh fact that the free running noise is not attenuated from the loop bandwidth on out, form gain peaking, and because the filtering of quantization noise does not being until past the loop bandwidth. Therefore the optimization shall minimize the total closed loop phase noise under the simplifying assumption of the offset frequency being equal to the loop bandwidth.

The quantization noise goes down as $f_{ref}$ goes up, but maintaining the matched condition $K_o K_{df} = N$ complicates the situation. By (5.30), the frequency detector gain $K_{df}$ is inversely proportional to $f_{ref}$. Therefore, maintaining the matched condition $K_o K_{df} = N$ implies that as $f_{ref}$ increases (and $V_q$ decreases) $K_o$ must increase proportionally. This means that the VCO resonator bandwidth must increase to allow the wider tune range, so that the group delay $\tau_g$ decreases. Then by (6.1), the close in oscillator noise from both flicker noise and thermal pickup must increase. The improvement in quantization noise has been accompanied by an unavoidable degradation in free running noise. This situation was recognized and used to develop (6.9), which gave the free running VCO noise as a function of $f_{ref}$ if the oscillator design was constrained to hold the matched condition as $f_{ref}$ varied.

There are several important points to note about this situation. First, there should be an optimum $f_{ref}$ where the total noise is lowest. It should occur where the contribution from quantization noise and oscillator noise is equal. Second, the approximate change in noise as a function of $f_{ref}$ may be reasoned out as follows.

Below the optimum $f_{ref}$, the quantization noise will dominate. By (3.23), the induced phase noise decreases 6 dB per octave of $f_{ref}$ (since $K_o$ is proportional to $f_{ref}$) for a constant magnitude noise source on the VCO input. But by (5.27), the ΔΣ quantization noise voltage is increasing 9dB per octave of $f_{ref}$ below the optimum. The net result is a 3dB per octave degradation in closed loop phase noise as $f_{ref}$ is decreased from the optimum.

Above the optimum $f_{ref}$, the oscillator noise dominates. though the effect of noise is increasing 6dB per octave, the quantizing noise itself is dropping at a 9 dB per octave rate, so that the total quantizing noise rate is still decreasing at a 3 dB per octave rate. However, by (6.9) the oscillator's free running noise is increasing at 6 dB per octave rate. Since we are interested in the noise at the loop bandwidth, the loop provides little suppression of the free running noise. Therefore, that noise is not attenuated and the 6 dB per octave increase in noise remains on the VCO output.

Fortunately, these slopes indicate that the minimum should not be a sharp function. If the reference frequency is even in the vicinity of the optimum $f_{ref}$ the system should be near optimal.

To develop a set of equations to address this problem, we begin with the set listed in the last section. For $f_m << f_{ref}$, the sine factor in (5.27) is equal to the argument of the sine, so the equation may be simplified. We are also interested only in a 1 Hz noise bandwidth. At the loop bandwidth, (6.14) and (6.19) show that both input referred free running phase noise and quantization noise are reduced $\sqrt{2}$ from their open loop values. The simplifying assumption may also be made that the free running thermal noise floor is below the flicker and thermal pickup terms at the loop bandwidth, so that the thermal term need not be carried. The flicker noise factor is a function of the particular transistor used in the oscillator and the bias conditions, and so may be assumed independent of the VCO gain $K_o$. With these simplifications, the below equation set is developed.

$$S_\phi(f_m) = \frac{\alpha_e \left[\frac{\Delta M f_{ref}}{\Delta \phi}\right]^2}{f_m^3} + \frac{\frac{2GFKT}{P_o}\left[\frac{\Delta M f_{ref}}{\Delta \phi}\right]^2}{f_m^2} + \frac{2GFKT}{P_o}. \tag{6.9}$$

$$K_o = \frac{1}{K_\phi(DC)} \tag{6.21}$$

$$\frac{\text{sideband}}{\text{carrier}}(f_m) = \frac{V_t(f_m)K_o}{2f_m} \quad (3.23)$$

$$\frac{S}{C}(f_m) = \sqrt{S_\phi(f_m)}. \quad (6.12)$$

$$V_{tn}(f_m) = \frac{2f_m \frac{S}{C}(f_m)}{K_o} \quad (6.13)$$

$$V_{tncl} = .707 V_{tn} \quad (6.22)$$

$$V_{qcl}(f_m) = .707 S_{\delta o} \pi \sqrt{.667} f_m [f_{ref}]^{-1.5} \quad (6.23)$$

$$K_{df}(DC) = \frac{S_{\delta o}}{f_{ref}} \quad \text{(volts/Hz)} \quad (6.24)$$

$$TPNV = \sqrt{2V_q^2 + V_{tn}^2} \quad (6.20)$$

Figure 9G:
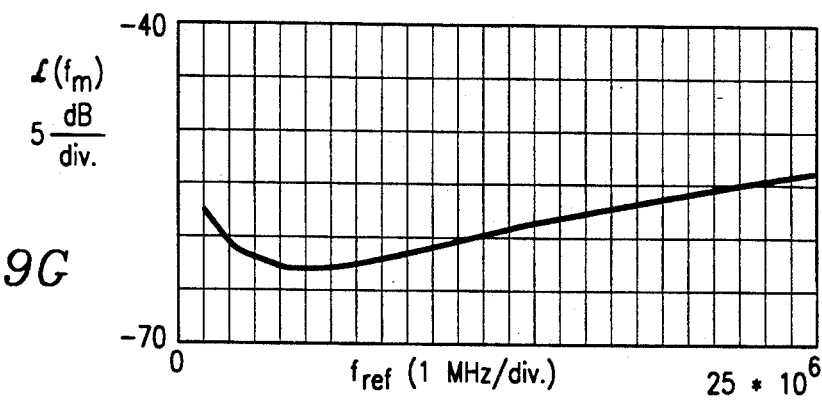
FIG. 9G illustrates a total $\phi(f_m)$ for the example system with $\alpha_e=2E-14$.

The above relations were coded into a MathCAD model to develop graphs of the total noise as a function of $f_{ref}$. The results are shown in Fig. 9F and 9G.

The response shows a minimum total closed loop noise at a reference frequency of about 5MHz. The example system would have shown about 3dB of noise improvement at that $f_{ref}$. The trade off is that the 10 MHz $f_{ref}$ allows a 10 MHz tuning range for the synthesizer.

Figure 9H:
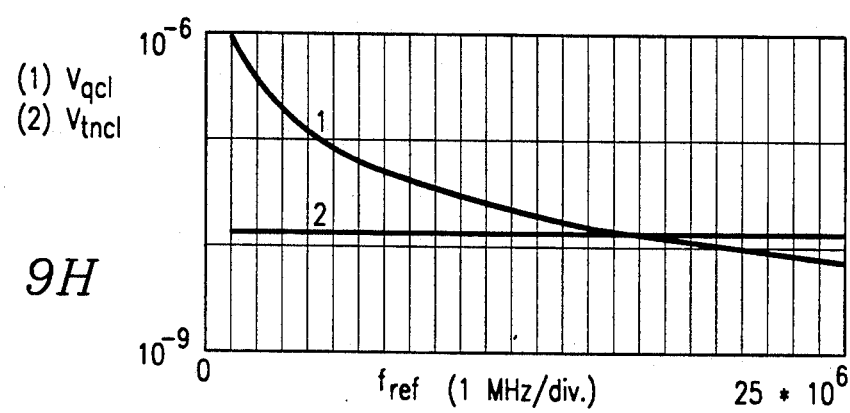
FIG. 9H illustrates a $V_{qcl}$ and $V_{tncl}$ for the example system with $\alpha_e=0$.
Figure 9I:
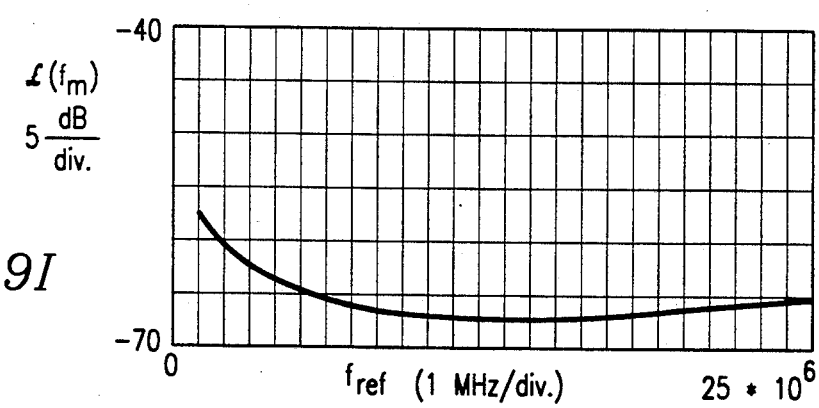
FIG. 9I illustrates a total $\phi(f_m)$ for the example system with $\alpha_e=0$.

This optimization of $f_{ref}$ showed a strong dependence on the oscillator noise, particularly the flicker noise factor $\alpha_c$. A majority of synthesizer loops probably have a loop bandwidth that is within the frequency range where flicker noise dominates the oscillator noise. In some cases the thermal pickup term may be dominant, and the optimization will result in a lower noise synthesizer with a considerably different $f_{ref}$. To illustrate this, the graphs above were recalculated without the oscillator flicker noise. The results are shown in figs. 9H and 9I.

Without the flicker term in the oscillator noise, the optimum $f_{ref}$ has increased form 5 to 15 MHz. The achievable total phase noise is about 5 dB better, and the tune range of the synthesizer has tripled from 5 to 15 MHz also. The flicker noise factor, a term deeply embedded in the design of the VCO, has a major impact on the entire synthesizer optimization.

6.8 Chapter Summary

This chapter has presented a fundamental analysis of the spectral noise of the $\Delta\Sigma$ FLL synthesizer. It has been shown that the $\Delta\Sigma$ FLL is capable of noise performance limited only by the noise of the VCO in the system, and is therefore competitive with the PLL synthesizer.

Inside the loop bandwidth the FLL was found to suppress oscillator noise in a first order manner. The PLL was shown to suppress oscillator noise in a second order manner within this loop bandwidth, and so is inherently superior in cleaning up noisy oscillators. This should not limit the $\Delta\Sigma$ FLL in the majority of applications.

A procedure complete with closed form expressions for the noise design of the $\Delta\Sigma$ FLL with first order $\Delta\Sigma$ FD was demonstrated. The effects of free running oscillator noise and $\Delta\Sigma$ quantization noise were taken into account in determining the total synthesizer phase noise. It was found that full optimization of the system was strongly influenced by the free running noise of the VCO. Quite large changes in the optimum reference frequency occur over variations in the VCO noise. If a wideband synthesizer is needed, its noise spectrum will usually be set by the VCO free running noise.

This procedure can be used for the second order $\Delta\Sigma$ FD if the quantizing noise of a particular encoder on a per HZ basis is known. The design of second order $\Delta\Sigma$ encoders in general is not yet completely tractable, and since the $\Delta\Sigma$ frequency detector is a recent invention its development is in an early stage. As pointed out in the las chapter, the PLL model of the $\Delta\Sigma$ FD developed in this thesis should allow extension of known second order techniques to the $\Delta\Sigma$ FD. When that work is completed it should allow the $\Delta\Sigma$ FLL to attain noise performance limited only by the phase noise of even the highest quality oscillators.

CHAPTER 7
EXPERIMENTAL RESULTS

7.1 Introduction

As the $\Delta\Sigma$ FLL synthesizer is a new invention, there is no previous experimental data available. The model of the $\Delta\Sigma$ frequency detector developed in chapter 5 is also untested. Therefore the goals of the experimental work were verification of the $\Delta\Sigma$ frequency detector model, checking the basic $\Delta\Sigma$ FLL synthesizer behavior, and measurement of the noise performance.

These goals were accomplished by building and testing the $\Delta\Sigma$ FLL in a low radio frequency CMOS implementation. This component technology was selected for ease of use and low cost. Testing the theoretical validity of the analysis does not require a high frequency implementation.

The system was designed for a 5 volt power supply. The system clock ($f_{ref}$) was 800 KHz. The frequency detector has M = 8, and $\Delta$M = 1. This leads to a system with a frequency tuning range of 8 times $f_{ref}$ to 9 times $f_{ref}$ or 6.4 to 7.2 MHz.

7.2 $\Delta\Sigma$ Frequency Detector Model Verification

The analysis presented in chapter 5 of the behavior and modeling of the $\Delta\Sigma$ FD is the foundation that allows design of the $\Delta\Sigma$ FLL synthesizer. The validity of the model is therefore a key issue.

The CMOS implementation allows the use of a $\Delta\Sigma$ frequency detector circuit that was developed by Timeback Systems. The circuit is shown in Appendix 3. Study of the circuit design shows a close resemblance to the internal design of an ECL dual modulus prescaler. This was to be expected, since the circuit performs a very similar function.

In chapter 5 the model of (5.30) was developed.

$$K_{df}(s) = \frac{S_{\delta\sigma}}{2\pi\Delta M \ (s + f_{ref})}. \qquad (5.30)$$

An interesting feature of this model is the pole at $f_{ref}$ rad/sec, not $f_{ref}$ Hz. This may be puzzling at first, but makes sense when one recalls that the Nyquist rate limits the detector to less than one half $f_{ref}$ Hz.

Figure 10A:
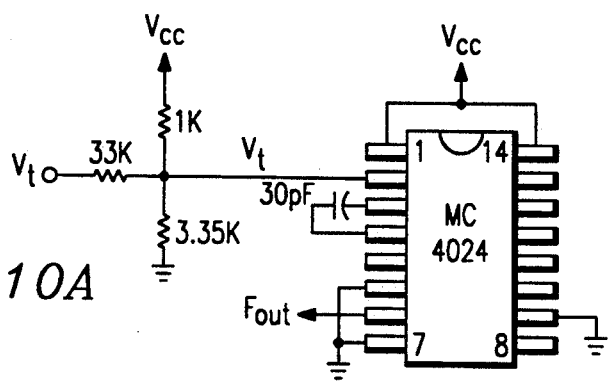
FIG. 10A illustrates a multivibrator VCO used in the experimental system.

Because of the difficulty of designing a resonator based oscillator at this low frequency, an oscillator was implemented using a Motorola MC4024 multivibrator integrated circuit. This approach has the advantage of circuit simplicity, and a high enough phase noise content to clearly view the effect of the $\Delta\Sigma$ FLL on the noise spectrum. The very low $f_{ref}$ used in this experimental system has a high enough noise that it would mask the free running noise of a low noise resonator based VCO. The circuit is shown in Fig. 10A.

To test this model, the input frequency to the encoder was frequency modulated, and the amplitude and phase shift of the $\Delta\Sigma$ output was measured. Relative phase was measured by displaying the input and output waveforms on a dual trace oscilloscope. Since viewing the $\Delta\Sigma$ output required a low pass filter, a correction for filter phase shift was added. The test setup is shown in Fig. 10B.

The VCO without the input divider tuned form 3.8 to 15 MHz as input voltage varied from 0 to 5 volts. The divider limits $V_t$ to 3.6 to 3.9 volts over the same range. This resulted in the desired tune range of 6.4 to 7.2 MHz. Thus divided, the complete VCO showed excellent linearity, and is constrained to remain within the encodable range for any voltage from 0 to 5 volts.

The 5 volt 100% duty cycle output of the CMOS implementation means that $S_{\delta\sigma} = 5$. The output of the $\Delta\Sigma$ FD should therefore vary linearly from 0 to 5 volts as the VCO output frequency tunes from 6.4 to 7.2 MHz. The VCO input must be tuned from 0 to 5 also to cause this to happen, so the matched condition $K_o K_{df} = 1$ has been established.

The DC behavior of the frequency detector was found to correspond exactly to the predicted. Using the setup of Fig. 10B, the small signal AC data of Fig. 10C was taken.

The data shows the detector model to be valid within the error of this approximate technique. The phase shift is a little more than predicted, but this is probably due to measurement error and parasitic phase shift in the VCO. A more precise check on model accuracy will require better equipment than was available at the time this data was taken.

When this model was developed it was predicted to hold with good accuracy from DC to $.1 f_{ref}$ or 80 KHz. This measurement showed it to definitely should over the first half of that range.

7.3 Basic $\Delta\Sigma$ FLL Design and Behavior

The Timeback frequency detector and the VCO of the last section need only be combined with a loop filter in order to complete the FLL design.

In the matched condition the unity gain bandwidth of the integrating loop filter will set the loop bandwidth. In order to check basic functionality no particular bandwidth is needed, but approximately 50 Hz will be first used. This provide effective filtering of the $\Delta\Sigma$ quantization noise.

The resulting system is shown in Fig. 10D. A Texas Instruments TLC 271 CMOS op amp was used, primarily for its ability to run in a single supply low voltage system. The op amp was powered form a 7 volt supply, and the remainder of the circuitry from a 5 volt supply. The integrating loop filter had a unity gain bandwidth of 43Hz, and the prefilter pole was at 10.3 KHz. The 800 KHz $f_{ref}$ was generated by a 3.2 MHz crystal oscillator followed by a divide by 4 circuit.

The system was found to function exactly as expected. When powered up it instantly acquires frequency lock at the frequency specified by the tune voltage $V_m$. The behavior is generally robust, and shows no signs of instability.

When the system is frequency tuned by varying $V_m$ it tunes precisely and with perfect linearity from 6.4 to 7.2 MHz as the tune voltage is varied from 0 to 5 volts. No error could be detected in this relationship within the 4 digit voltage measurement capability available at the time.

Figure 10E:
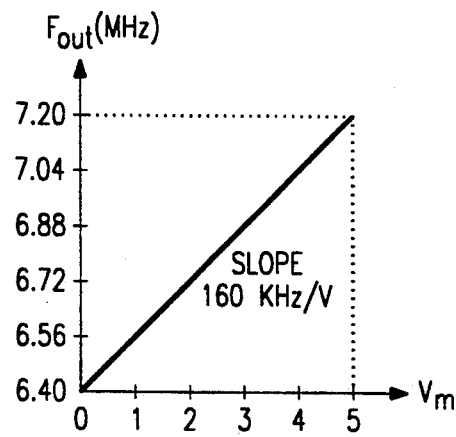
FIG. 10E illustrates an output frequency vs. tune voltage for the experimental $\Delta\Sigma$ FLL.

The tuning curve is shown in Fig. 10E.

7.4 Measured and Calculated Phase Noise

The results of phase noise measurements on the experimental system are given here, and compared to theoretical predictions. The phase noise measurements were made on the Hewlett-Packard HP 3048 phase noise measurement system. This system generates output in plotted form. The plots are contained in Appendix 4.

For calculation of phase noise the MathCAD model that was used in the example of chapter 6 (Appendix 2) is modified. The only changes required are substitution of new parameter values and replacement of the calculated open loop VCO phase noise with the measured VCO noise.

Figure 10F:
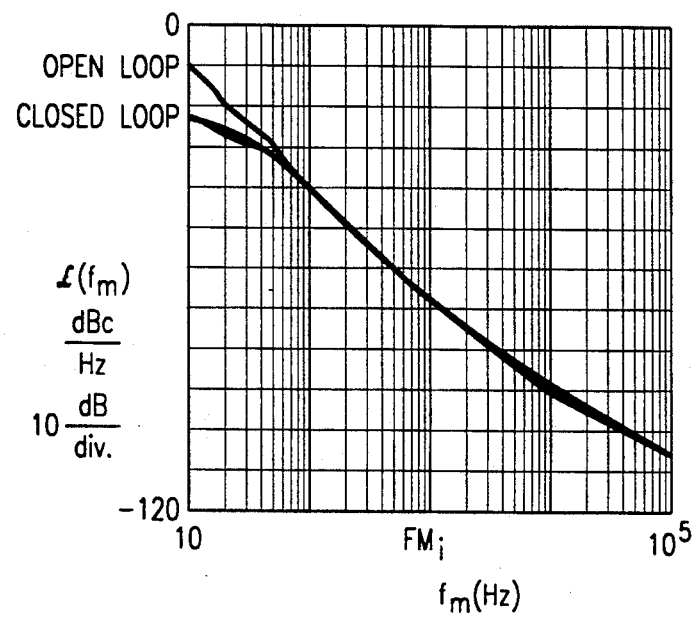
FIG. 10F illustrates an open loop, closed loop measured, and closed loop predicted phase noise for the 43 Hz loop bandwidth system.

The results of the calculated and measure phase noise for the 43 Hz loop bandwidth system are shown in Fig. 10F. Also shown is the open loop VCO noise.

It is seen that the closed loop predicted and measured curves are nearly exactly matched. The error certainly falls within experimental margin.

This measurement proves that the $\Delta\Sigma$ quantization noise can be low enough not to degrade the noise of the free running VCO, and that the predicted loop suppression of close in free running noise is accurate. However, the small 43 Hz loop bandwidth is filtering quantization noise to the extent that we cannot tell if the quantization induced phase noise is at the predicted level. All that can be said with certainty is that the quantization induced phase noise is below the free running phase noise.

Figure 10G:
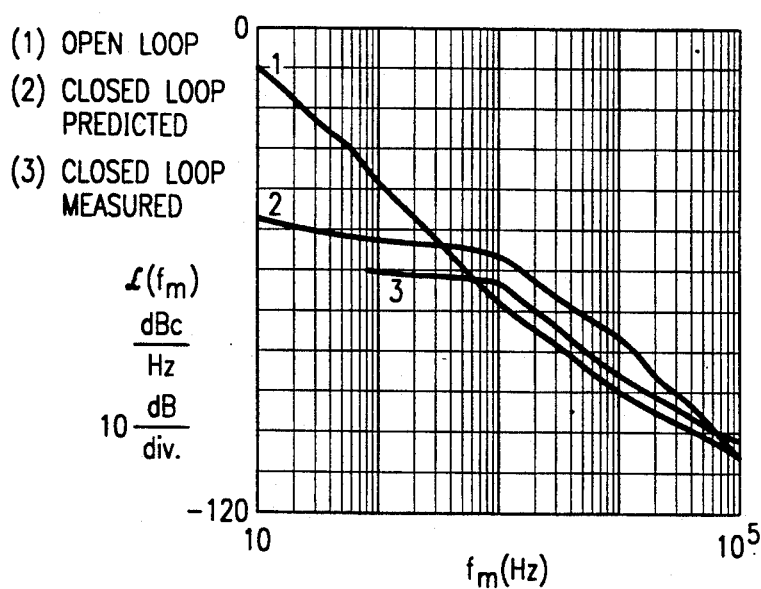
FIG. 10G illustrates an open loop, closed loop measured, and closed loop predicted phase noise for the 900 Hz loop bandwidth system.

To allow the quantization induced phase noise to rise to a high enough level to be seen it is only necessary to increase the loop bandwidth. To increase the loop bandwidth to 900 Hz it is only necessary to change $C_1$ from .01 $\mu$F to 470 pF. This change was made and the phase noise closed loop phase noise measurement and calculation were repeated. The results are shown in Fig. 10G.

Figures 10H, 11A:
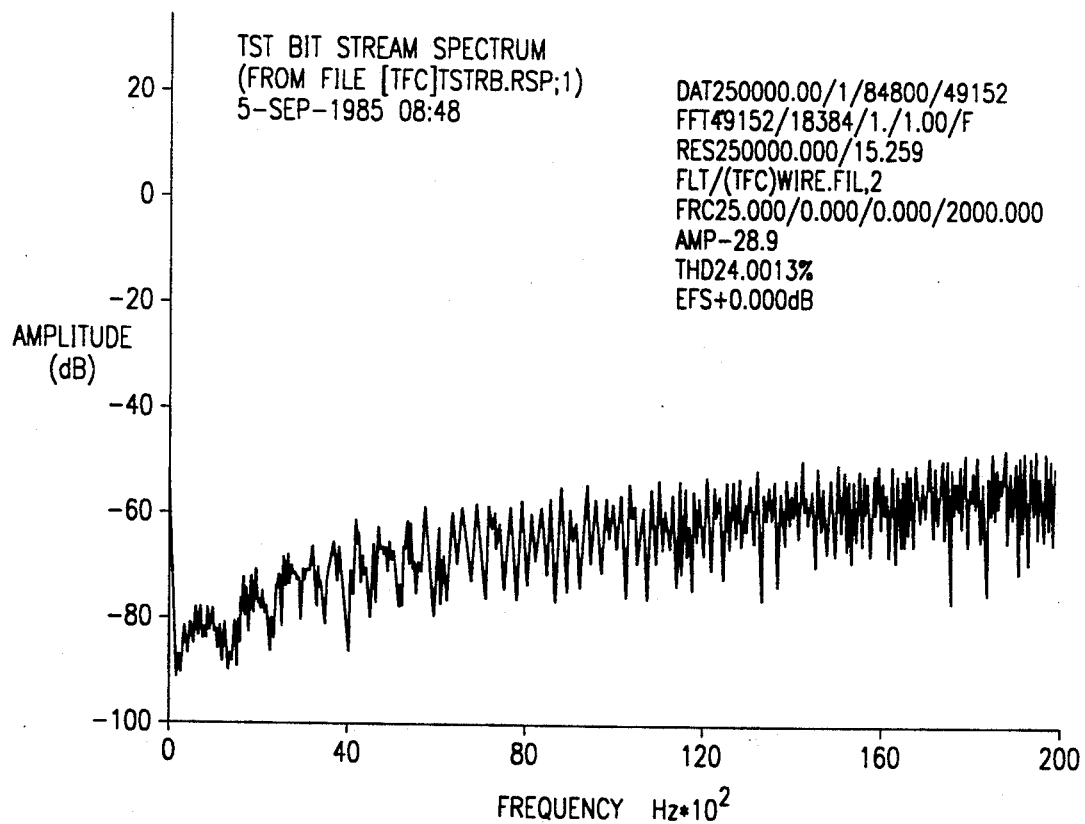
FIG. 10H illustrates a phase noise in the 900 Hz bandwidth system.
FIG. 11A illustrates a graph of normalized magnitude noise.

The results are tabulated in Fig. 10H.

The data shows an interesting anomaly. The measured phase noise is generally lower than the predicted by amounts up to 12 dB. There are two distinct anomalies.

First, the quantization induced phase noise, from the loop bandwidth out, is an average of about 5 dB better than the model predicts. The reader will recall that in section 5.8 it was pointed out that the Timeback Systems measure of first order quantization noise was 2 to 5 dB better than the model. The model was based upon some simplifying assumptions that could account for this. The phase noise measurement above supports the theory that the quantization noise model is conservative. The true noise appears to be slightly superior to even the Timeback measurement.

Second, the close in phase noise measure to be flat within the loop bandwidth. The FLL is not theoretically capable of that amount of close in suppression. The free running phase noise is changing at a 30 dB/decade rate over that range, and the FLL is capable 20 dB/decade of suppression within that range. Therefore there is either an error in the measurement technique, or some unknown and unmodeled mechanism is at work in further suppressing noise.

Repeated measurements all gave the same results. If there is a measurement error it is a consistent one, possibly one within the phase noise measurement system. The HP 3048 system is designed for measurement of very low noise frequency sources, and could possibly generate erroneous results in measuring the free running phase noise of the relatively noisy relaxation oscillator used here.

Another possibility is that the $\Delta\Sigma$ FLL may be capable of greater noise suppression than the model so far predicts. Though the $\Delta\Sigma$ FD is primarily a frequency detector, it does respond to phase change on its input. The model accounts for the derivative relationship between phase and frequency, so if the detector has some unaccounted for phase response it must be inherent to the actual discrete nature of the $\Delta\Sigma$ FD. This is a topic for future research.

7.5 Chapter Summary

This chapter has demonstrated that the analyses of the $\Delta\Sigma$ frequency detector and the $\Delta\Sigma$ FLL are fundamentally sound.

Experimental testing showed the model for the detector to accurately predict both the DC and small signal AC response of the detector out to 5% of $f_{ref}$. The model was predicted to hold out to 10% of $f_{ref}$ but equipment limitations prevented verifying performance at higher frequencies.

The $\Delta\Sigma$ FLL was found to function perfectly as a voltage controlled and voltage modulated synthesizer. The frequency accuracy of the system was greater than the available voltage measurement accuracy.

Phasenoise measurements on a working system showed a moderate improvement over the predicted noise levels. For noise at offsets greater than the loop bandwidth this may be attributed to the conservative $\Delta\Sigma$ quantization noise model. The improvement within the loop bandwidth is assumed to be either error in the VCO open loop phase noise measurement, or some as yet unknown noise suppression mechanism.

Whatever the sources of the better than expected phase noise, the excellent noise performance bodes will for the future commercial variability of the $\Delta\Sigma$ FLL synthesizer concept. It was shown in chapter 6 that the models developed in this thesis predict noise performance good enough that the phase noise of even a high quality VCO is not degraded. In this chapter it was shown that the actual noise performance is moderately better than predicted. It would seem that the predicted phase noise can safely be used as a conservative upper limit on what the real system will display.

CHAPTER 8
CONCLUSION
8.1 Results Attained

This thesis began as an investigation of frequency modulated phase locked frequency synthesis. The goal was development of a logical design procedure that gave the best compromise between objectives as well as an accurate prediction of performance. If possible, it was intended to use the second order normalized form and thus take advantage of the large body of knowledge already developed for the standard PLL.

These goals were attained. The FM PLL was found to be completely describable in terms of normalized variables. Furthermore, it was shown that several key transfer functions in the FM PLL are simply rescaled versions of common transfer functions in the standard PLL. This simplifies analysis greatly by allowing use of published normalized form equations and graphs.

The terms frequency modulation transfer function was defined for the transfer form input voltage to output frequency, and it was found to be directly proportional to the well known phase transfer function.

A new and highly useful. signal to distortion ratio was defined in order to quantify the effect of the PLL control system action on the desired modulation. The signal to distortion ratio was found to be the reciprocal of the magnitude of the phase transfer function. This allows simple selection of loop parameters to maximize the signal to distortion ratio. For example, observation of the frequency response of this function led to the conclusion that some implementations of the FM PLL should use a considerably different loop damping factor than normal PLL practice. To the author's knowledge, this design approach to the FM PLL was not previously known.

The elegant integrator error correction system for the FM PLL was completely analyzed, and some new information was apparently developed. An exact relation for the improvement in signal to distortion ratio as a function of integrator matching was derived. The same guidelines for loop parameter selection as for the simple FM PLL were found to hold, and conditions under which phase lock is maintained were analyzed. Finally, it was shown that the FM PLL with the digital phase detector suffers a severe degradation of sideband to carrier ratio. This effect was quantified as a function of the loop parameters, possibly for the first time.

The analysis made clear the disadvantages of the FM PLL listed below.

1. Extreme difficulty implementing DC FM.

2. DC frequency error proportional to the error in the match between the integrator and VCO.

3. Considerable noise degradation under steering or modulation.

Recognition of these limitations led the author to develop the precision frequency locked loop concept that constitutes the second half of this thesis. A complete analysis of the loop dynamics was presented. This analysis showed that the FLL eliminates the major weaknesses of the FM PLL, at the cost of introducing one moderate problem and one very minor one.

The moderate problem is that frequency accuracy is not strictly controlled by the reference frequency, as it is in the PLL. Additional error is introduced by the accuracy to which voltage can be controlled in the loop. By the use of precision operational amplifiers this error can be made very small. It is several orders of magnitude smaller than the error introduced into the FM PLL by the error in the gain of the VCO.

The minor problem is that the FLL does not provide as much suppression of the free runnin VCO phase noise inside the loop bandwidth as the PLL. The PLL provides second order noise suppression, while the FLL provides first order suppression. This is not an issue in the great majority of applications.

In return for accepting these disadvantages, the precision FLL can offer a number of advantages. It provides a viable voltage controlled frequency synthesis technique with very simple circuitry. It is continuously tunable, and has nearly perfect linearity. It may be easily frequency modulated without degradation of its noise performance. It can be switched to a new frequency almost instantly. In general, it behaves like a voltage controlled oscillator whose slope and intercept are exactly known and perfectly repeatable.

With these advantages, it seems surprising that the FLL has not gained previous widespread acceptance as a major frequency synthesis technique. The author believes this is due to the absence of a suitable wideband, low noise, and extremely accurate frequency detection technology. That obstacle has been removed with the development of the ΔΣ frequency detector. This technique of frequency detection was invented by Timeback Systems, of Dallas, Texas.

Though Timeback had previously proven the viability of this frequency detection technique, it was unable to develop an analytic description of it. A major success of this thesis was the development of a workable phase lock model of the ΔΣ frequency detector. The ΔΣ FD was shown to be a form of digital phase locked loop whose steering variable is in ΔΣ form. Digital phase locked loops are not new, but this appears to be the first with ΔΣ output.

The phase lock model of the ΔΣ frequency detector not only provides an accurate prediction of its performance, but also paves the way for future advanced optimization. Techniques for extending the ΔΣ FD to true second order ΔΣ at radio frequencies were developed. This allows the development of even lower noise frequency detectors.

Noise performance of the ΔΣ FLL was completely investigated. The ΔΣ literature was used as a starting point for development of an expression giving the quantization noise of the ΔΣ FD on a per root Hz basis. This allowed prediction of closed loop synthesizer noise using the common single sideband phase noise on a per Hz basis. The analysis took into account by ΔΣ quantization noise and free running oscillator noise.

It was shown that the system is capable of noise performance limited primarily by a low noise VCO. It is therefore fully competitive with the phase noise of the PLL. Techniques for optimal low noise oscillator design were presented. It was further shown that noise optimization of the entire system is strongly influenced by the noise of the VCO, and in particular by the flicker noise of the active devices used in the oscillator. A design methodology for optimizing system parameters to obtain the best noise performance possible for a given oscillator noise level was developed.

A working prototype system was designed and tested. The ΔΣ frequency detector model was proven to be accurate out to 5% of the reference frequency. The ΔΣ FLL synthesizer functioned exactly as predicted, with the exception that measured phase noise was moderately better than calculated. It was concluded that the quantization noise model developed from the ΔΣ literature is conservative, but still provides a useful upper bound. Future high radio frequency implementations of the $\Delta\Sigma$ FLL will have very low predicted noise levels, and will probably improve on those predictions in practice.

8.2 Future Work

This thesis has presented a fundamental analysis that indicates the $\Delta\Sigma$ FLL should be a viable future frequency synthesis technology. However, for the technique to reach its full potential considerably more work must be done.

For the analog loop filtered $\Delta\Sigma$ FLL to attain the highest frequency accuracy it is capable of, precision pulse shaping circuitry must be developed. The purpose of this circuitry is to condition the $\Delta\Sigma$ pulses to have the same area over time, temperature, component, and unit to unit variations. To maintain the inherent simplicity of the $\Delta\Sigma$ FLL, the pulse shaping circuitry must also be simple and efficient.

Practical development of digital loop filters must be performed. Digital loop filtering will probably provide the best frequency accuracy. For microwave frequency synthesis, the filter would have to be clocked in the VHF or event the UHF frequency range. This is not as formidable a task as it might first appear, as the one bit word of $\Delta\Sigma$ allows very simple digital filter implementation.

The control of the $\Delta\Sigma$ noise spectrum through use of higher order $\Delta\Sigma$ is a fundamental research task. As yet, second order $\Delta\Sigma$ modulation has proven difficult to accurately analyze. However, work is continuing rapidly in both academic and commercial environments on the voltage form of the $\Delta\Sigma$ frequency detector presented here should allow the results of that effort to be efficiently adapted.

8.3 Present Commercial Viability of the $\Delta\Sigma$ FLL

The analysis, design procedures, and results so far developed lead to the conclusion that there are presently a number of applications that can be addressed by the $\Delta\Sigma$ FLL. Even in this early stage of development the system displays usable performance.

For example, a completely integrated version using a voltage controlled multivibrator and an inexpensive watch crystal could provide an excellent voltage to frequency converter. Due to the closed loop nature of such a system, it should considerably exceed the accuracy and linearity of the present leading edge open loop methods.

The radio frequency applications are too numerous to cover in detail. Any application that required an accurate and frequency agile or modulatable source could make use of this method.

For example, FM transmitters of voice, video, and data could all use the technique. High fidelity transmission is assured by the low noise and extremely high linearity of the $\Delta\Sigma$ FLL.

A potentially very large market for the technology is in radio receiver local oscillators. The ability to provide continuous tuning gives the $\Delta\Sigma$ FLL a significant advantage over the discretely tuned PLL. Any radio receiver that required excellent frequency accuracy, but not the reference limited only accuracy of the PLL, could make use of the $\Delta\Sigma$ FLL. As a PLL capable of stimulating continuous tuning is a complex and expensive system, the cost savings could be considerable.

Electronic instrumentation could be another large market. For example, a major difficulty in realizing a viable spectrum analyzer design is the local oscillator implementation. For less expensive analog analyzers, a common technique is referred to as "lock and roll". A VCO is phase locked to a known multiple of a reference frequency in order to provide a known starting frequency. The loop is then broken, and the VCO frequency swept from that starting point in an open loop condition. To have a useful level of frequency accuracy the VCO must be a rather expensive and precision design. The $\Delta\Sigma$ FLL could perform the same function much more accurately, and probably considerably more economically. It could also serve in all but the highest quality synthesized spectrum analyzers.

The $\Delta\Sigma$ FLL is also a potential candidate in the area of fast switching frequency synthesis. If the VCO gain can be accurately controlled, then the bandwidth limit is essentially the modulation bandwidth of the VCO.

These samples represent markets the $\Delta\Sigma$ frequency locked loop could penetrate in the near future. The continued technical development of the technique should eventually develop it to the point where it can contend with the phase locked loop in the majority of frequency synthesis applications.

APPENDIX 1

TIMEBACK SYSTEMS FIRST ORDER $\Delta\Sigma$ QUANTIZATION NOISE

APPENDIX 1

TIMEBACK SYSTEMS FIRST ORDER $\Delta\Sigma$ QUANTIZATION NOISE

The graph of Fig. 11A is provided courtesy of Timeback Systems, of Dallas, Texas. It was generated by software based digital filtering of a first order $\Delta\Sigma$ bit stream.

The graph shows the normalized magnitude (voltage) noise, relative to a full scale amplitude of 1, using a 15 Hz bandwidth. The reference frequency (bit rate) of the $\Delta\Sigma$ bit stream is 250 KHz.

$i := 0,1,...9$ — STEP FREQUENCY AND FREQUENCY DEPENDENT VARIABLES BY STEPPING INDEX OF FREQUENCY VECTOR $$NQ_i := \left[\frac{2}{3 \cdot FREF}\right]^{.5} \sin\left[\pi \frac{FM_i}{FREF}\right]$$

NORMALIZED FIRST ORDER DELTA SIGMA NOISE ON A PER HZ BASIS AT OFFSET FM AS PER EQ. 5.24

$j := \sqrt{-1}$ — FOR COMPLEX FREQUENCY CALCULATIONS $VQ_i := S\delta\sigma \cdot NQ_i$ — DENORMALIZED TO RMS VOLTS $s_i := 0 + j \cdot 2 \cdot \pi \cdot FM_i$ — COMPLEX FREQUENCY DEFINITION $$P_I := \frac{1}{\frac{s_i}{\varpi p}+1}$$

PREFILTER FUNCTION $$I_i := \frac{KI}{s_i}$$

INTEGRATING LOOP FILTER FUNCTION $$LOOP_i := \left[\frac{|I_I \cdot P_I|}{|1 + [I_I \cdot P_I] \cdot KDF \cdot \frac{KO}{N}|}\right]$$

LOOP SUPRESSION OF QUANTIZATION NOISE, EQUAL TO FREQ TRANSFER FUNCTION IF KO*KDF=N, GIVEN IN EQ. 6.5

$VQCL_i := VQ_i \cdot LOOP_i$   RMS CLOSED LOOP QUANTIZATION NOISE ON VCO INPUT $VTQ_i := [\sqrt{2}] \cdot VQCL_i$   PEAK QUANTIZATION NOISE USED TO GENERATE PHASE NOISE COMPONENT DUE TO QUANTIZATION $STCQ_i := VTQ_i \cdot \dfrac{KO}{4 \cdot \pi \cdot FM_i}$   SIDEBAND TO CARRIER RATIO IN A 1 HZ BW DUE TO QUANTIZATION NOISE NOTE $2\pi$ IN DENOMINATOR TO CONVERT KO UNITS TO HZ/VOLT AS IN EQ. 3.23

APPENDIX 2

MathCAD FILE FOR PHASE NOISE ANALYSIS OF THE DELTA SIGMA FREQUENCY LOCKED LOOP VHF SYNTHESIZER EXAMPLE OF CHAPTER 6

FREF := $10 \cdot 10^6$   REF FREQ IN HZ

M := 10   DELTA SIGMA "FPCO" COUNTER DIVIDE RATIO

N := 1   OPTIONAL DIVIDER RATIO

DELM := 1   "FPCO" STEP SIZE

LOOPBW := 70   LOOP BANDWIDTH IN HZ $\varpi p$ := 628   PREFILTER BANDWIDTH IN RAD/SEC

KI := 628   INTEGRATING LOOP FILTER GAIN

FM := $\begin{matrix} 10 \\ 20 \\ 50 \\ 70 \\ 100 \\ 500 \\ 1000 \\ 10^4 \\ 10^5 \\ 10^6 \end{matrix}$   OFFSET FREQUENCIES FOR ANALYSIS IN HZ $S\delta\sigma := 5$     DELTA SIGMA SCALING FACTOR TO DENORMALIZE QUANTIZATION NOISE $$KDF := \frac{S\delta\sigma}{2 \cdot \pi \cdot DELM \cdot FREF}$$     EQ. 5.28, VOLTS PER RAD/SEC $$KO := \frac{N}{KDF}$$     RAD/SEC PER VOLT WITH IDEAL MATCH OF $KO \ast KDF = N$

QUANTIZATION NOISE

APPENDIX 2

EXAMPLE ΔΣ FREQUENCY LOCKED LOOP NOISE MODEL

The following noise prediction model was developed for the example system of section 6.6 This model is implemented using the commercial program MathCAD, version 2.5. The equations set used is listed in section 6.6 also.

The model takes into account the noise contributions from both the VCO and the ΔΣ FD. A resonator based, single active device oscillator architecture is assumed. The Parker oscillator noise model [15] [16] is used. The user must provide fairly detailed information about the oscillator design to the model for the VCO phase noise calculations.

The ΔΣ noise is calculated by the first order model developed in section 5.8. The experimental results, of chapter 7 indicate this model to be fairly accurate, but probably about 5 dB noisier than a real ΔΣ frequency detector.

APPENDIX 2

EXAMPLE ΔΣ FREQUENCY LOCKED LOOP NOISE MODEL $LFMQ_i := 20 \cdot \log[STCQ_i]$     PHASE NOISE IN dBc/Hz AT OFFSET FM FROM THE CARRIER DUE TO QUANTIZATION NOISE $KO = 1.25664 \cdot 10^7$     NUMERIC VALUE OF VCO GAIN IN RAD/SEC/V IMPOSED BY THE VCO SPECIFICATIONS $KDF = 7.95775 \cdot 10^{-8}$     IMPOSED BY EQ. 5.28

$KO \cdot KDF = 1$     CHECK ON KO*KDF=N

FREE RUNNING OSCILLATOR NOISE BY THE PARKER MODEL

DELPHASE := 100     VCO PHASE TUNING RANGE IN DEGREES

DELFREQ := 10

$VQCL_i := VQ_i \cdot LOOP_i$     RMS CLOSED LOOP QUANTIZATION NOISE ON VCO INPUT $VTQ_i := [\sqrt{2}] \cdot VQCL_i$     PEAK QUANTIZATION NOISE USED TO GENERATE PHASE NOISE COMPONENT DUE TO QUANTIZATION $STCQ_i := VTQ_i \cdot \dfrac{KO}{4 \cdot \pi \cdot FM_i}$     SIDEBAND TO CARRIER RATIO IN A 1 HZ BW DUE TO QUANTIZATION NOISE NOTE $2\pi$ IN DENOMINATOR TO CONVERT KO UNITS TO HZ/VOLT AS IN EQ. 3.23

$LFMQ_i := 20 \cdot \log[STCQ_i]$     PHASE NOISE IN dBc/Hz AT OFFSET FM FROM THE CARRIER DUE TO QUANTIZATION NOISE $KO = 1.25664 \cdot 10^7$     NUMERIC VALUE OF VCO GAIN IN RAD/SEC/V IMPOSED BY THE VCO SPECIFICATIONS $KDF = 7.95775 \cdot 10^{-8}$     IMPOSED BY EQ. 5.28

$KO \cdot KDF = 1$     CHECK ON KO*KDF=N

FREERUNNING OSCILLATOR NOISE BY THE PARKER MODEL

DELPHASE := 100     VCO PHASE TUNING RANGE IN DEGREES

DELFREQ := $10 \cdot 10^6$     VCO FREQ TUNING RANGE IN HZ

PHASLOPE := $\dfrac{DELPHASE}{DELFREQ}$     VCO PHASE SLOPE WITH THIS RESONATOR $\tau_g := \dfrac{\text{PHASLOPE}}{360}$     GROUP DELAY OF RESONATOR $K := 1.38 \cdot 10^{-23}$     BOLTZMAN'S CONSTANT $T := 290$     DEGREES K $I := 40 \cdot 10^{-3}$     OSC CURRENT $POUT := I^2 \cdot 50$     OUTPUT POWER OF OSCILLATOR $NF := 10$     NOISE FIGURE IN A COMPRESSED STATE $G := 10$     POWER GAIN IN A COMPRESSED STATE OF THE OSCILLATOR ACTIVE ELEMENT $\alpha e := 2 \cdot 10^{-14}$     OSCILLATOR ACTIVE ELEMENT FLICKER NOISE FACTOR $THERMAL := 2 \cdot G \cdot NF \cdot K \dfrac{T}{POUT}$     THERMAL NOISE OUTSIDE RESONATOR BANDWIDTH IN A 1 HZ BW $PICKUP_i := \dfrac{THERMAL}{(2 \cdot \pi \cdot \tau g)^2 \cdot FM_i^2}$     THERMAL INSIDE RESONATOR BANDWIDTH PICKED UP BY OSCILLATOR INTERNAL POSITIVE FEEDBACK, NOTE IT FOLLOWS A -20 dB/DEC SLOPE $THERMAL = 1.0005 \cdot 10^{-17}$ $FLICKER_i := \dfrac{\alpha e}{(2 \cdot \pi \cdot \tau g)^2 \cdot FM_i^3}$     FLICKER NOISE COMPONENT OF PHASE NOISE, NOTE IT FOLLOWS A -30 dB/DEC SLOPE $SI_i := PICKUP_i + THERMAL + FLICKER_i$     TOTAL NOISE TO CARRIER POWER RATION IN A 1 HZ BW AT OFFSET FM IN THE FREE RUNNING VCO $STCFR_i := \sqrt{SI_i}$     TOTAL NOISE TO CARRIER VOLTAGE RATION IN A 1 HZ BW AT OFFSET FM IN THE FREE RUNNING VCO.

$LFR_i := 10 \cdot \log[SI_i]$     FREE RUNNING PHASE NOISE IN dBc/Hz $VTN_i := 2 \cdot \sqrt{2} \cdot \pi \cdot FM_i \cdot \dfrac{[STCFR_i]}{KO}$     RMS INPUT REFERRED OSCILLATOR NOISE NOTE $2\pi$ ADDED TO CONVERT UNITS OF KO AND DIVISION BY ROOT 2 TO CONVERT TO RMS

LOOP MODIFICATION ON OSCILLATOR NOISE $HFE_i := \dfrac{s_i}{s_i + KI \cdot KDF \cdot KO \cdot P_i}$     FREQUENCY ERROR TRANSFER FUNCTION

USED TO GET LOOP MODIFICATION OF FREE RUNNING OSCILLATOR NOISE $VTNCL_i := VTN_i \cdot |HFE_i|$     RMS INPUT REFERRED CLOSED LOOP OSCILLATOR NOISE

TOTAL PHASE NOISE $TPNV_i := [\sqrt{2}] \cdot \sqrt{VTNCL_i^2 + VQCL_i^2}$     TOTAL PEAK NOISE VOLTAGE CONSISTING OF BOTH OSCILLATOR AND SYNTHESIZER QUANTIZATION NOISE IN THE CLOSED LOOP CONDITION $STCT_i := TPNV_i \cdot \dfrac{KO}{4 \cdot \pi \cdot FM_i}$     SIDEBAND TO CARRIER RATION IN THE CLOSED LOOP SYSTEM $LFMT_i := 20 \cdot \log[STCT_i]$     TOTAL PHASE NOISE IN dBC/Hz IN THE CLOSED LOOP SYSTEM

RESULTS $$FM = \begin{bmatrix} 10 \\ 20 \\ 50 \\ 70 \\ 100 \\ 500 \\ 1 \cdot 10^3 \\ 1 \cdot 10^4 \\ 1 \cdot 10^5 \\ 1 \cdot 10^6 \end{bmatrix} \quad VTNCL = \begin{bmatrix} 1.83549 \cdot 10^{-8} \\ 2.67951 \cdot 10^{-8} \\ 5.09112 \cdot 10^{-8} \\ 6.8782 \cdot 10^{-8} \\ 8.30515 \cdot 10^{-8} \\ 2.97932 \cdot 10^{-8} \\ 2.24141 \cdot 10^{-8} \\ 1.40389 \cdot 10^{-8} \\ 1.29443 \cdot 10^{-8} \\ 1.30213 \cdot 10^{-8} \end{bmatrix} \quad VQCL = \begin{bmatrix} 4.07603 \cdot 10^{-9} \\ 8.27209 \cdot 10^{-9} \\ 2.24992 \cdot 10^{-8} \\ 3.27805 \cdot 10^{-8} \\ 4.05372 \cdot 10^{-8} \\ 8.26339 \cdot 10^{-9} \\ 4.07185 \cdot 10^{-9} \\ 4.05186 \cdot 10^{-10} \\ 4.051 \cdot 10^{-11} \\ 3.98535 \cdot 10^{-12} \end{bmatrix}$$

$$LFR = \begin{bmatrix} -31.80558 \\ -40.81491 \\ -52.68906 \\ -57.03071 \\ -61.61525 \\ -81.82681 \\ 90.06561 \\ -114.04391 \\ -134.74812 \\ -154.69664 \end{bmatrix} \quad LFMQ = \begin{bmatrix} -64.78496 \\ -64.65799 \\ -63.92577 \\ -63.57935 \\ -64.83262 \\ -92.62594 \\ -104.79386 \\ -144.8366 \\ -184.83845 \\ -224.98037 \end{bmatrix} \quad LFMT = \begin{bmatrix} -51.50561 \\ -54.05383 \\ -56.05805 \\ -56.25325 \\ -57.67471 \\ -81.1649 \\ -89.83826 \\ -114.03943 \\ -134.74807 \\ -154.69664 \end{bmatrix}$$

APPENDIX 3

TIMEBACK SYSTEMS ΔΣ FREQUENCY DETECTOR

APPENDIX 3

TIMEBACK SYSTEMS ΔΣ FREQUENCY DETECTOR CIRCUIT

Figure 11B:
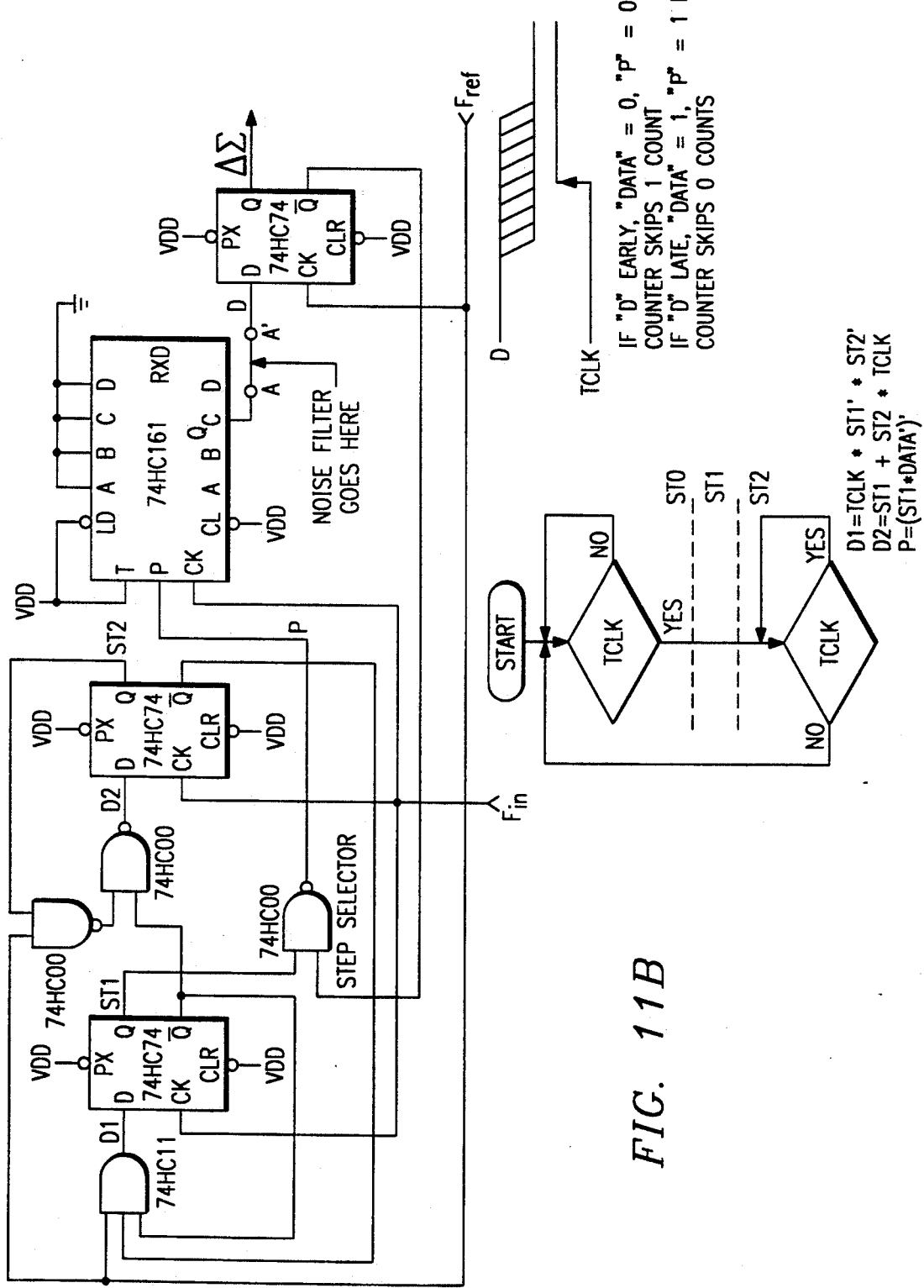
FIG. 11B illustrates a simplified schematic diagram of a $\Delta\Sigma$ frequency detector.

The circuit of Fig. 11B is the original Timeback System ΔΣ frequency detector. This circuit was used in the experimental system of chapter 7. It is implemented in standard SMOS. As discussed in section 5.5, radio frequency implementation of the ΔΣ frequency detector would most conveniently be accomplished by use of an ECL dual modulus prescaler.

APPENDIX 4

EXPERIMENTAL PHASE NOISE DATA

APPENDIX 4

EXPERIMENTAL PHASE NOISE DATA

Figure 11C:
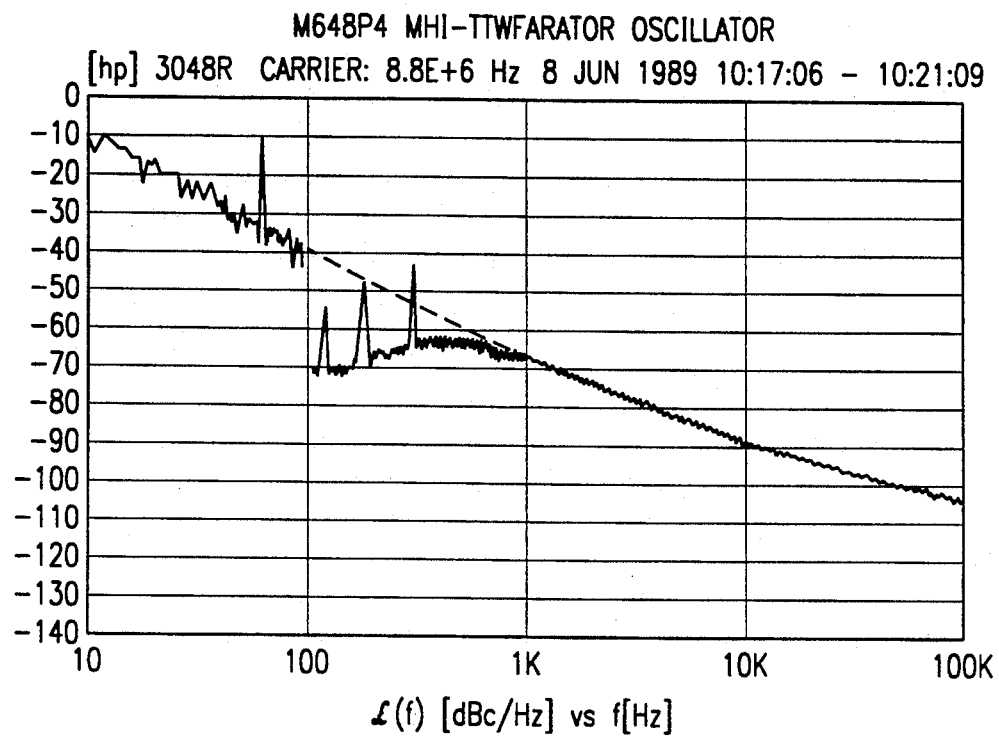
FIG. 11C illustrates a graph of open loop phase noise.
Figure 11D:
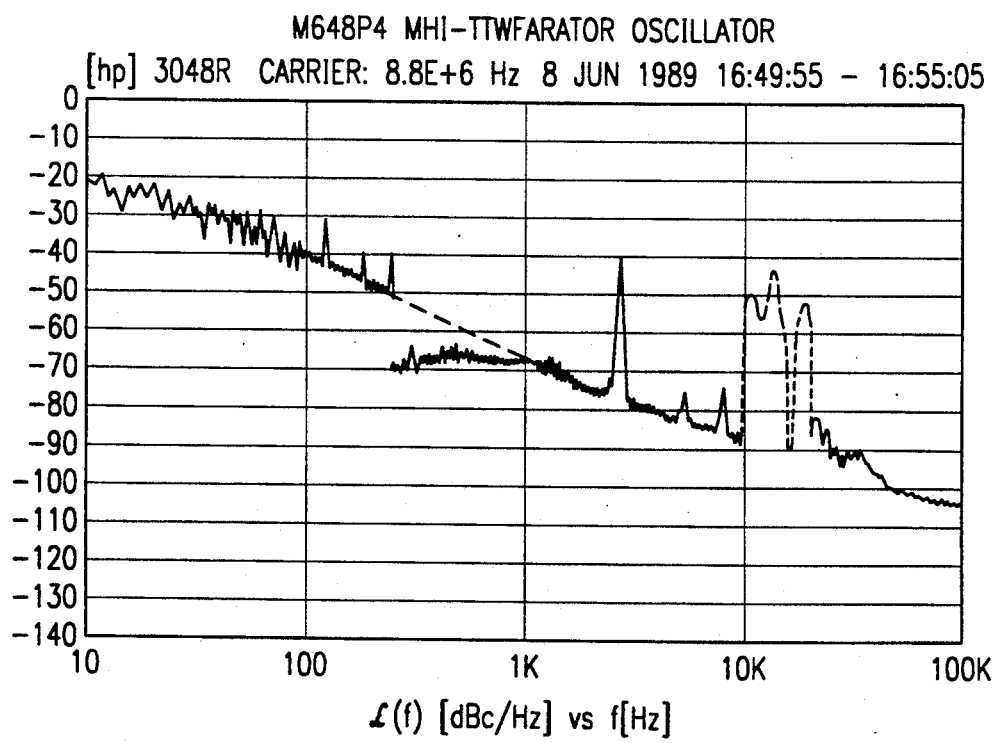
FIG. 11D illustrates a graph of closed loop phase noise of the 43 Hz loop bandwidth $\Delta\Sigma$ FLL.
Figure 11E:
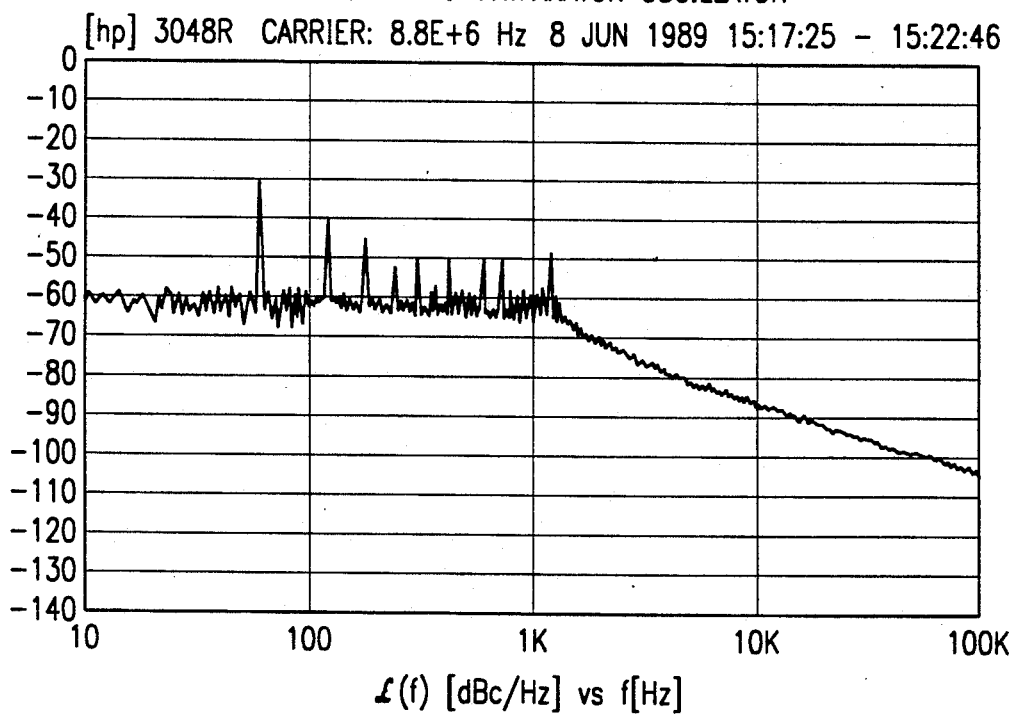
FIG. 11E illustrates a graph of closed loop phase noise of the 900 Hz loop bandwidth $\Delta\Sigma$ FLL.

Figs. 11C, 11D, and 11E contains the raw phase noise measurements on the experimental system of chapter 7. The plots were take in the Hewlett-Packard HP 3048 phase noise measurement system.

The break in the noise curve Fig. 11c at 100 Hz is an anomaly that often occurs with the measurement system. It is not real, and the extrapolated curve from 100 to 1000 Hz should be used.

REFERENCES

[1]  J. Smith, *Modern Communications Circuits*. New York: McGraw-Hill, 1986

[2]  R. Best, *Phase Locked Loops*. New York: McGraw-Hill, 1986

[3]  F. Gardner, *Phaselock Techniques*. New York: Wiley, 1979

[4]  R. Stirling, *Microwave Frequency Synthesizers*.

[5]  M. da Silva, "Synthesis of FM signals," *R.F. Design*, Sept./Oct. 1984, pp. 29-38.

[6]  MECL Device Data, Motorola, Phoenix, AZ, 1983

[7]  M. Schwartz, *Information Transmission, Modulation, and Noise*. New York: McGraw-Hill, 1980

[8]  W. Hayt and J. Kemmerly, *Engineering Circuit Analysis*. New York: McGraw-Hill, 1978

[9]  F. Goodenough, "Picking IC op amps: it's no longer easy," *Electronic Design*, Sept. 14, 1989, pp. 57-67.

[10] R. Nelson and O. Modgil, U.S. patent 47588321, 1988

[11] H. Inose, Y. Yasuda, and J. Murakami, "A telemetering system by code modulation-$\Delta\Sigma$ modulation," IRE Trans. Space Electron. Telem., Vol. SET-8, Sept. 1962, pp. 204-209.

[12] C. Rose, "A new way to cut the cost of A-to-D converters," *Electronics*, Mar. 31, 1986, pp. 42-44.

[13] B. Agrawal and K. Shenoi, "Design methodology for $\Delta\Sigma M$," IEEE Trans. Commun., Vol. COM-31, Mar. 1983, pp. 360-369.

[14] D. Leeson, "A simple model of feedback oscillator noise spectrum," *Proceedings of the IEEE*, Vol. 54, No. 2, Feb. 1966, pp. 329-330.

[15] T. Parker, "Characteristics and sources of phase noise in stable oscillators," in Proc. 41st Annu. Freq. Contr. Symp., 1987, pp. 99-110.

[16] F. Montress et al., "Extremely low-phase-noise SAW resonators and oscillators: design and performance," IEEE Trans. Ultrason. Ferroelec. Freq. Contr., Vol. 35, No. 6, Nov. 1988, pp. 657-667.

Now that the invention has been described, variations and modifications will become apparent to those skilled in the art. It is intended to that such variations and modifications be encompassed within the scope of the appended claims.

What is claimed is:

1. A frequency-modulated and frequency steerable frequency synthesizer, comprising:
   (a) a voltage controlled oscillator having an input and an output, said output having a predetermined oscillator frequency;
   (b) a delta sigma phase lock loop frequency detector having a first input connected to said voltage controlled oscillator output, a second input, and an output;
   (c) means for applying a frequency output of a reference frequency source to said delta sigma phase lock loop frequency detector second input for producing, at said output of said delta sigma phase lock loop frequency detector, a difference signal whose value is a function of a difference between said predetermined oscillator frequency and said frequency output, said frequency output having an output frequency that is substantially less than said predetermined oscillator frequency; and
   (d) means for applying said delta sigma phase lock loop frequency detector output to said voltage controlled oscillator input to produce at said voltage controlled oscillator output an output signal of desired frequency.

2. The synthesizer of claim 1 wherein a low pass filter is included between the output of said detector and the input to said oscillator to remove high frequency noise.

3. The synthesizer of claim 2 in which means are provided to apply a steering voltage to said low pass filter to select the value of frequency at the output of said oscillator.

4. The synthesizer of claim 1 wherein a divide by N counter is connected in series between the output of said oscillator and the input to said frequency detector.

5. The synthesizer of claim 2 wherein a divide by N counter is connected in series between the output of said oscillator and the input to said frequency detector.

6. The synthesizer of claim 3 wherein a divide by N counter is connected in series between the output of said oscillator and the input to said frequency detector.

7. The synthesizer of claim 1 in which said difference signal is a voltage.

8. The synthesizer of claim 1 in which said difference signal is comprised of a digital word of at least one bit.

9. The synthesizer of claim 1 wherein the frequency detector is a digital phase locked loop with pulse code modulation output.

10. The synthesizer of claim 2 wherein the frequency detector is a digital phase locked loop with pulse code modulation output.

11. The synthesizer of claim 3 wherein the frequency detector is a digital phase locked loop with pulse code modulation output.

* * * * *